(12) United States Patent
Xian et al.

(10) Patent No.: US 12,482,659 B2
(45) Date of Patent: Nov. 25, 2025

(54) SEMICONDUCTOR DEVICE WITH T-SHAPED ACTIVE REGION AND METHODS OF FORMING SAME

(71) Applicants: TAIWAN SEMICONDUCTOR MANUFACTURING COMPANY, LTD., Hsinchu (TW); TSMC NANJING COMPANY, LIMITED, Nanjing (CN)

(72) Inventors: Huaixin Xian, Hsinchu (TW); Zhang-Ying Yan, Hsinchu (TW); Qingchao Meng, Hsinchu (TW)

(73) Assignees: TAIWAN SEMICONDUCTOR MANUFACTURING COMPANY, LTD., Hsinchu (TW); TSMC NANJING COMPANY, LIMITED, Nanjing (CN)

( * ) Notice: Subject to any disclaimer, the term of this patent is extended or adjusted under 35 U.S.C. 154(b) by 526 days.

(21) Appl. No.: 17/742,272

(22) Filed: May 11, 2022

(65) Prior Publication Data
US 2023/0343594 A1 Oct. 26, 2023

(30) Foreign Application Priority Data
Apr. 25, 2022 (CN) .......................... 202210438210.3

(51) Int. Cl.
*H01L 21/28* (2006.01)
*H10D 30/01* (2025.01)
(Continued)

(52) U.S. Cl.
CPC ... *H01L 21/28114* (2013.01); *H10D 30/0243* (2025.01); *H10D 30/6217* (2025.01);
(Continued)

(58) Field of Classification Search
CPC ......... H01L 21/28114; H01L 29/42376; H01L 29/6681; H01L 29/7856; H01L 27/11803;
(Continued)

(56) References Cited

U.S. PATENT DOCUMENTS 7,023,056 B2 * 4/2006 Liaw ...................... H10B 10/12
257/E27.099
7,260,442 B2 8/2007 Hwang et al.
(Continued)

FOREIGN PATENT DOCUMENTS

TW 201618303 5/2016

*Primary Examiner* — Eduardo A Rodela
(74) *Attorney, Agent, or Firm* — Hauptman Ham, LLP

(57) ABSTRACT

A semiconductor device includes: a cell region including active regions that extend in a first direction and have components of corresponding transistors formed therein; a first majority of the active regions being rectangular; a first one of the active regions having a T-shape including a stem that extends in a second direction perpendicular to the first direction, and, relative to the first direction, first and second arms that extend from a same end of the stem and away from each other; and, relative to the first direction, a second majority of the active regions having aligned first ends defining a first reference line proximate and parallel to a first boundary of the cell region, and a third majority of the active regions having aligned second ends defining a second reference line proximate and parallel to a second boundary of the cell region.

20 Claims, 33 Drawing Sheets

(51) Int. Cl.
  *H10D 30/62* (2025.01)
  *H10D 64/27* (2025.01)
  *G06F 1/12* (2006.01)
  *G11C 7/22* (2006.01)

(52) U.S. Cl.
  CPC ............ *H10D 64/518* (2025.01); *G06F 1/12* (2013.01); *G11C 7/222* (2013.01)

(58) Field of Classification Search
  CPC . H01L 2027/11874; H01L 2027/11875; G06F 1/12; G11C 7/222
  See application file for complete search history.

(56) References Cited

U.S. PATENT DOCUMENTS

| | | | |
|---|---|---|---|
| 8,189,368 B2 * | 5/2012 | Liaw | H10D 86/011 365/230.05 |
| 8,952,716 B2 * | 2/2015 | Cho | G11C 29/022 438/18 |
| 8,957,459 B2 * | 2/2015 | Morimoto | H10B 10/12 257/369 |
| 9,256,709 B2 | 2/2016 | Yu et al. | |
| 2008/0203436 A1 | 8/2008 | Park | |
| 2011/0024870 A1 | 2/2011 | Lee | |
| 2011/0204419 A1 * | 8/2011 | Johnson | H10D 87/00 438/129 |
| 2014/0040838 A1 * | 2/2014 | Liu | G03F 1/36 716/53 |
| 2015/0278429 A1 | 10/2015 | Chang | |

\* cited by examiner

| | C1 | C2 | C3 | C4 | C5 | C6 | C7 | C8 |
|---|---|---|---|---|---|---|---|---|
| | Active Edge | Buffer based on | Transistors (L-to-R) in stem of T-shaped AR | Stem has T1? | Stem has T2? | Stem has T3? | Stem has T4? | Stem has IDG? |
| R2 | rising | Trx Gate | N21:N31 | N31 | | | N21 | |
| R3 | rising | Trx Gate | N31:N21:IDG:N22 | N31 | N22 | | N21 | IDG |
| R4 | rising | Trx Gate | N31:N23:IDG:N21 | N31 | | N23 | N21 | IDG |
| R5 | rising | Trx Gate | N31:N21:IDG:N23 | N31 | | N23 | N21 | IDG |
| R6 | rising | Trx Gate | N31:N23:N22:IDG:N21 | N31 | N22 | N23 | N21 | IDG |
| R7 | rising | Trx Gate | N21:N23:N22:IDG:N31 | N31 | N22 | N23 | N21 | IDG |
| R8 | rising | Stk Gate | N31 alone | N31 | | | | |
| R9 | rising | Stk Gate | N31:IDG:N22 | N31 | N22 | | | IDG |
| R10 | rising | Stk Gate | N31:N23 | N31 | | N23 | | |
| R11 | rising | Stk Gate | N31:N23:N22 | N31 | N22 | N23 | | |
| R12 | falling | Trx Gate | P21:P31 | P31 | | | P21 | |
| R13 | falling | Trx Gate | P31:P21:IDG:P23 | P31 | P23 | | P21 | IDG |
| R14 | falling | Trx Gate | P31:P22:IDG:P21 | P31 | | P22 | P21 | IDG |
| R15 | falling | Trx Gate | P31:P21:IDG:P22 | P31 | | P22 | P21 | IDG |
| R16 | falling | Trx Gate | P31:P22:P23:IDG:P21 | P31 | P23 | P22 | P21 | IDG |
| R17 | falling | Trx Gate | P21:P22:P23:IDG:P31 | P31 | P23 | P22 | P21 | IDG |
| R18 | falling | Stk Gate | P31 alone | P31 | | | | |
| R19 | falling | Stk Gate | P31:IDG:P23 | P31 | P23 | | | IDG |
| R20 | falling | Stk Gate | P31:P22 | P31 | | P22 | | |
| R21 | falling | Stk Gate | P31:P22:P23 | P31 | P23 | P22 | | |

662
Form Cell Region Including Active Regions (ARs)

664
Configure 1st one of ARs to have T-shape with stem extending in 2nd direction perpendicular to 1st direction, and 1st & 2nd arms extending in 1st direction

666
Form source/drain (S/D) components at locations correspondingly in ARs

668
Form remaining components of transistors corresponding to S/D components of ARs resulting in transistors of cell region defining scan insertion D flip-flop (SDFQ) including clock buffer, scan buffer, multiplexer and D flip-flop

Fig. 6D

SEMICONDUCTOR DEVICE WITH T-SHAPED ACTIVE REGION AND METHODS OF FORMING SAME

BACKGROUND

The integrated circuit (IC) industry produces a variety of analog and digital semiconductor devices to address issues in different areas. Developments in semiconductor process technology nodes have progressively reduced component sizes and tightened spacing resulting in progressively increased transistor density. ICs progressively become smaller.

Flip-flops (latches) are used as data storage elements. In some circumstances, a flip-flop stores a single bit (binary digit) of data. In some circumstances, a flip-flop (latch) is used for storage of a state and represents a basic storage element of sequential logic in electronics, e.g., shift registers.

One type of flip-flop is a delay (D) flip-flop (FF). A D FF is a digital electronic circuit that delays the change of state of its output signal (Q) until the next rising edge of a clock timing input signal occurs. The D FF is a modified Set-Reset flip-flop with the addition of an inverter to prevent the S and R inputs from being at the same logic level.

A type of D FF is a scan D FF (SDFQ) which is used, e.g., to implement design for testing (DFT). A SDFQ is a D flip-flop that includes a multiplexer to controllably select between an input D during normal operation and a Scan input during scan/testing operation. Scan flip-flops, e.g., SDFQs, are used extensively for device testing.

BRIEF DESCRIPTION OF THE DRAWINGS

One or more embodiments are illustrated by way of example, and not by limitation, in the figures of the accompanying drawings, wherein elements having the same reference numeral designations represent like elements throughout. The drawings are not to scale, unless otherwise disclosed.

FIGS. 6A-6E are flow diagrams of corresponding methods of manufacturing a semiconductor device, in accordance with some embodiments.

DETAILED DESCRIPTION

Figure 1:
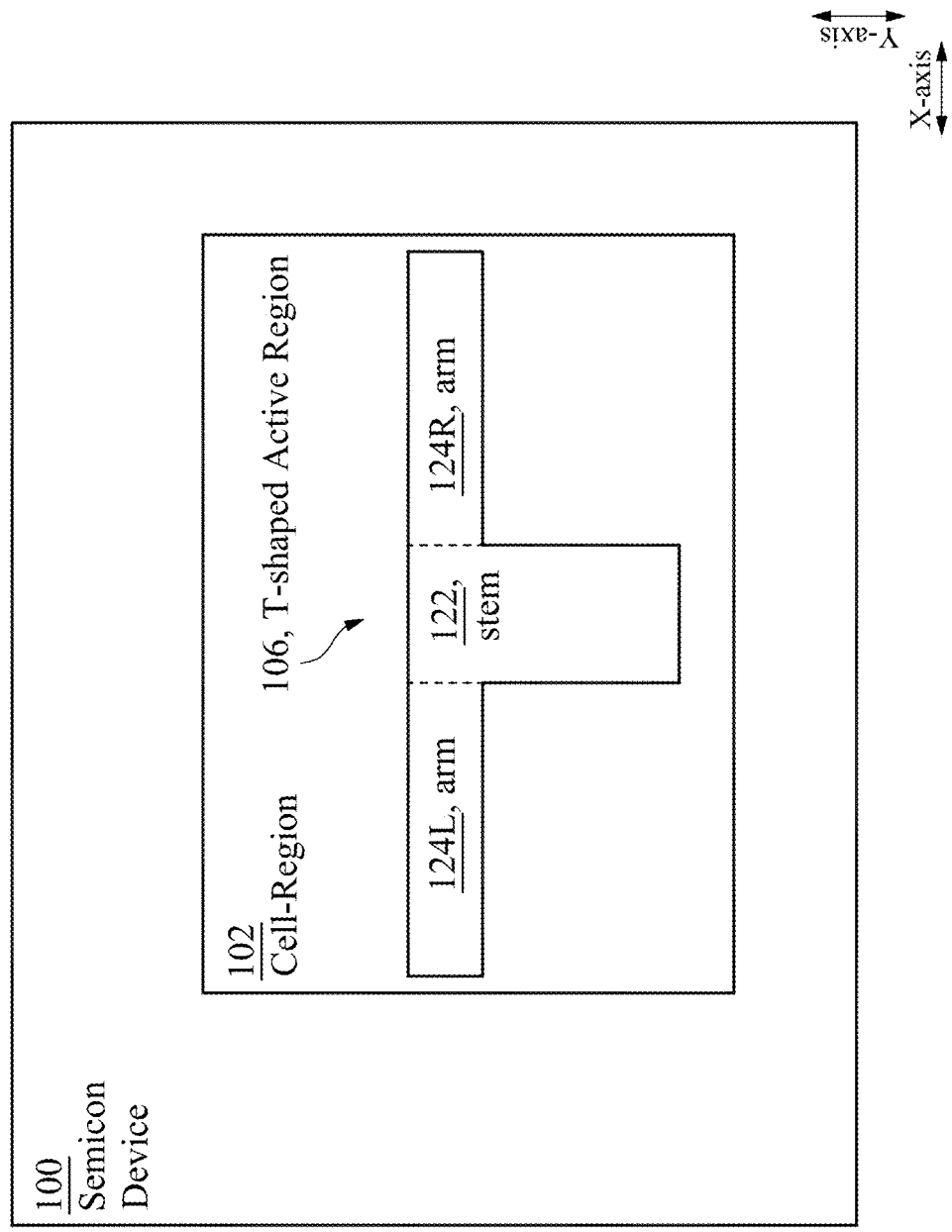
FIG. 1 is a block diagram of semiconductor device, in accordance with some embodiments.

The following disclosure discloses many different embodiments, or examples, for implementing different features of the subject matter. Examples of components, materials, values, steps, operations, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows include embodiments in which the first and second features are formed in direct contact, and further include embodiments in which additional features are formed between the first and second features, such that the first and second features are in indirect contact. In addition, the present disclosure repeats reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, are used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus is otherwise oriented (rotated 90 degrees or at other orientations) and the spatially relative descriptors used herein are likewise interpreted accordingly. In some embodiments, the term standard cell structure refers to a standardized building block included in a library of various standard cell structures. In some embodiments, various standard cell structures are selected from a library thereof and are used as components in a layout diagram representing a circuit.

In some embodiments, a semiconductor device includes a cell region including active regions (ARs) that extend in a first direction (e.g., parallel to the X-axis) and have components of corresponding transistors formed therein; a first majority of the ARs being rectangular; a first one of the ARs (first AR) having a T-shape including a stem that extends in a second direction perpendicular to the first direction, and, relative to the first direction, first (left) and second (right) arms that extend from a same end of the stem and away from each other. The other ARs, e.g., second to fifth ones of the ARs (second to fifth ARs), are rectangular. Relative to a second direction perpendicular to the first direction, e.g., parallel to the Y-axis, the second to fifth ARs, and the arms of the first AR, have a first height, H1, and thus transistors correspondingly based therein have a first channel-size. The stem of the first AR has a height H2, and thus transistors correspondingly based therein have a second channel-size. In some embodiments, the second and fifth ARs extend across the cell region. relative to the X-axis. In some embodiments, as a combination, the left arm, right arm and the portion of the stem overlapped (relative to the Y-axis) by the left and right arms extends across the cell region relative to the X-axis. In some embodiments, the third and fourth ARs are separated from each other by the stem relative to the X-axis. In some embodiments, the transistors of the cell region are arranged to function as an active circuit, e.g., a scan insertion D flip-flop (SDFQ).

According to another approach, a given active circuit of a given semiconductor device, e.g., an SDFQ, includes first to fourth rectangular active areas having a height H1, i.e., none of the active areas according to the other approach is T-shaped. The first and fourth active areas of the other approach could be considered corresponding counterparts to the second and fifth ARs noted above. The second active area of the other approach could be considered a counterpart to the left arm (noted above), right arm (noted above) and the portion of the stem (noted above) overlapped (relative to the Y-axis) by the left and right arms. The third active area of the other approach could be considered a counterpart to either the third AR (noted above) or the fourth AR (noted above) if either the third AR or fourth AR was as wide as the cell region (relative to the X-axis) and was aligned (relative to the X-axis) with the second and fifth ARs. Each of the transistors of the given active circuit of the other approach has a same given channel-size that is proportional to the first height H1 of the first to fourth active areas. The given active circuit of the other approach suffers a slack violation, e.g., a hold-slack violation. In some embodiments, the hold-slack violation of the given active circuit of the other approach is avoided by using the T-shaped first AR and the corresponding third and fourth ARs instead of the second and third active areas of the other approach. In some embodiments, a few of the transistors of the given active circuit are formed in the stem of the T-shaped first AR and accordingly have the second channel-size which is proportional to the second height H2. The few transistors in the stem of the T-shaped first AR having the second channel-size exhibit better/greater performance capabilities than the remaining transistors, the latter having the first channel-size; accordingly, the overall performance of the given active circuit having the T-shaped first AR is changed, i.e., improved, so as to avoid the hold-slack violation suffered by the given active circuit according to the other approach.

Relevant terminology includes the following. When data input to a sequential logic circuit, e.g., an SDFQ, changes state, propagation delay refers to a finite amount of time needed by the logic gates to perform the operations on changed input data. A condition of valid operation is that the interval between clock pulses must be long enough so that all the logic gates have time to respond to the changes in the input data and have their corresponding outputs settle to stable logic values before the next clock pulse occurs. In general, when the condition is met, the circuit is stable and reliable.

Setup time is the minimum time that a signal must be stable before the clock rising edge. When the setup time is not adequate, there is a risk that a logical state of the signal will be misinterpreted. More particularly, when the setup time is not adequate, there is a risk that the signal will not settle into a first range of voltages which clearly represents a logical zero or a third range of voltages which clearly represents a logical one, but instead will remain in an intermediate second range of voltages which does not clearly represent either a logical zero or a logical one, resulting in the possibility of that an incorrect interpretation of the logical state of the signal will be entered into a register, i.e., latched. Setup-slack is the difference in time between when the signal becomes valid and the setup time. In other words, when the setup-slack is positive, then the signal becomes valid sooner than required by the setup time. A setup-slack violation is a type of violation in which he setup-slack is negative such that the signal becomes valid after the point in time required by the setup time. In general, though a large positive setup-slack avoids signal-state misinterpretation, nevertheless a large positive setup-slack is undesirable because a significant portion of the large positive setup-slack represents delay that could be avoided. Accordingly, in general, the setup-slack is targeted for a near zero, positive number.

Hold time is the shortest time that a signal must be stable after the clock rising edge. When the hold time is not met, there is a risk that an incorrect interpretation of the logical state of the signal will be entered into a register, i.e., latched. Hold-slack is the difference in time between when the signal becomes valid and the hold time. In other words, when hold-slack is positive, then the signal remains valid longer than required by the hold time. A hold-slack violation is a type of slack violation in which the hold-slack is negative such that the signal remains valid too briefly, i.e., the signal remains valid for an shorter amount of time than is required by hold time. In general, though a large positive hold-slack avoids signal-state misinterpretation, nevertheless a large positive hold-slack is undesirable because a significant portion of the large positive hold-slack represents delay that could be avoided. Accordingly, in general, the hold-slack is targeted for a near zero, positive number.

FIG. 1 is a block diagram of semiconductor device 100, in accordance with some embodiments.

Semiconductor device 100 includes a cell region 102. Cell region 102 includes active regions including an active region 106 that generally extend in a first direction, e.g., parallel to the X-axis. Other active regions of cell region 102 are not shown for simplicity of illustration. Active region 106 has a T-shape which includes a stem 122, a left arm 124L and a right arm 124R. A long axis of stem 122 extends in a second direction perpendicular to the first direction, e.g., the second direction is parallel to the Y-axis. Relative to the first direction, first arm 124L and second arm 124R extend from a same end of stem 122 and away from each other. Components of transistors, e.g., source/drain (S/D) regions and corresponding channels, or the like, are formed correspondingly in the active regions including T-shaped AR 106.

Figure 2:
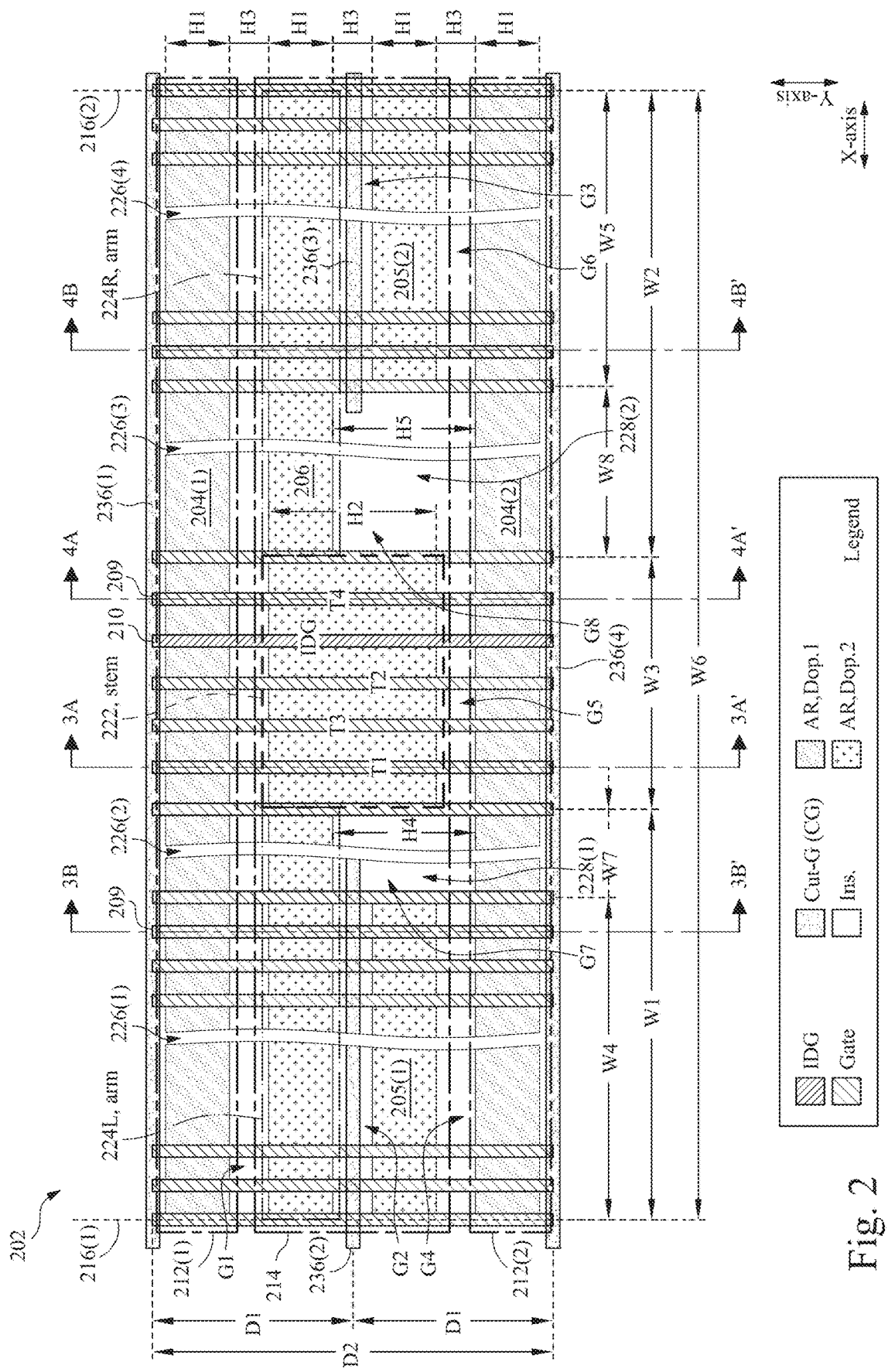
FIG. 2 is layout diagram of a cell, in accordance with some embodiments.

FIG. 2 is layout diagram of a cell 202, in accordance with some embodiments.

In some embodiments, cell 202 of FIG. 2 is an example of cell region 102 of semiconductor device 100. Section lines 3A-3A', 3B-3B', 4A-4A' and 4B-4B' relate cell 202 to the cross-sections of corresponding FIGS. 3A-3B and 4A-4B (discussed below).

In general, a layout diagram represents a semiconductor device. Shapes in the layout diagram represent corresponding components in the semiconductor device. The layout diagram per se is a top view. Shapes in the layout diagram are two-dimensional relative to, e.g., the X-axis and the Y-axis, whereas the semiconductor device being represented is three-dimensional. Typically, relative to the Z-axis, the semiconductor device is organized as a stack of layers in which are located corresponding structures, i.e., to which belong corresponding structures. Accordingly, each shape in the layout diagram represents, more particularly, a component in a corresponding layer of the corresponding semiconductor device. Typically, the layout diagram represents relative depth, i.e., position relative to the Z-axis, of shapes and thus layers by superimposing a second shape on a first shape so that the second shape at least partially overlaps the first shape. For simplicity of discussion, i.e., as a discussion-expedient, some elements in the layout diagram of FIG. 2 are referred to as if they are counterpart structures in a corresponding semiconductor device rather than patterns/shapes per se.

Layout diagrams vary in terms of the amount of detail represented. In some circumstances, selected layers of a layout diagram are combined/abstracted into a single layer, e.g., for purposes of simplification. Alternatively, and/or additionally, in some circumstances, not all layers of the corresponding semiconductor device are represented, i.e., selected layers of the layout diagram are omitted, e.g., for simplicity of illustration. FIG. 2 is an example of a layout diagram in which selected layers have been omitted, as discussed below.

In FIG. 2, cell 202 includes active regions (ARs) 204(1), 204(2), 205(1), 205(2) and 206. ARs 204(1), 204(2), 205(1) and 205(2) are rectangular and have corresponding long axes of ARs 204(1), 204(2), 205(1) and 205(2) that extend in a first direction, e.g., parallel to the X-axis. AR 206 has a T-shape which includes a stem 222, a left arm 224L and a right arm 224R. Each of stem 222, left arm 224L and right arm 224R is rectangular. A long axis of stem 222 extends in a second direction perpendicular to the first direction, e.g., the second direction is parallel to the Y-axis. Relative to the X-axis, first arm 224L and second arm 224R extend from a same end of stem 222 and away from each other. In some embodiments, the first and second directions are parallel to directions other than correspondingly the X-axis and the Y-axis.

A perimeter enclosing ARs 204(1), 204(2), 205(1), 205(2) and 206 is rectangular; hence, cell region 202 is rectangular. Relative to the Y-axis, a height of cell 202 is D2 (discussed below). Relative to the X-axis, a width of cell 202 is W6 (discussed below).

In FIG. 2, relative to the Y-axis, a distance or size is alternately referred to as a height. Each of ARs 204(1), 204(2) 205(1) and 205(2) has a height of H1. Each of left arm 224L and right arm 224R of T-shaped AR 206 has a height of H1. Stem 222 of T-shaped AR 206 has a height of H2, where H1<H2. Height H1 is determined by design rules of the corresponding semiconductor process technology node. Height H2 is a sum of the height of left arm 224L of T-shaped AR 206, the height of a gap G2 (discussed below) between left arm 224L and AR 205(1), and the height of AR 205(1), which is the same as a sum of the height of right arm 224R of T-shaped AR 206, the height of a gap G3 (discussed below) between right arm 224R and AR 205(2), and the height of AR 205(2).

In FIG. 2, relative to the Y-axis, ARs 204(1), 204(2), 205(1), 205(2) and 206 are spaced apart with corresponding gaps. In particular, cell 202 includes the following gaps: gap G1 between AR 204(1) and AR 206; gap G2 between left arm 224L of T-shaped AR 206 and AR 205(1); gap G3 between right arm 224R of T-shaped AR 206 and AR 205(2); gap G4 between AR 205(1) and AR 205(2); gap G5 between stem 222 of T-shaped AR 206 and AR 204(2); gap G6 between AR 205(2) and AR 204(2); gap G7 between left arm 224L of T-shaped AR 206 and AR 204(2); and gap G8 between right arm 224R of T-shaped AR 206 and AR 204(2).

In FIG. 2, each of gaps G1-G6 has a height of H3. In FIG. 2, height H3 is a minimum height allowed between nearest adjacent ARs patterns according to design rules of the corresponding semiconductor process technology node. In some embodiments, height H3 has a value other than the minimum height. In some embodiments, not all of gaps G1-G6 have the same height. Also, in cell 202, gap G7 has a height of H4 and gap G8 has a height of H5. Height H4 is a sum of the height of gap G2, the height of left arm 224L, and the height of gap G4 such that H4=H3+H1+H3. Height H5 is a sum of the height of gap G3, the height of right arm 224R, and the height of gap G6 such that H5=H3+H1+H3. As such, in FIG. 2, H4=H5. In FIG. 2, H3<H1<(H4=H5)<H2. In some embodiments H4 H5.

In FIG. 2, cell 202 is arranged into two rows, each row having a height D1. Height D2 of cell 202 is D2=2*D1. In some embodiments, a minimal height of a single-height cell (not shown) is D1. Accordingly, in such embodiments, cell 202 is referred to as a double height cell because height D2 is double the height of a single-height cell.

Boundaries of cell 202 corresponding to segments of the rectangular perimeter enclosing ARs 204(1), 204(2), 205(1), 205(2) and 206. Relative to the Y-axis, and relative to a center of cell 202: a distal edge of AR 204(1) is proximate and parallel to a top boundary of cell 202; and a distal edge of AR 204(2) is proximate and parallel to a bottom boundary of cell 202. Relative to the X-axis, a first majority of ARs 204(1), 204(2), 205(1), 205(2) and 206 have aligned first ends which define a first reference line 216(1) that is proximate and parallel to a left boundary of cell 202. In FIG. 2, the first majority includes ARs 204(1), 204(2) and 205(1), a first/left end of arm 224(L) of AR 206. Relative to the X-axis, a second majority of ARs 204(1), 204(2), 205(1), 205(2) and 206 have aligned second ends which define a second reference 216(2) line that is proximate and parallel to a right boundary of cell 202. In FIG. 2, the second majority includes ARs 204(1), 204(2) and 205(2), a second/right end of arm 224(R) of AR 206.

In FIG. 2, relative to the X-axis, a distance or size is alternately referred to as a width. Each of ARs 204(1) and 204(2) has a width W6. Left arm 224L of T-shaped AR 206 has a width W1. Right arm 224R of T-shaped AR 106 has a width W2. Stem 222 of T-shaped AR 206 has a width W3. Width W3 is dependent upon the number of transistors included in stem 222 (discussed below). A widest section of T-shaped AR 206 has a width, W206, equal to the sum of the widths of left arm 224L, stem 222 and right arm 224R such that W206=W1+W3+W2. In FIG. 2, width W6 of cell 202 is W206 such that W6=W206. In some embodiments, W206<W6.

In cell 202, AR 205(1) has a width W4. AR 205(2) has a width W5. W4 and W5 dependent on W3. In FIG. 2, W5<W4. In some embodiments, W4=W5. In some embodiments, W4<W5. Widths W1, W2, W3, W4, W5, W6, W7 and W8 are variable, as indicated by breaks 226(1), 226(2), 226(3) and 226(4) in the layout diagram of FIG. 2.

Relative to the X-axis, ARs 205(1) and 205(2) are separated from each other by stem 222 of AR 206. Relative to the Y-axis, ARs 205(1) and 205(2) are aligned. In some embodiments, long axes correspondingly of ARs 205(1) and 205(2) are aligned. Relative to the X-axis: AR 205(1) is separated from stem 222 of T-shaped AR 206 by a gap 228(1) having a width W7; and AR 205(2) is separated from stem 222 of T-shaped AR 206 by a gap 228(2) having a width W8. In FIG. 2, W7<W8. In some embodiments, W7=W8. In some embodiments, W8=W7. Each of W7 and W8 is at least equal to a minimum width been nearest abutting (relative to the X-axis) ARs as determined by design rules of the corresponding semiconductor process technology node.

In FIG. 2, cell width W206 is equal to the sum of the widths of AR 205(1), gap 228(1), stem 222, gap 228(2) and AR 205(2) such that W206=W4+W7+W3+W8+W5. In some embodiments, W206>W4+W7+W3+W8+W5.

In FIG. 2, cell 202 further includes gates 209. Long axes of gates 209 extend parallel the Y-axis. Components of transistors, e.g., source/drain (S/D) regions and corresponding channels, or the like, are formed correspondingly in the active regions including T-shaped AR 206. Additional components of the transistors of cell 202 include corresponding portions of gates 209. In some embodiments, a given S/D region is formed by doping a portion of an AR that is between corresponding instances of gate 209 or that is adjacent to a corresponding instance of gate 209 with an appropriate conductivity-type dopant.

Cell 202 further includes cut-gate (CG) shapes/patterns. Long axes of cut patterns 236(1), 236(2), 236(3) and 236(4) extend substantially parallel to the X-axis. In general, where a given gate underlies a given CG shape such that a portion of the given gate is overlapped by the given CG shape, the given CG shape is used to indicate that the overlapped portion of the given gate will be removed during fabrication of a corresponding semiconductor device.

In some embodiments, the transistors of cell 202 are field-effect transistors (FETs). In some embodiments, ARs 204(1) and 204(2) are doped with a first conductivity-type dopant, and ARs 205(1), 205(2) and 206 are doped with a second conductivity-type dopant.

Figure 3A:
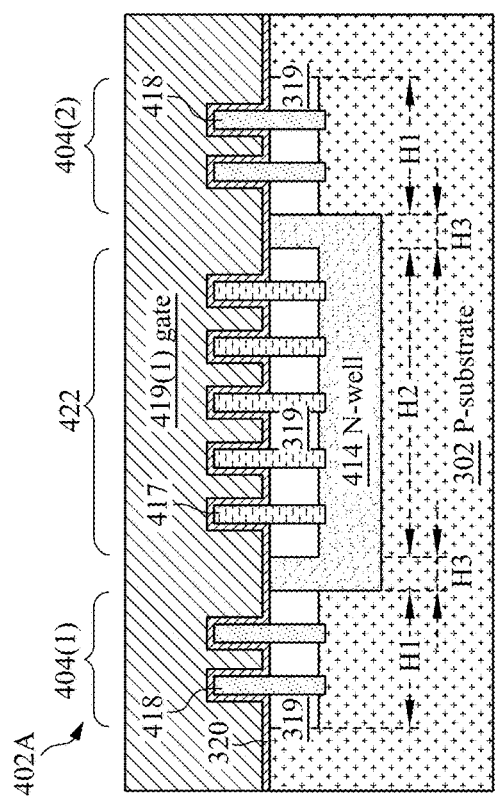
FIGS. 3A-3B are corresponding cross sectional views of a semiconductor device, in accordance with some embodiments.
Figure 3B:
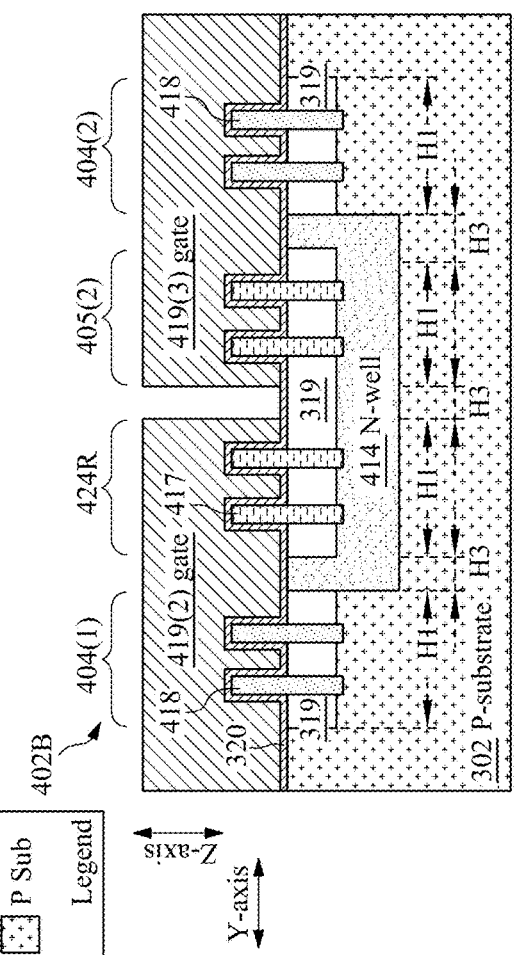

In some embodiments that are configured according to complementary metal oxide semiconductor (CMOS) technology, e.g., FIGS. 3A-3B, the following is true: ARs 204(1) and 204(2) are doped with a first conductivity-type dopant such that the transistors corresponding to ARs 204(1) and 204(2) are positive-channel metal oxide semiconductor (PMOS) FETs (PFETs); ARs 205(1), 205(2) and 206 are doped with a second conductivity-type dopant such that the transistors corresponding to ARs 205(1), 205(2) and 206 are negative-channel metal oxide semiconductor (NMOS) FETs (NFETs); and ARs 204(1) and 204(2) are formed in corresponding N-wells 212(1) and 212(2).

Figure 4A:
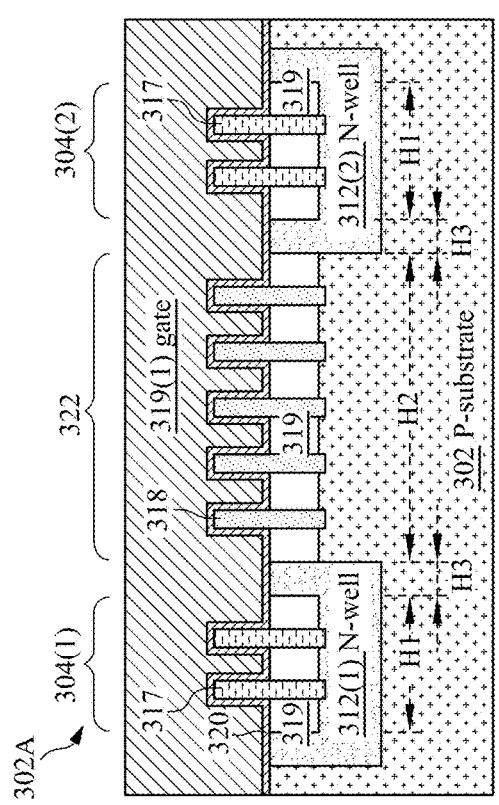
FIGS. 4A-4B are corresponding cross sectional views of a semiconductor device, in accordance with some embodiments.
Figure 4B:
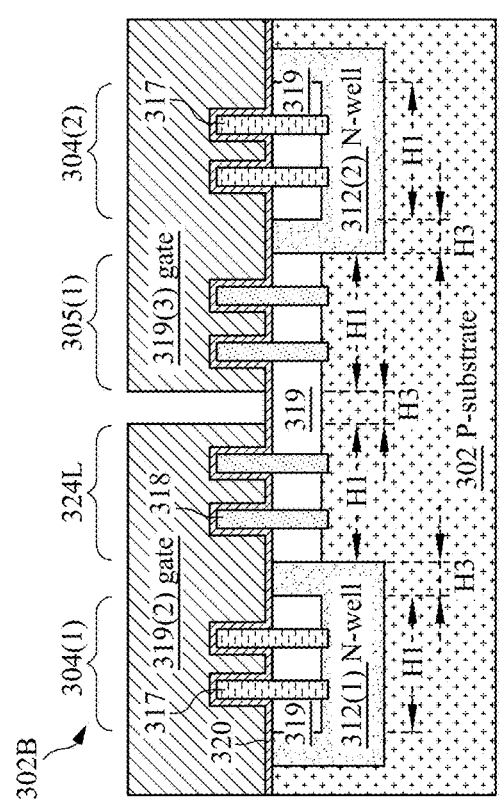

In some embodiments that are configured according to CMOS technology, e.g., FIGS. 4A-4B, the following is true: ARs 204(1) and 204(2) are doped with the second conductivity-type dopant such that the transistors corresponding to ARs 204(1) and 204(2) are NFETs; ARs 205(1), 205(2) and 206 are doped with the first conductivity-type dopant such that the transistors corresponding to ARs 205(1), 205(2) and 206 are PFETs; and ARs 205(1), 205(2) and 206 are formed in a corresponding N-well 214. Regarding CMOS technology, it is to be understood that N-well 214 is mutually exclusive to N-wells 212(1) and 212(2), and vice-versa.

In some embodiments, the transistors of cell 202 have a fin-FET architecture (FIGS. 3A-3B and 4A-4B). In some embodiments, the transistors of cell 202 have a planar-transistor architecture. In some embodiments, the transistors of cell 202 have an architecture other than the fin-FET architecture or the planar-transistor architecture.

The channels of transistors in each of ARs 204(1), 204(2) 205(1) and 205(2) have a first channel-size. The first channel-size is proportional at least in part to height H1. The channels of transistors in each of left arm 224L and right arm 224R of T-shaped AR 206 have the first channel-size. In some embodiments which use the fin-FET architecture, the first channel-size is at least in part proportional to the number of fins intersected by a corresponding portion of a given one of gates 209. The channels of transistors in stem 222 of T-shaped AR 206 have a second channel-size. The first channel-size is proportional to height H1. The second channel-size is proportional at least in part to height H2. In some embodiments which use the fin-FET architecture, the second channel-size is at least in part proportional to the number of fins intersected by a corresponding portion of a given one of gates 209.

Transistors with the second channel-size have different, i.e., better/greater performance capabilities than transistors with the first channel-size. In some embodiments, transistors with the second channel-size have better/greater current-conduction capability than transistors with the first channel-size.

Figure 5A:
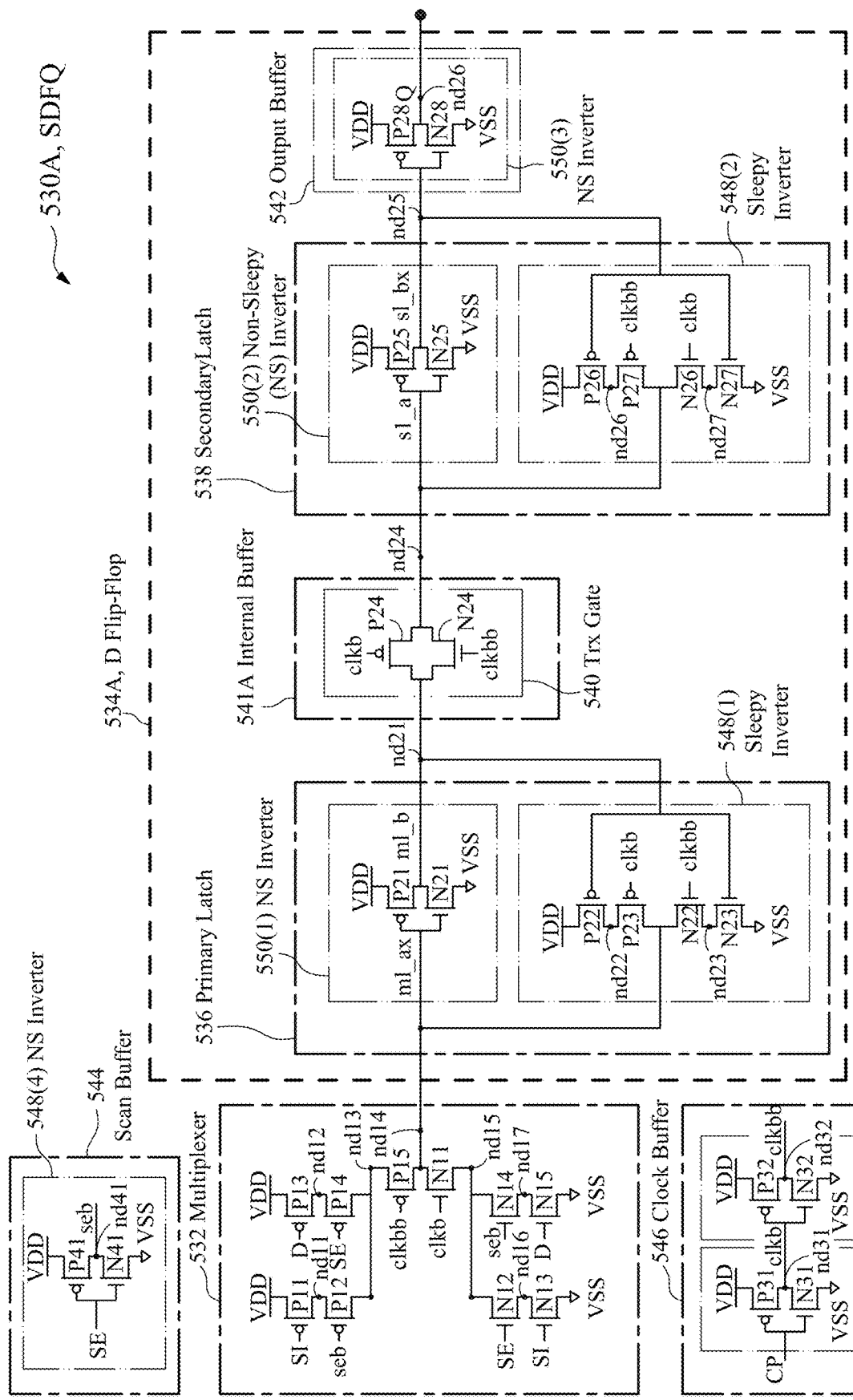
FIGS. 5A-5B are corresponding schematic circuit diagrams, in accordance with some embodiments.
Figure 5B:
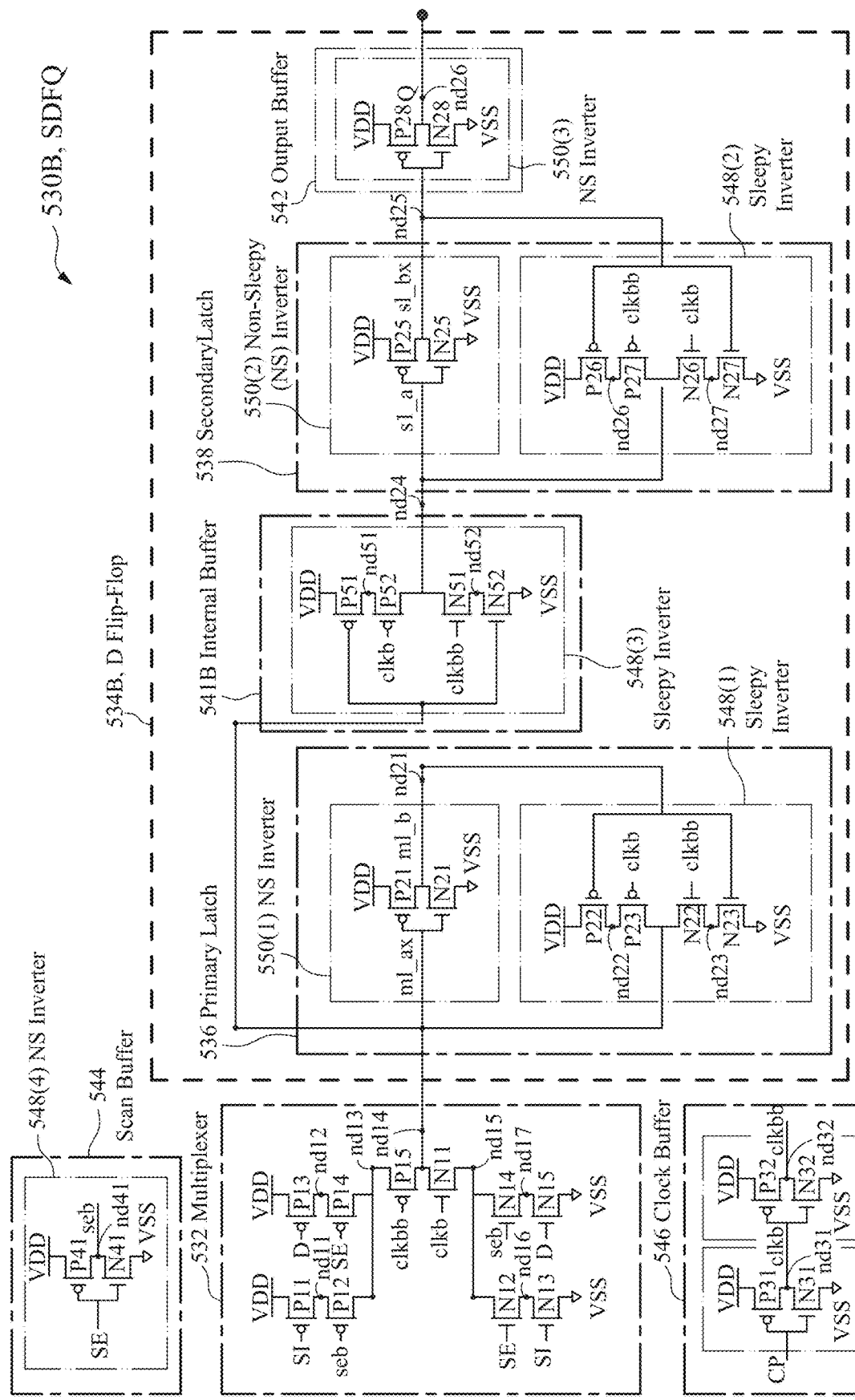

In FIG. 2, the transistors of cell region 202 are arranged to function as an active circuit. In some embodiments, the active circuit is a scan insertion D flip-flop (SDFQ) (FIGS. 5A-5B). The number of gates 209 shown in FIG. 2, and therefore the corresponding number of transistors, has been reduced for simplicity of illustration. As a practical matter, the active circuit defined by the transistors of cell 202 determines the number of transistors to be included in cell 202, and thus the number of gates 209 to be included in cell 202.

According to another approach, a given active circuit is represented by a layout diagram which includes first to fourth rectangular active areas having a height H1. The first and fourth active areas of the other approach could be considered corresponding counterparts to ARs 204(1) and 204(2). The second active area of the other approach could be considered a counterpart to left arm 224L, right arm 224R and the portion of stem 222 overlapped (relative to the Y-axis) by arms 224L and 224R. The third active area of the other approach could be considered a counterpart to either AR 205(1) or AR 205(2) if either had a width W6 and was aligned (relative to the X-axis) with first and fourth active areas. Each of the transistors of the given active circuit of the other approach has a same given channel-size that is proportional to height H1, e.g., the first channel size of the transistors of FIG. 2. The given active circuit of the other approach suffers a slack violation, e.g., a hold-slack violation. In some embodiments, the hold-slack violation of the given active circuit of the other approach is avoided by using T-shaped AR 206 and corresponding ARs 205(1) and 205(2) instead of the third and fourth active areas of the other approach. In some embodiments, a few of the transistors of the given active circuit are formed in stem 222 of T-shaped AR 206 and accordingly have the second channel-size that is proportional to height H2. The few transistors in stem 222 of T-shaped AR 206 having the second channel-size exhibit better/greater performance capabilities than the remaining transistors, the latter having the first channel-size; accordingly, the overall performance of the given active circuit having T-shaped AR 206 is changed, i.e., improved, so as to avoid the hold-slack violation suffered by the given active circuit according to the other approach.

In FIG. 2, one instance of gate 209 has been replaced by an insulating dummy gate (IDG) 210. In some embodiments, an IDG is a dielectric structure that includes one or more dielectric materials and functions as an electrical isolation structure. Accordingly, an IDG is not a structure that is electrically conductive and thus does not function, e.g., as an active gate of a transistor. An IDG includes one or more dielectric materials and functions as an electrical isolation structure. In some embodiments, an IDG is based on a gate as a precursor. In some embodiments, a dummy gate includes a conductor, a gate-insulator layer, (optionally) one or more spacers, or the like. In some embodiments, an IDG is formed by first forming a gate, e.g., a dummy gate, sacrificing/removing (e.g., etching) the conductor of the gate to form a trench, (optionally) removing a portion of a substrate that previously had been under the conductor to deepen the trench, and then filling the trench with one or more dielectric materials such that the physical dimensions of the resultant electrical isolation structure, i.e., the IDG, are similar to the dimensions of the dummy gate which was sacrificed, or the combination of the gate which was sacrificed and the removed portion of the substrate. In some embodiments, an IDG is a dielectric feature that includes one or more dielectric materials (e.g., oxide, nitride, oxynitride, or other suitable materials), and functions as an isolation feature. In some embodiments, an IDG is a continuous polysilicon on oxide diffusion (OD) edge structure, and is referred to as a CPODE structure.

In FIG. 2, stem 222 of T-shaped AR 206 is shown as including transistors T1, T2, T3 and T4 and a portion of IDG 210. Relative to the left-to-right arrangement of transistors T1, T2, T3 and T4 and IDG 210 shown in stem 222 of FIG. 2, namely T1:T3:T2:IDG:T4, various permutations thereof are shown in FIG. 5C, in accordance with some embodiments. Relative to the combination of transistors T1, T2, T3 and T4 and IDG 210 shown in stem 222 of FIG. 2, various sub-combinations of the combination are shown in FIG. 5C, in accordance with some embodiments.

In some embodiments, relative to the X-axis, the locations of T1, T2, T3, T4 and/or IDG 210 are different than is shown in FIG. 2. In some embodiments, stem 222 includes only one of transistors T1-T4 such that W3 is proportionally narrower/smaller, and gaps 228(1) and 228(2) are correspondingly proportionally wider, than is shown in FIG. 2 (assuming that such embodiments include the sole instance of IDG 210 as shown in FIG. 210). In some embodiments, stem 222 includes two or more but fewer than all of transistors T1-T4, such that W3 is proportionally narrower/smaller, and gaps 228(1) and 228(2) are correspondingly proportionally wider, than is shown in FIG. 2 (assuming that such embodiments include the sole instance of IDG 210 as shown in FIG. 2). In some embodiments, stem 222 does not include any instances of IDG 210 such that W3 is correspondingly narrower/smaller than is W3 is proportionally narrower/smaller, and gaps 228(1) and 228(2) are correspondingly proportionally wider, than is shown in FIG. 2. (assuming that such embodiments include transistors T1-T4 as shown in FIG. 2). In some embodiments, stem 222 includes two or more instances of IDG 210 such that W3 is correspondingly narrower/smaller than is W3 is proportionally narrower/smaller, and gaps 228(1) and 228(2) are correspondingly proportionally wider, than is shown in FIG. 2. (assuming that such embodiments include transistors T1-T4 as shown in FIG. 2).

Regarding FIG. 2, in some embodiments, one or more dummy gates (not shown) are formed in gap 228(1) and/or one or more dummy gates (not shown) are formed in gap 228(2). In some embodiments, one or more IDGs (not shown) are formed in one or more of ARs 204(1), 204(2), 205(1) and/or 205(2) and/or left arm 224L and/or right arm 224R.

FIGS. 3A-3B are corresponding cross sectional views of a semiconductor device, in accordance with some embodiments.

In particular, FIGS. 3A-3B are cross sectional views of a cell region of a semiconductor device based on cell 202 of FIG. 2 in a circumstance of CMOS technology in which cell 202 includes N-wells 212(1) and 212(2). FIGS. 3A-3B correspond to section lines 3A-3A' and 3B-3B' of FIG. 2.

Each of FIGS. 3A-3B includes: a P-type substrate 302; N-wells 312(1) and 312(2) formed in substrate 302; P-type fins 317 formed partially in corresponding N-wells 312(1)-312(2) relative to the Z-axis; N-type fins 318 formed partially in substrate 302 relative to the Z-axis; fin-insulator 319 formed against fins 317 and 318; and a gate insulating layer 320 formed on fins 317 and 318, and on exposed upper surfaces of N-wells 312(1)-312(2), fin-insulator 319 and substrate 302; and gate 319(1).

FIG. 3A further includes a gate 319(1). In FIG. 3A, fins 317 in N-well 312(1) represent an AR 304(1). Fins 317 in N-well 312(2) represent an AR 304(2). Fins 318 represent a stem 322 of a T-shaped AR corresponding to T-shaped AR 206.

FIG. 3B further includes gates 319(2) and 319(3). In FIG. 3B, fins 318 underneath gate 319(2) represent a left arm 324L of the T-shaped AR corresponding to T-shaped AR 206. Fins 318 underneath gate 319(3) represent an AR 305(1).

FIGS. 4A-4B are corresponding cross sectional views of a semiconductor device, in accordance with some embodiments.

In particular, FIGS. 4A-4B are corresponding cross sectional views of a cell region of a semiconductor device based on cell 202 of FIG. 2 in a circumstance of CMOS technology in which cell 202 includes N-wells 214. FIGS. 4A-4B correspond to section lines 4A-4A' and 4B-4B' of FIG. 2. In some embodiments, the cell region of FIGS. 4A-4B is an example of cell region 102 of semiconductor device 100.

Each of FIGS. 4A-4B includes: P-type substrate 402; an N-well 414 formed in substrate 302; P-type fins 417 formed partially in N-well 414 relative to the Z-axis; N-type fins 418 formed partially in substrate 302 relative to the Z-axis; fin-insulator 319 formed against fins 417 and 418; and a gate insulating layer 320 formed on fins 417 and 418, and on exposed upper surfaces of N-well 414, fin-insulator 319 and substrate 302; and gate 419(1).

FIG. 4A further includes a gate 419(1). In FIG. 4A, fins 418 to the left of N-well 414 represent an AR 404(1). Fins 418 to the right of N-well 414 represent an AR 404(2). Fins 417 represent a stem 422 of a T-shaped AR corresponding to T-shaped AR 206.

FIG. 4B further includes gates 419(2) and 419(3). In FIG. 4B, fins 417 underneath gate 419(2) represent a right arm 424R of the T-shaped AR corresponding to T-shaped AR 206. Fins 418 underneath gate 419(3) represent an AR 405(2).

FIGS. 5A-5B are corresponding schematic circuit diagrams, in accordance with some embodiments.

More particularly, FIGS. 5A-5B are corresponding schematic circuit diagrams of scan D FF (SDFQs) 530A and 530B. Each of SDFQ 530A and SDFQ 530B is an example of how the transistors of FIGS. 1, 2, 3A-3B, 4A-4B, or the like are arranged to function as an active circuit.

FIG. 5A differs from FIG. 5B in that SDFQ 530A is a transmission-gate-based design (discussed below) whereas SDFQ 530B is a stack-gate-based design (discussed below). Each of SDFQ 530A and SDFQ 530B is an edge-triggered arrangement that is triggered on a rising edge (positive edge) of a clock signal. Variations to make each of SDFQ 530A and SDFQ 530B be triggered on the falling edge (negative edge) of the clock signal are discussed below.

Transistors N31, N22, N23 and N21 (discussed below) of each of SDFQ 530A and SDFQ 530B are examples of transistors T1, T2, T3 and T4 of FIG. 2, the latter being formed in stem 222 of T-shaped AR 206 as a technique for avoiding a hold-slack violation. Regarding the left-to-right arrangement of transistors T1-T4 and IDG 210 in FIG. 2, namely T1:T3:T2:IDG:T4, transistors N31, N22, N23 and N21 of each of SDFQ 530A and SDFQ 530B are formed in stem 222 of T-shaped AR 206 and arranged left to right as N31:N23:N22:IDG:N21 (see row R6 of FIG. 5C).

In some embodiments in which each of SDFQ 530A and SDFQ 530B is falling-edge triggered, transistors P31, P23, P22 and P21 (discussed below) of each of SDFQ 530A and SDFQ 530B correspond to transistors T1, T2, T3 and T4 of FIG. 2. Regarding the left-to-right arrangement of transistors T1-T4 and IDG 210 in FIG. 2, namely T1:T3:T2:IDG:T4, transistors P31, P23, P22 and P21 of each of SDFQ 530A and SDFQ 530B are formed in stem 222 of T-shaped AR 206 and arranged left to right as P31:P22:P23:IDG:P21 (see row R16 of FIG. 5C).

In FIG. 5A, SDFQ 530A includes a multiplexer 532, a D flip-flop 534A, a scan buffer 544 and a clock buffer 546.

In FIG. 5A, scan buffer 544 receives a Scan/Test Enable (SE)_signal that selects between normal operation relative to input signal D or a scan operation relative to a Scan-In (SI) signal. Scan buffer 544 includes a non-sleepy (NS) inverter 548(4), the latter including series-connected PFET P41 and NFET N41. An NS inverter, e.g., 548(4) is a counterpart to a sleepy inverter, e.g., 548(1) (discussed below). Hereinafter, transistors whose reference alphanumeric is prefixed with the uppercase letter P, e.g., P41, are PFETs, and transistors whose reference alphanumeric is prefixed with the uppercase letter N, e.g., N41, are NFETs.

In NS inverter 548(4), transistor P41 is connected between a node having a first reference voltage, e.g., VDD, and a node nd41. Transistor N41 is connected between node nd41 and a node having a second reference voltage, e.g., VSS. The gate terminals of each of transistors P41 and N41 are connected together and are configured to receive signal SE. Node nd41 has a signal seb which is the inversion of signal SE.

In FIG. 5A, clock buffer 546 includes a pair of NS inverters 548(5) and 548(6). NS inverter 548(5) includes series-connected transistors P31 and N31. Transistor P31 is connected between a node having voltage VDD and a node nd31. Transistor N31 is connected between node nd31 and a node having voltage VSS. The gate terminals of each of transistors P31 and N31 are connected together and are configured to receive a clock signal CP. Node nd31 represents an output node of NS inverter 548(5) and has a clock signal clkb which represents the inversion of clock signal CP.

In clock buffer 546, NS inverter 548(6) includes series-connected transistors P32 and N32. Transistor P32 is connected between a node having voltage VDD and a node nd32. Transistor N32 is connected between node nd32 and a node having voltage VSS. The gate terminals of each of transistors P32 and N32 are connected together and to node nd31, and thus are configured to receive clock signal clkb. Node nd32 represents an output node of NS inverter 548(6) and has a clock signal clkbb which represents the inversion of clock signal clkb.

In FIG. 5A, multiplexer 532 includes transistors P11-P15 and N11-N15. Transistor P11 is connected between a node having voltage VDD and a node nd11. The gate terminal of transistor P11 receives signal SI. Transistor P12 is connected between node nd11 and a node nd13. The gate terminal of transistor P12 receives signal seb. Transistor P13 is connected between a node having voltage VDD and a node nd12. The gate terminal of transistor P13 receives input signal D. Transistor P14 is connected between node nd12 and node nd13. The gate terminal of transistor P14 receives signal SE. Transistor P15 is connected between node nd13 and a node nd14 which has signal ml_ax. The gate terminal of transistor P15 receives signal clkbb. Transistor N11 is connected between node nd14 and a node nd15. The gate terminal of transistor N11 receives signal clkb. Transistor N12 is connected between node nd15 and a node nd16. The gate terminal of transistor N12 receives signal SE. Transistor N13 is connected between node nd16 and a node having voltage VSS. The gate terminal of transistor N13 receives signal SI. Transistor N14 is connected between node nd15 and a node nd17. The gate terminal of transistor N14 receives signal seb. Transistor N15 is connected between node nd17 and a node having voltage VSS. The gate terminal of transistor N15 receives input signal D.

In FIG. 5A, D flip-flop 534A includes a primary latch 536, an internal buffer 541A, a secondary latch 538 and an output buffer 542.

Primary latch 536 includes an NS inverter 550(1) and a sleepy inverter 548(1). NS inverter 550(1) includes transistors P21 and N21. Transistor P21 is connected between a node having voltage VDD and a node nd21. Transistor N21 is located between node nd21 and a node having voltage VSS. The gate terminals of transistors P21 and N21 are connected together and to node nd14, and thus are configured to receive signal ml_ax. As such, signal ml_ax represents the input signal of D flip-flop 534A. Node nd21 represents an output node of NS inverter 550(1) and has a signal ml_b which represents the inversion of signal ml_ax.

In primary latch 536, sleepy inverter 548(1) includes transistors P22-P23 and N22-N23. Transistor P22 is connected between a node having voltage VDD and a node nd22. Transistor P23 is connected between node nd22 and node nd14. The gate terminal of transistor P23 receives signal clkb. Transistor N22 is connected between node nd14 and a node nd23. The gate terminal of transistor N22 receives signal clkbb. In some embodiments, the gate terminal of transistor N22 receives signal CP instead of signal clkbb. Transistor N23 is connected between node nd23 and a node having voltage VSS. Sleepy inverter 548(1) can be put into a sleep mode due to transistors P23 and N22. The gate terminals of transistors P22 and N23 are connected together and to node nd21. Accordingly, sleepy inverter 548(1) feeds-back an inverted version of signal ml_b (from node nd21) to node nd14.

In FIG. 5A, internal buffer 541A includes a transmission gate 540, the latter including transistors P24 and N24. The inclusion of transmission gate 540 is SDFQ 530A is referred to as a transmission-gate-based design. Transistors P24 and N24 are connected in parallel between node nd21 and a node nd24. The gate of transistor P24 receives signal clkb. The gate terminal of transistor N24 receives signal clkbb. Node nd24 has a signal sl_a.

In D flip-flop 534A, secondary latch 538 includes an NS inverter 550(2) and a sleepy inverter 548(2). NS inverter 550(2) includes transistors P25 and N25. Transistor P25 is connected between a node having voltage VDD and a node nd25. Transistor N25 is connected between node nd25 and a node having voltage VSS. The gate terminals of transistors P25 and N25 are connected together and to node nd24, and thus are configured to receive signal sl_a. Node nd25 represents an output node of NS inverter 550(2) and has a signal sl_bx which represents the inversion of signal sl_a.

In secondary latch 538, sleepy inverter 548(2) includes transistors P26-P27 and N26-N27. Transistor P26 is connected between a node having voltage VDD and a node nd26. Transistor P27 is connected between node nd26 and node nd24. The gate terminal of transistor P27 receives signal clkbb. Transistor N26 is connected between node nd24 and a node nd27. Transistor N27 is connected between node nd27 and a node having voltage VSS. The gate terminal of transistor N26 receives signal clkb. Sleepy inverter 548(2) can be put into a sleep mode due to transistors P27 and N26. The gate terminals of transistors P22 and N23 are connected together and to node nd25. Accordingly, sleepy inverter 548(2) feeds-back an inverted version of signal sl_bx (from node nd25) to node nd24.

In D flip-flop 534A, output buffer 542 includes an NS inverter 550(3), the latter including transistors P28 and N28.

Transistor P28 is connected between a node having voltage VDD and a node nd26. Transistor N28 is connected between node nd28 and a node having voltage VSS. The gate terminals of transistors P28 and N28 are connected together and to node nd25, and thus are configured to receive signal sl_bx. Node nd26 represents an output node of NS inverter 550(3), and thus of D flip-flop 534A. Furthermore, node nd26 also represents the output node of SDFQ 400. Node nd26 has signal Q which represents the inversion of signal sl_bx.

It is to be recalled that SDFQ 530A is triggered on the rising edge (positive edge) of a clock signal. Variations to make SDFQ 530A be triggered on the falling edge (negative edge) of the clock signal include the following. Instead of receiving clock signal CP, the gate terminals of each of transistors P31 and N31 are configured to receive a clock signal CPN, where CPN is an inverted version of clock signal CP. Instead of receiving signal clkbb, the gate terminal of transistor P15 receives signal clkb. Instead of receiving signal clkb, the gate terminal of transistor N11 receives signal clkbb. Instead of receiving signal clkb, the gate terminal of transistor P23 receives signal clkbb. In some embodiments, the gate terminal of transistor P23 receives signal CPN instead of signal clkbb. Instead of receiving signal clkbb, the gate terminal of transistor N22 receives signal clkb. Instead of receiving signal clkb, the gate terminal of transistor P24 receives signal clkbb. Instead of receiving signal clkbb, the gate terminal of transistor N24 receives signal clkb. Instead of receiving signal clkbb, the gate terminal of transistor P27 receives signal clkb. Instead of receiving signal clkb, the gate terminal of transistor N26 receives signal clkbb.

Regarding FIG. 5B, it is to be recalled that SDFQ 530B is a stack-gate-based design, whereas SDFQ 530A of FIG. 5A is a transmission-gate-based design. More particularly, whereas D flip-flop 534A of SDFQ 530A of FIG. 5A includes internal buffer 541A which includes transmission gate 540, D flip-flop 534B of SDFQ 530B of FIG. 5B includes internal buffer 541B. Internal buffer 541B includes a sleepy inverter 548(3), the latter being an example of a stack-gate-based circuit.

In FIG. 5B, sleepy inverter 548(3) of internal buffer 541B includes transistors P51-P52 and N51-N52. Transistor P51 is connected between a node having voltage VDD and a node nd51. Transistor P52 is connected between node nd51 and node nd24. The gate terminal of transistor P52 receives signal clkb. Transistor N51 is connected between node nd24 and a node nd52. The gate terminal of transistor N51 receives signal clkbb. In some embodiments, the gate terminal of transistor N51 receives signal CP instead of signal clkbb. Transistor N52 is connected between node nd52 and a node having voltage VSS. The gate terminal of transistor N51 receives signal clkbb. Sleepy inverter 548(3) can be put into a sleep mode due to transistors P52 and N51. The gate terminals of transistors P51 and N52 are connected together and to node nd14. Accordingly, signal ml_ax is provided as the input to sleepy inverter 548(3). Unlike transmission gate 540 of FIG. 5A whose input receives signal ml_b from node nd21, the input of sleepy inverter 548(3) is not connected to node nd21. Rather, in FIG. 5B, only the input of sleepy inverter 548(1), i.e., the gate terminals of each of transistors P22 and N23, receive signal ml_b from node nd21.

It is to be recalled that SDFQ 530B is triggered on the rising edge (positive edge) of a clock signal. Variations to make SDFQ 530B be triggered on the falling edge (negative edge) of the clock signal include the following. Instead of receiving clock signal CP, the gate terminals of each of transistors P31 and N31 are configured to receive a clock signal CPN, where CPN is an inverted version of clock signal CP. Instead of receiving signal clkbb, the gate terminal of transistor P15 receives signal clkb. Instead of receiving signal clkb, the gate terminal of transistor N11 receives signal clkbb. Instead of receiving signal clkb, the gate terminal of transistor P23 receives signal clkbb. In some embodiments, the gate terminal of transistor P23 receives signal CPN instead of signal clkbb. Instead of receiving signal clkbb, the gate terminal of transistor N22 receives signal clkb. Instead of receiving signal clkb, the gate terminal of transistor P52 receives signal clkbb. Instead of receiving signal clkbb, the gate terminal of transistor N51 receives signal clkb. Instead of receiving signal clkbb, the gate terminal of transistor P27 receives signal clkb. Instead of receiving signal clkb, the gate terminal of transistor N26 receives signal clkbb.

An SDFQ according to another approach, which could be considered a counterpart to either SDFQ 530A of FIG. 5A or SDFQ 530B of FIG. 5B, has transistors which could be considered counterparts to the transistors of FIG. 5A or 5B. The SDFQ of the other approach is represented by a layout diagram which includes first to fourth rectangular ARs having a height H1. The first and fourth ARs of the other approach could be considered corresponding counterparts to ARs 204(1) and 204(2) of FIG. 2. The second AR of the other approach could be considered a counterpart to left arm 224L of FIG. 2, right arm 224R of FIG. 2 and the portion of stem 222 of FIG. 2 overlapped (relative to the Y-axis) by arms 224L and 224R. The third AR of the other approach could be considered a counterpart to either AR 205(1) or AR 205(2) of FIG. 2 if either had a width W6 and was aligned (relative to the X-axis) with first and fourth ARs. Each of the transistors of the SDFQ of the other approach has a same given channel-size, e.g., the first channel size of the transistors of FIG. 2. The SDFQ of the other approach suffers a slack violation, e.g., a hold-slack violation. In some embodiments, the hold-slack violation of the SDFQ of the other approach is avoided by using T-shaped AR 206 and corresponding ARs 205(1) and 205(2) instead of the third and fourth ARs of the other approach. In some embodiments, a few of the transistors of SDFQ 530A or SDFQ 530B are formed in stem 222 of T-shaped AR 206 and accordingly have the second channel-size. The few transistors in stem 222 of T-shaped AR 206 with the second channel-size have better/greater performance capabilities than the remaining transistors, the latter having the first channel-size, which changes the overall performance of SDFQ 530A or SDFQ 530B so as to avoid the hold-slack violation suffered by the SDFQ according to the other approach.

FIG. 5C is a table 560 of permutations and combinations with respect to FIGS. 5A-5B, in accordance with some embodiments.

Figure 5D:
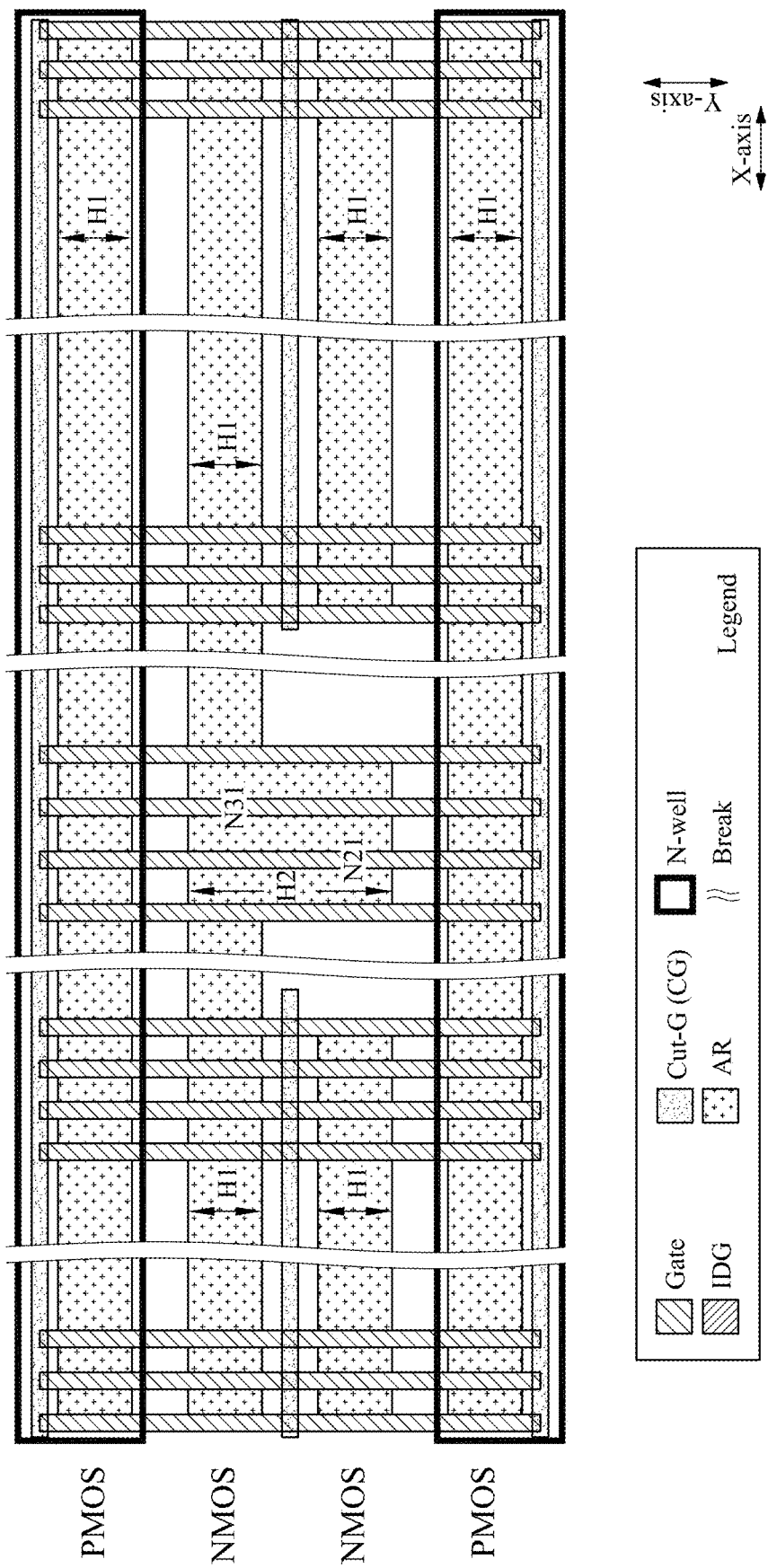
FIGS. 5D-5W are layout diagrams corresponding to the rows of the table of FIG. 5C, in accordance with some embodiments.
Figure 5E:
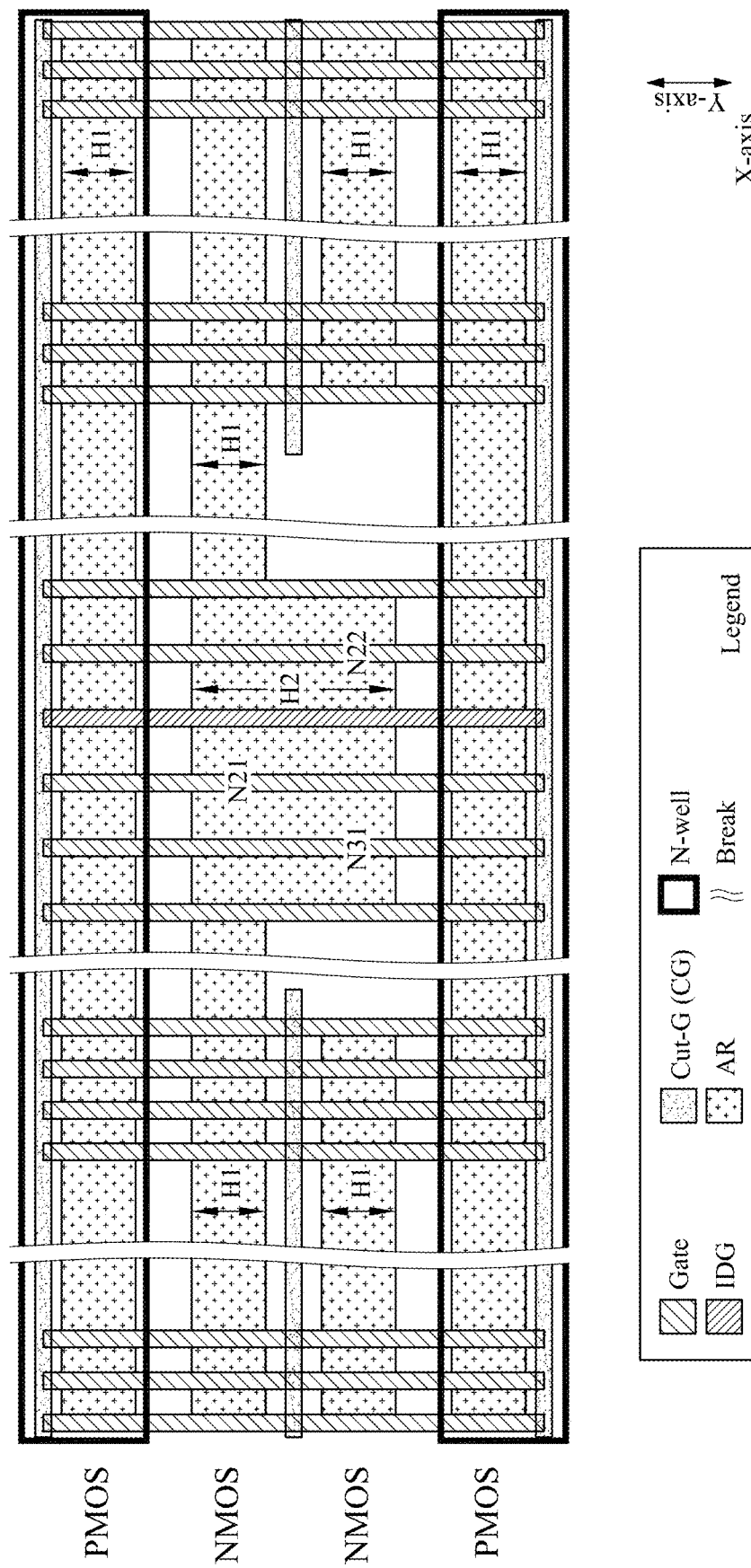
FIG. 5C is a table of permutations and combinations, in accordance with some embodiments.
Figure 5F:
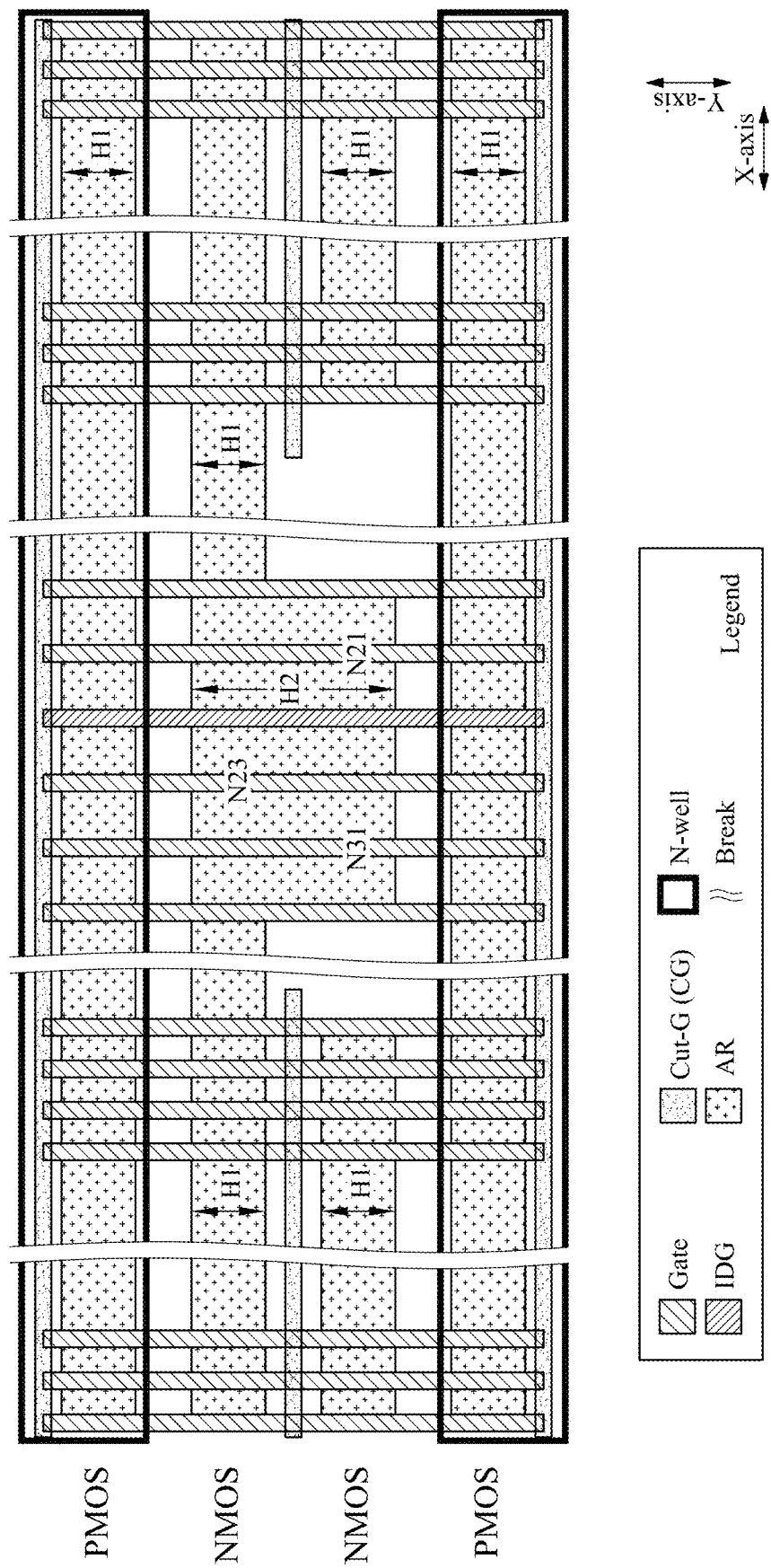
Figure 5G:
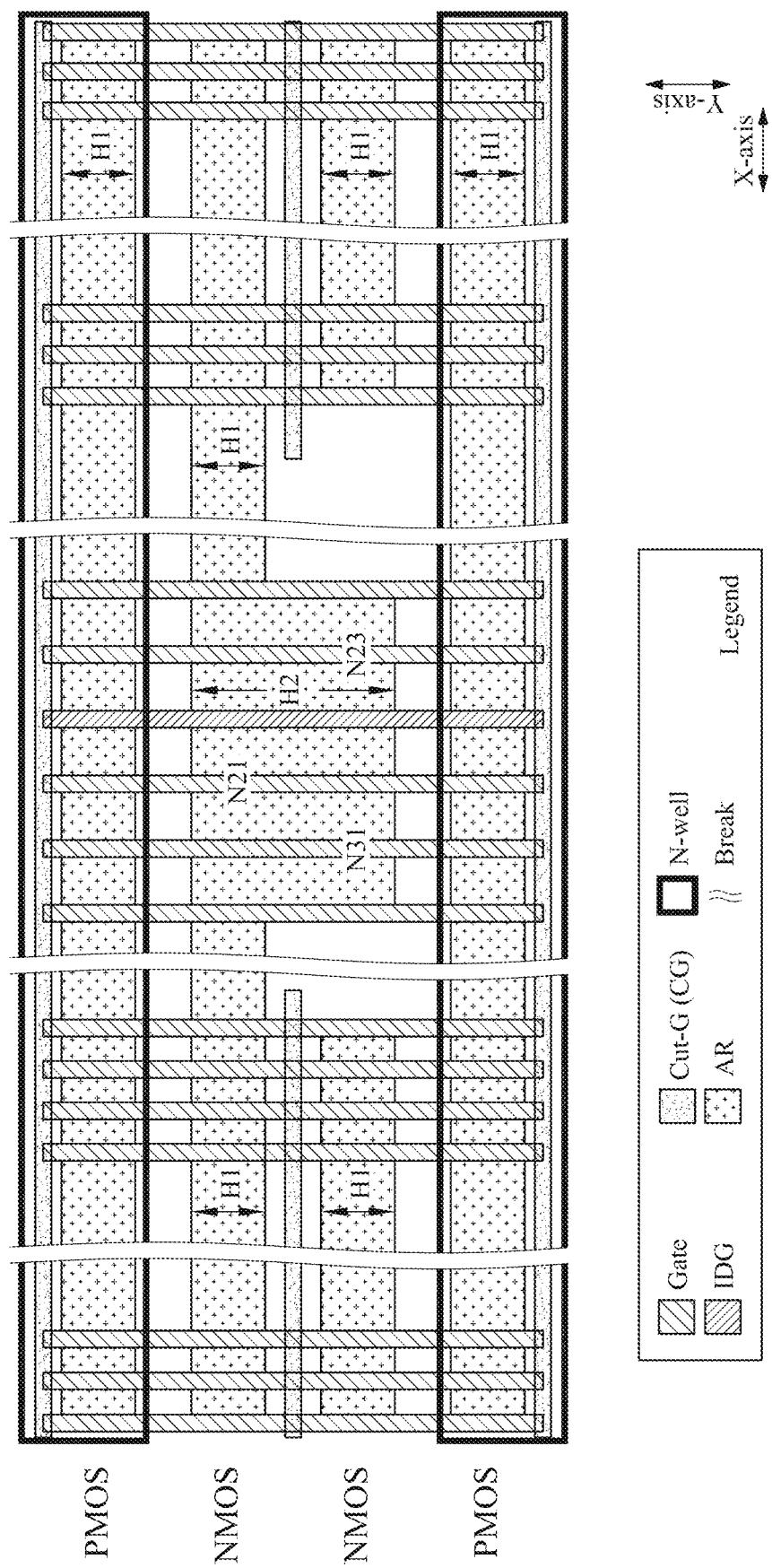
Figure 5H:
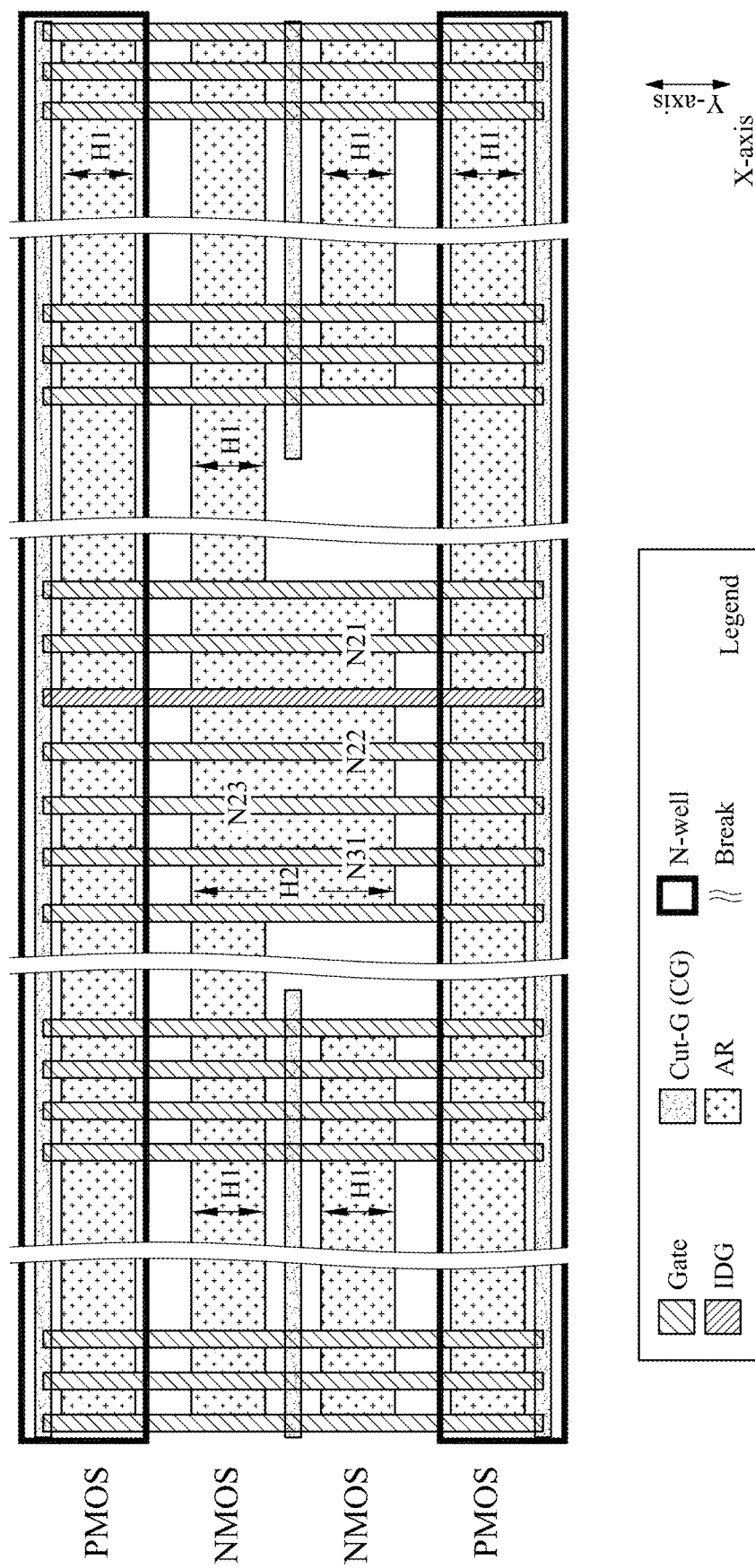
Figure 5I:
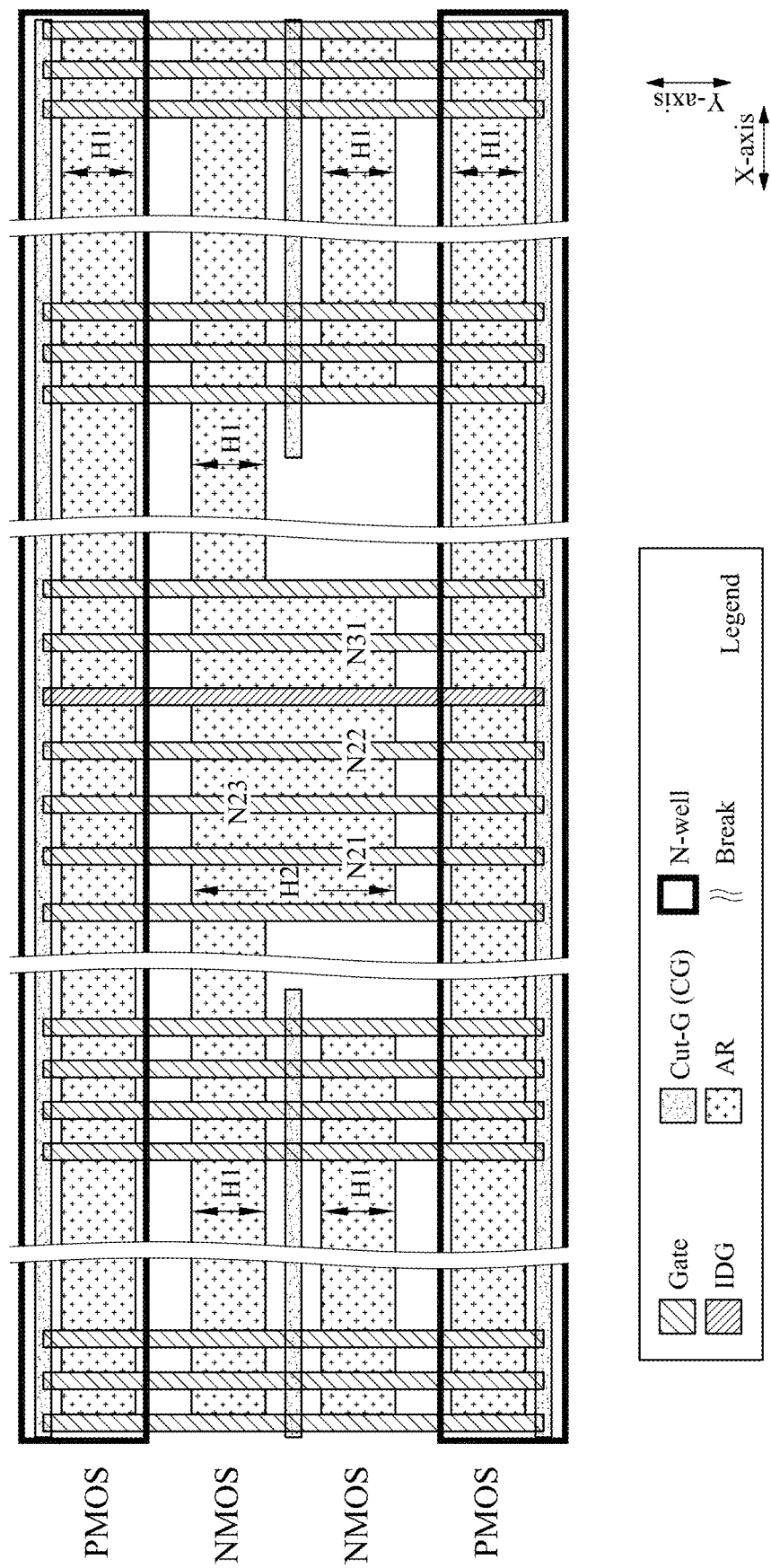
Figure 5J:
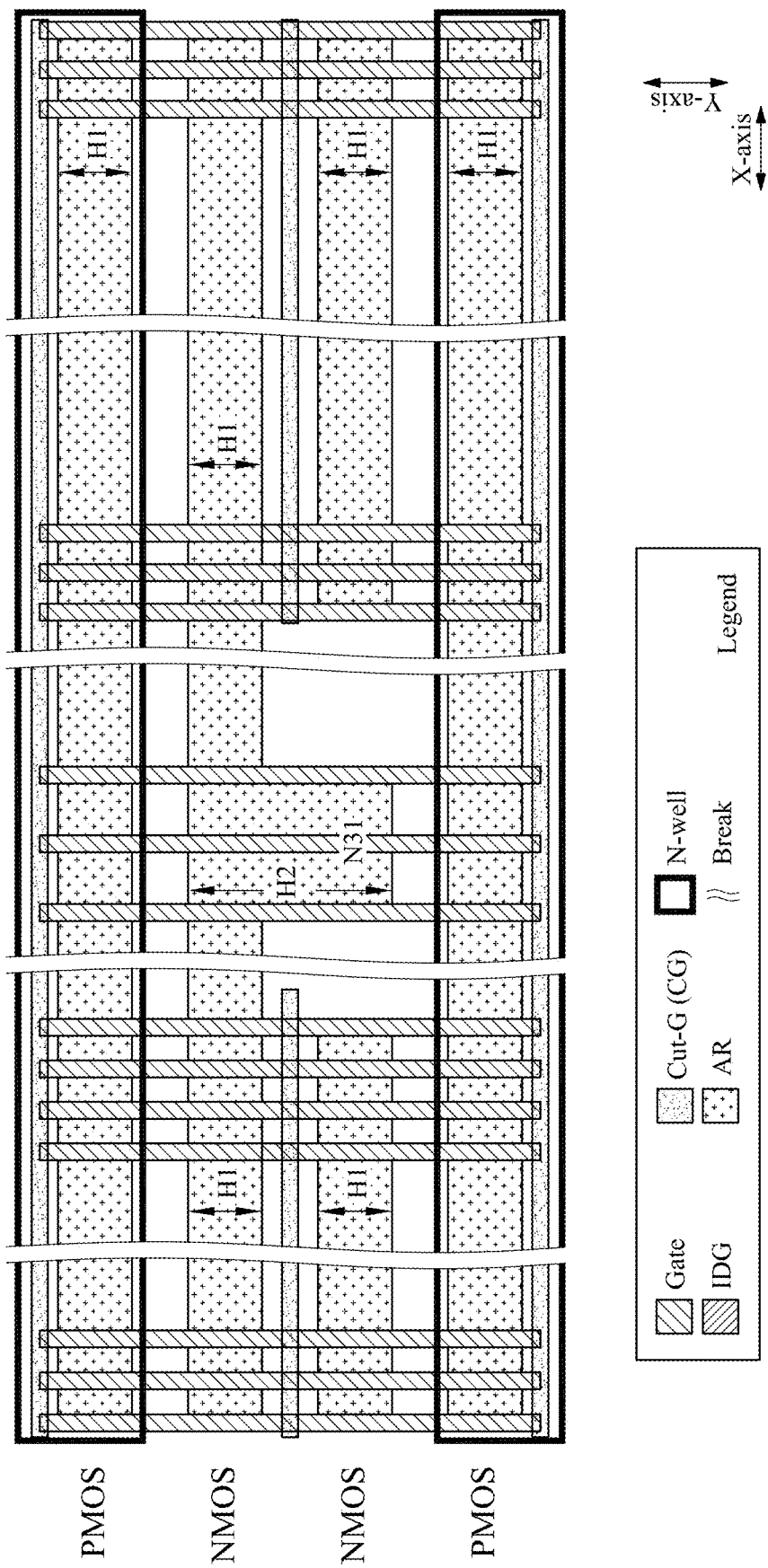
Figure 5K:
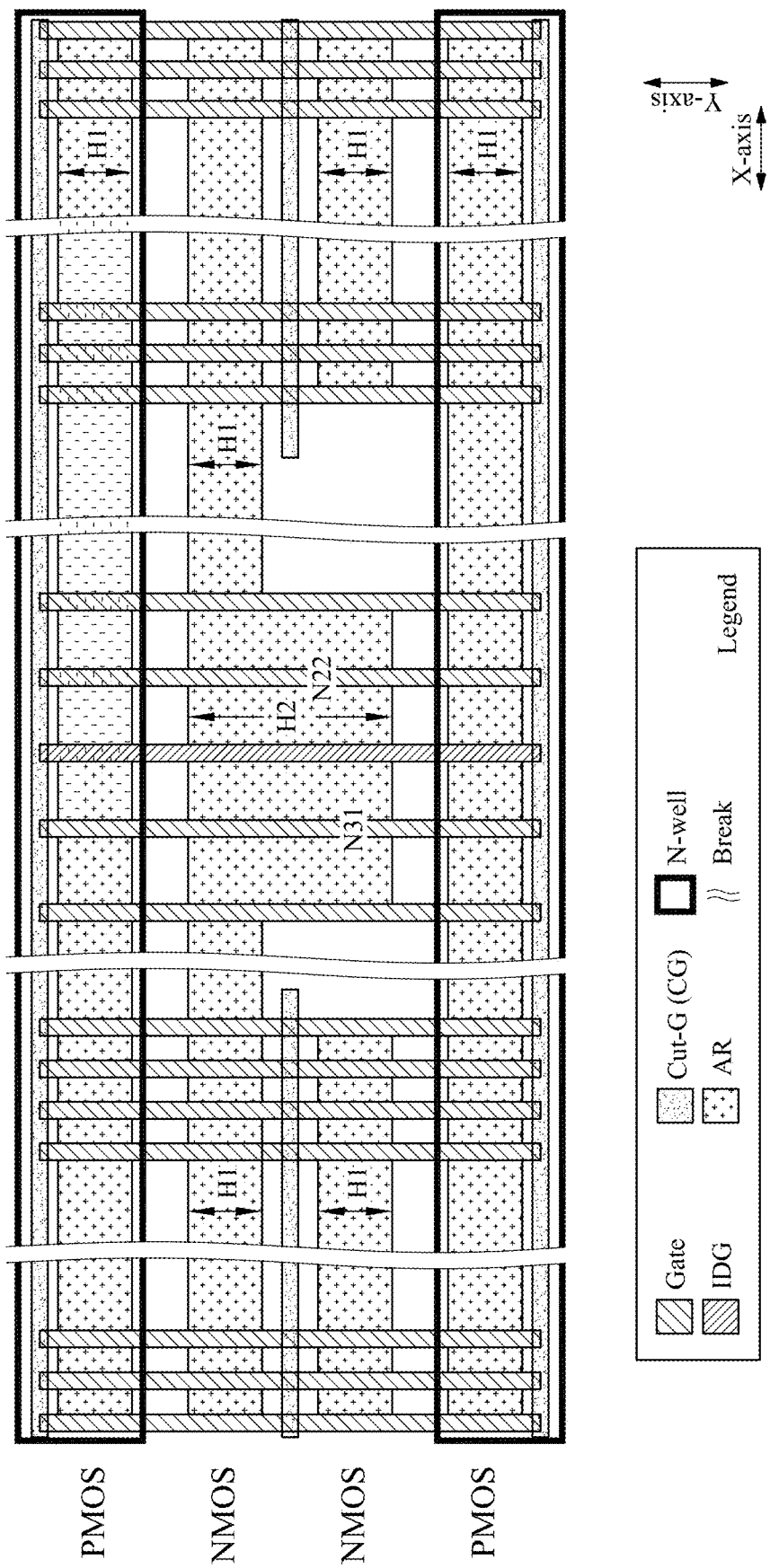
Figure 5L:
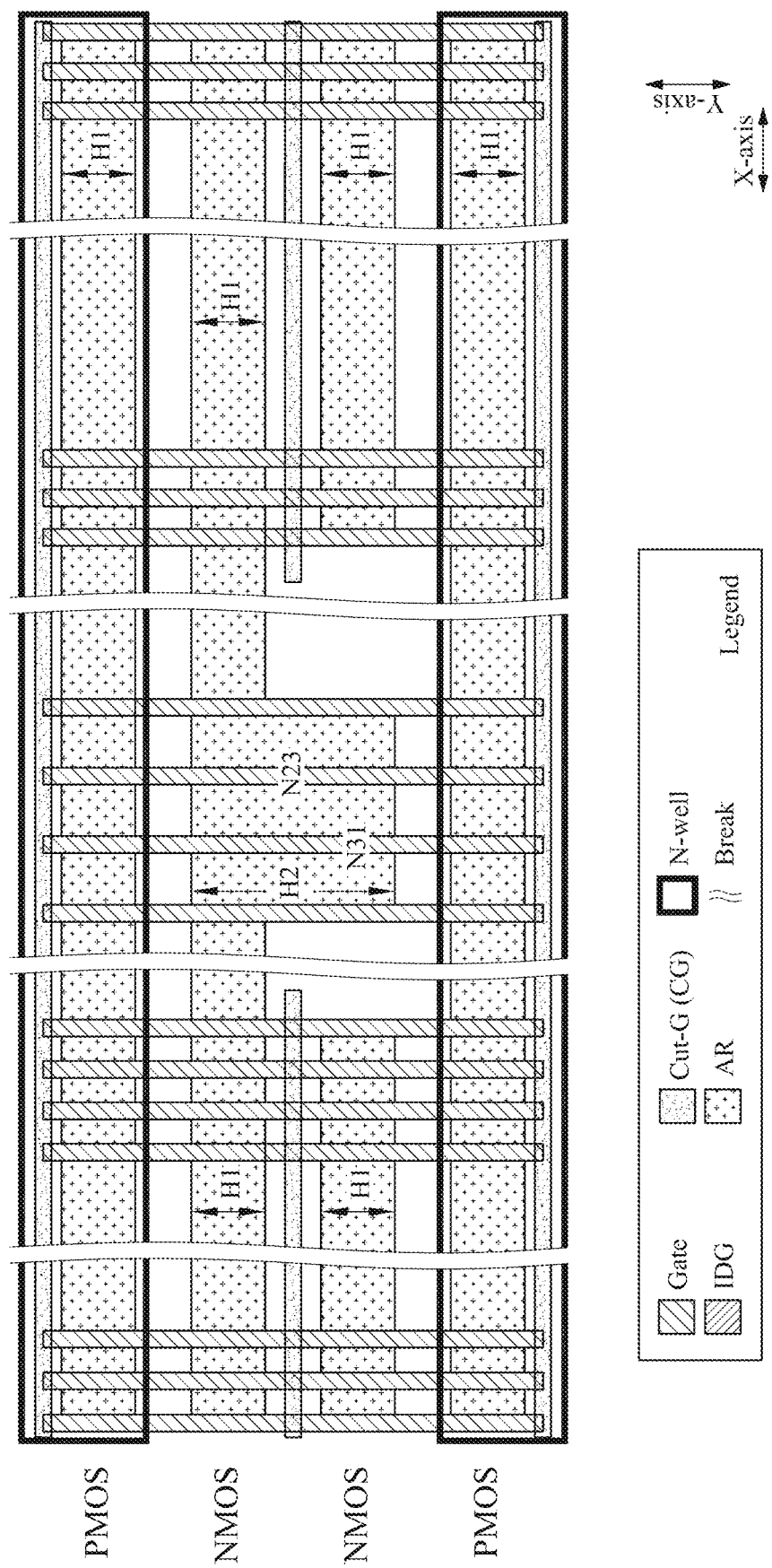
Figure 5M:
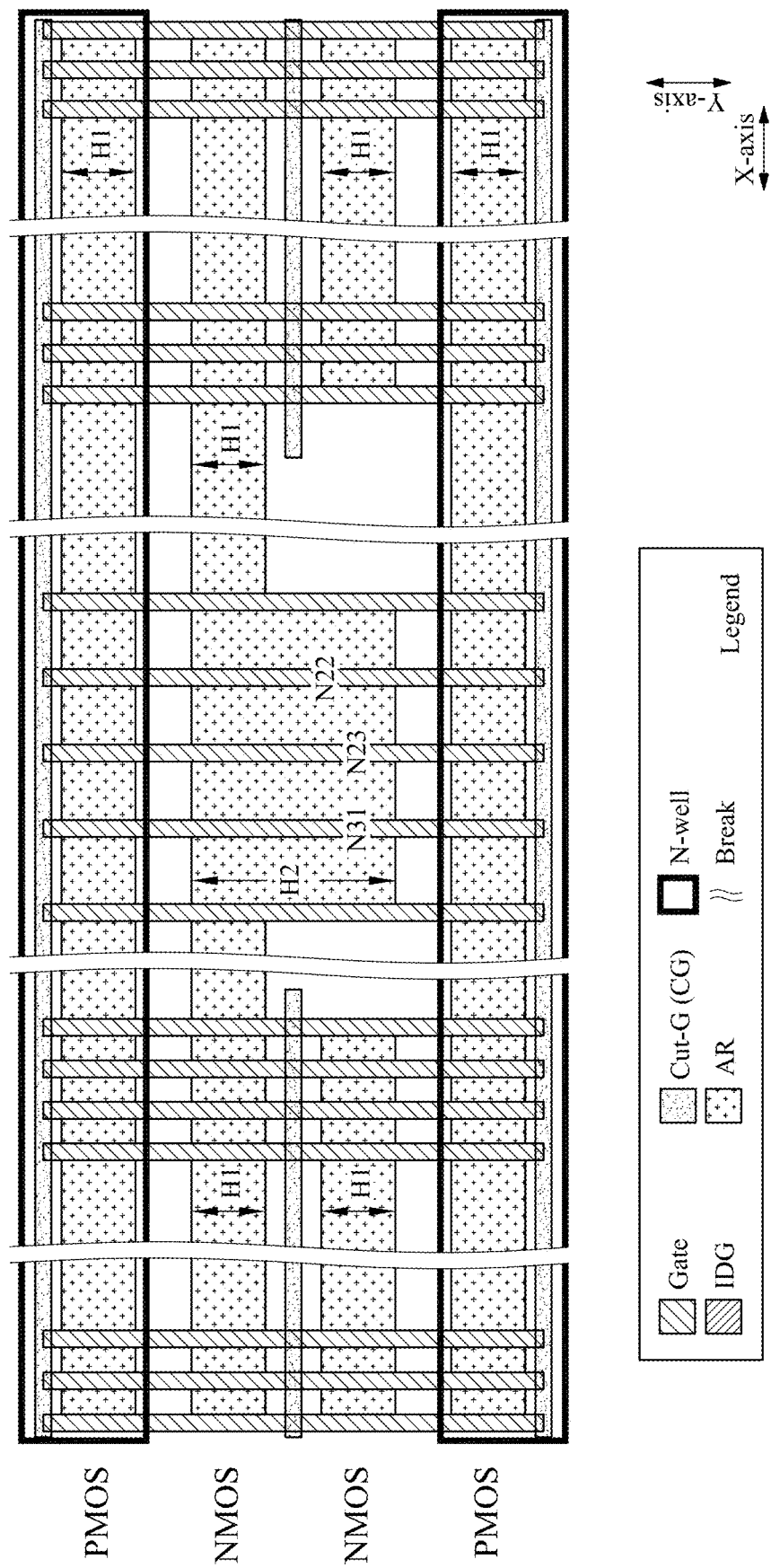
Figure 5N:
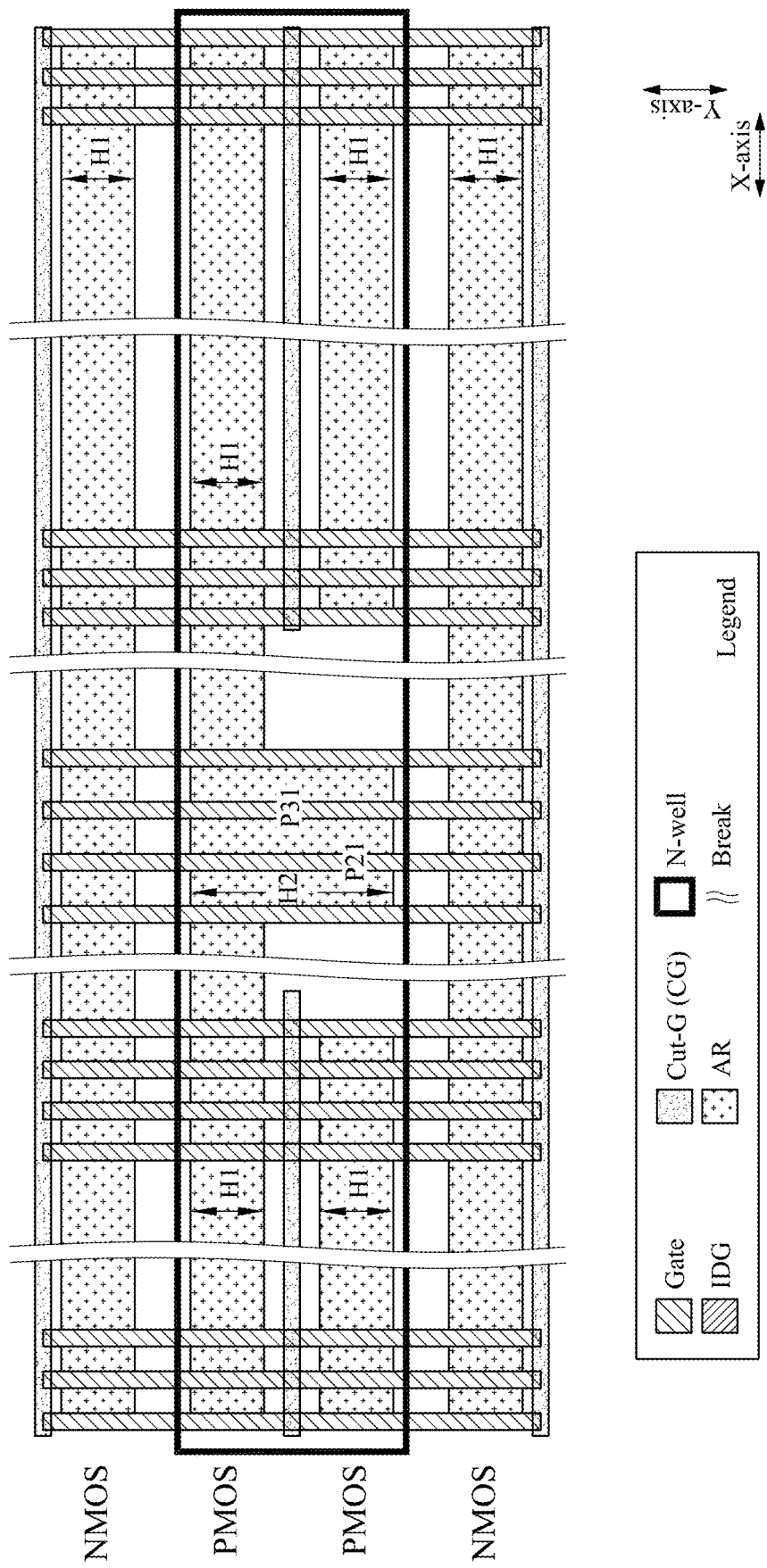
Figure 50:
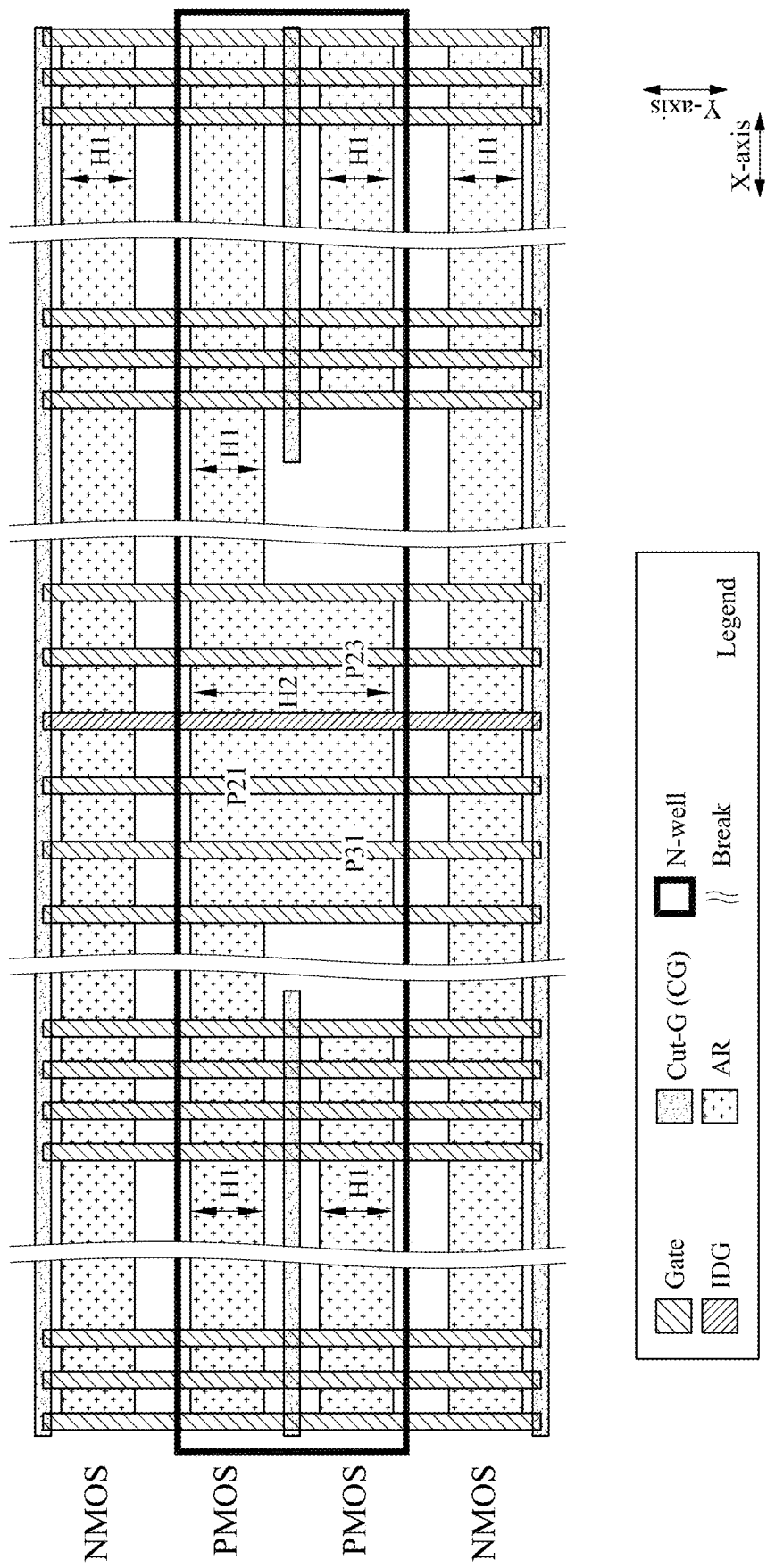
Figure 5P:
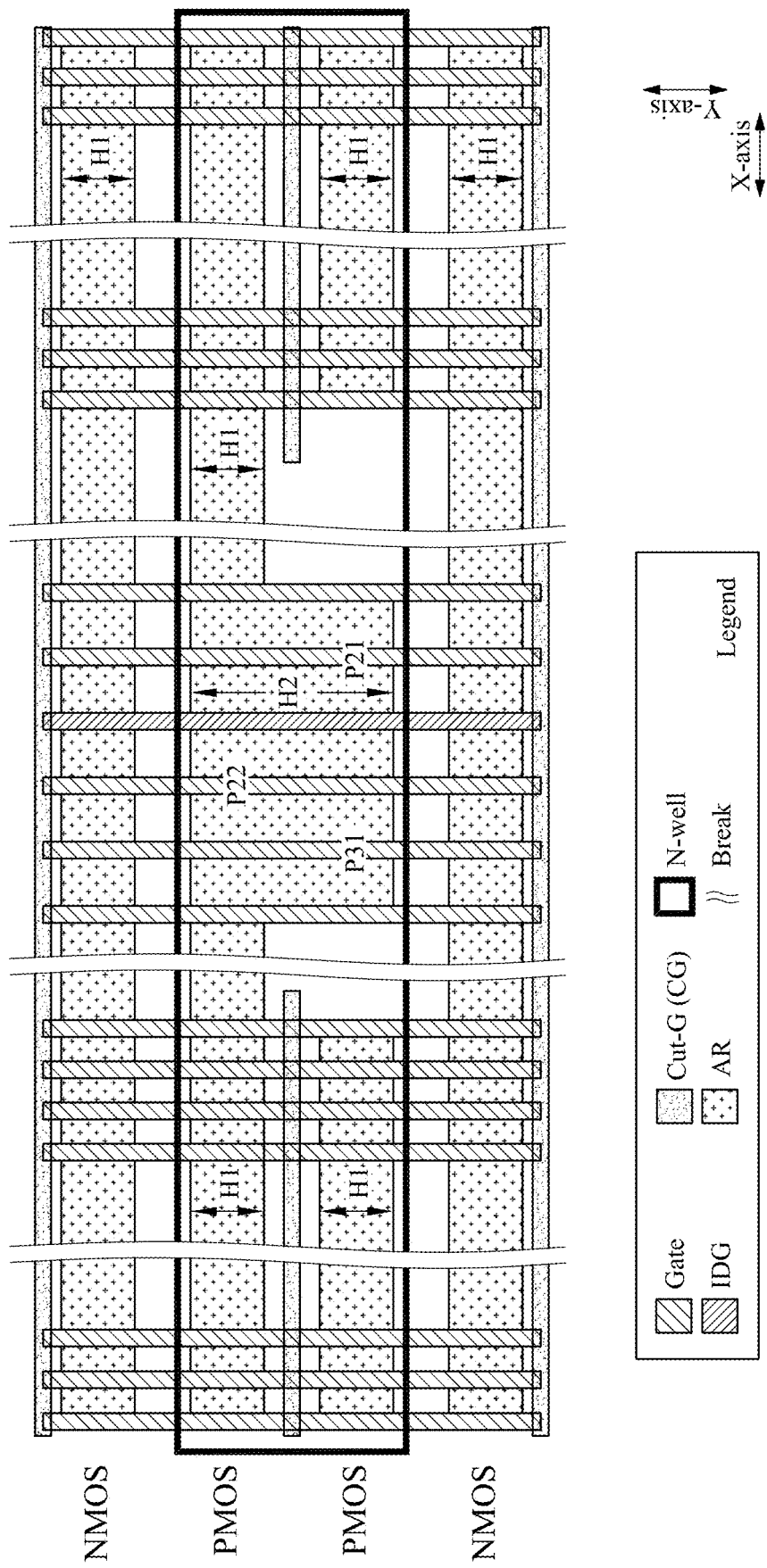
Figure 5Q:
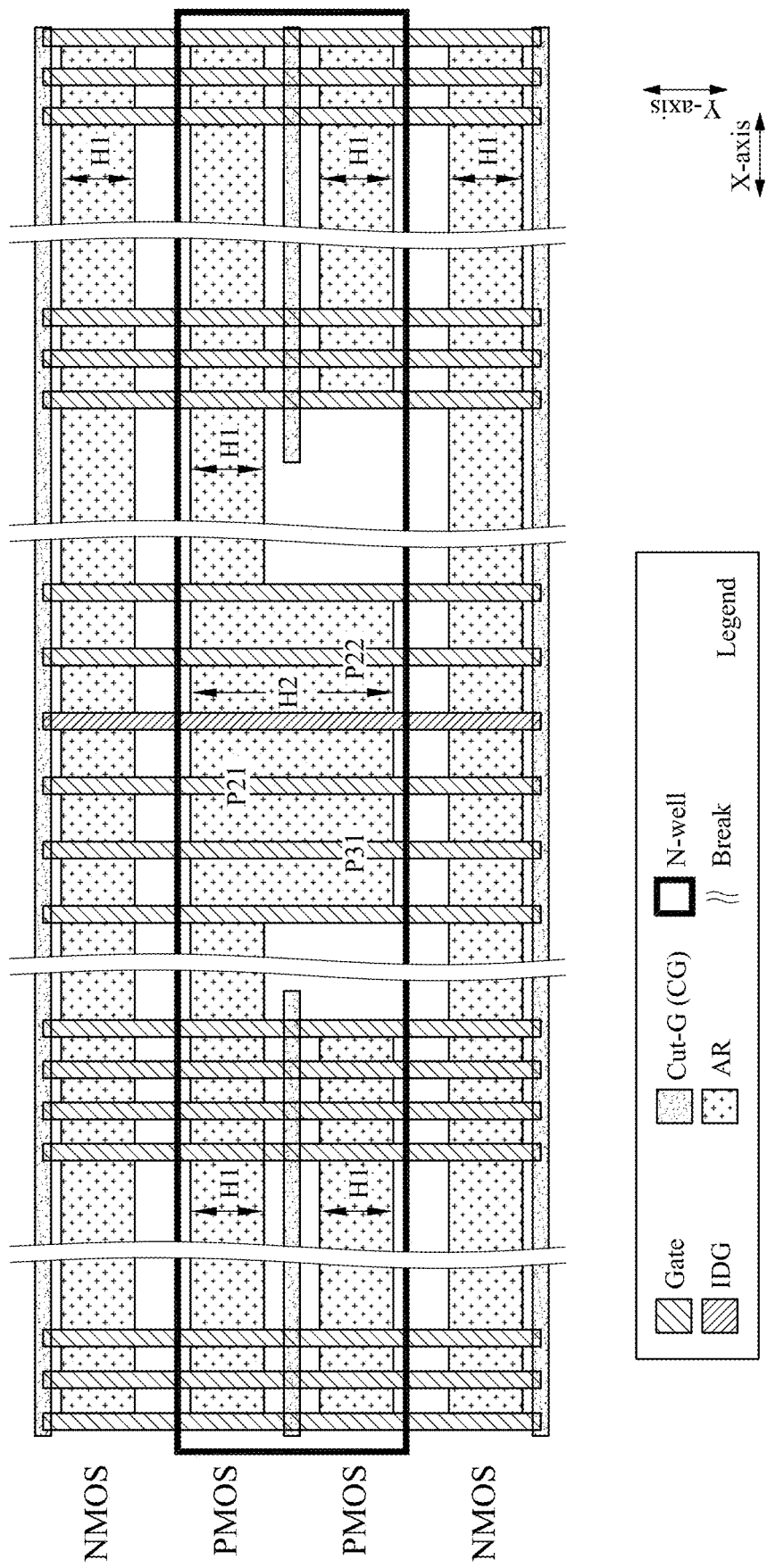
Figure 5R:
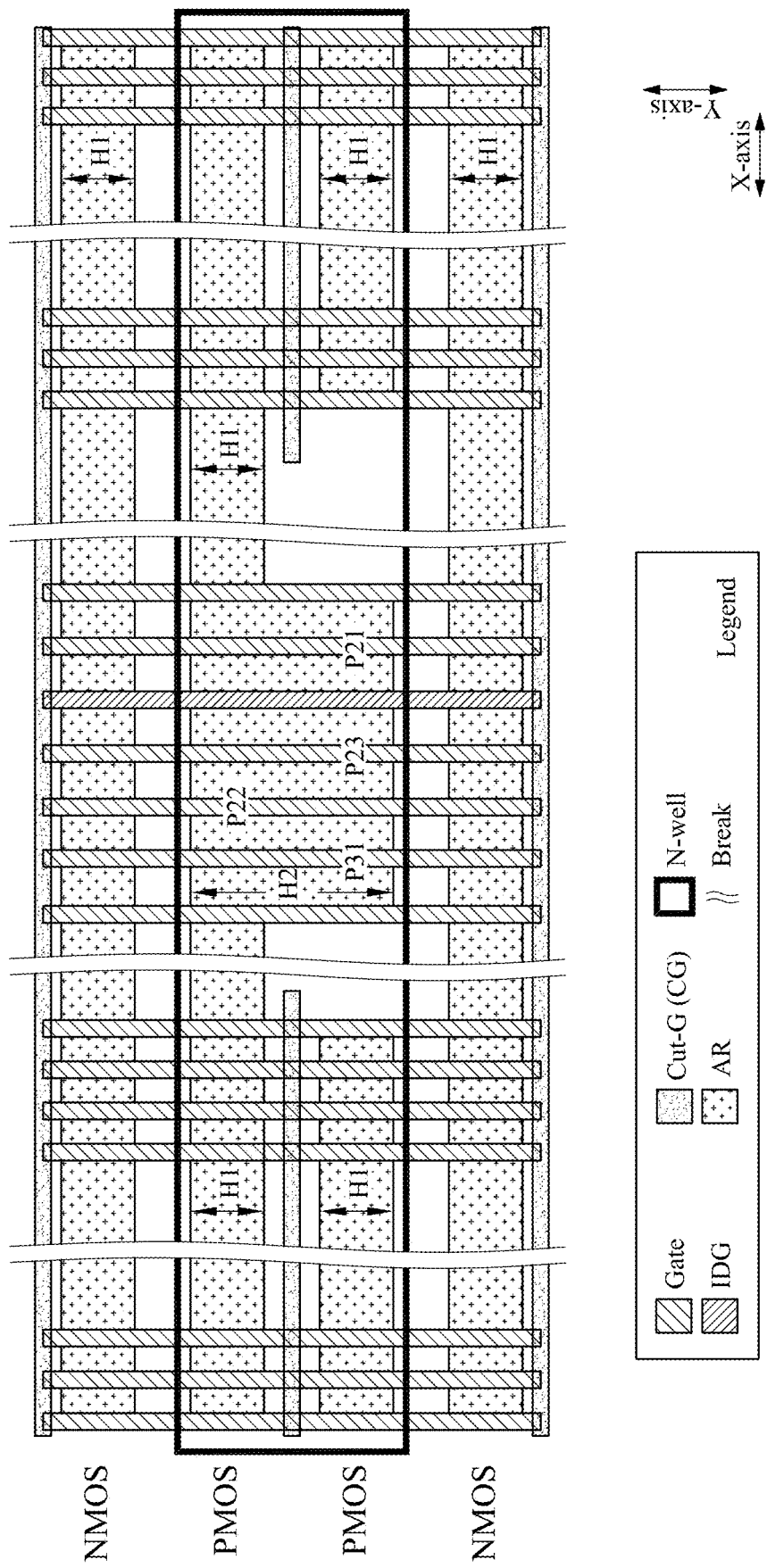
Figure 5S:
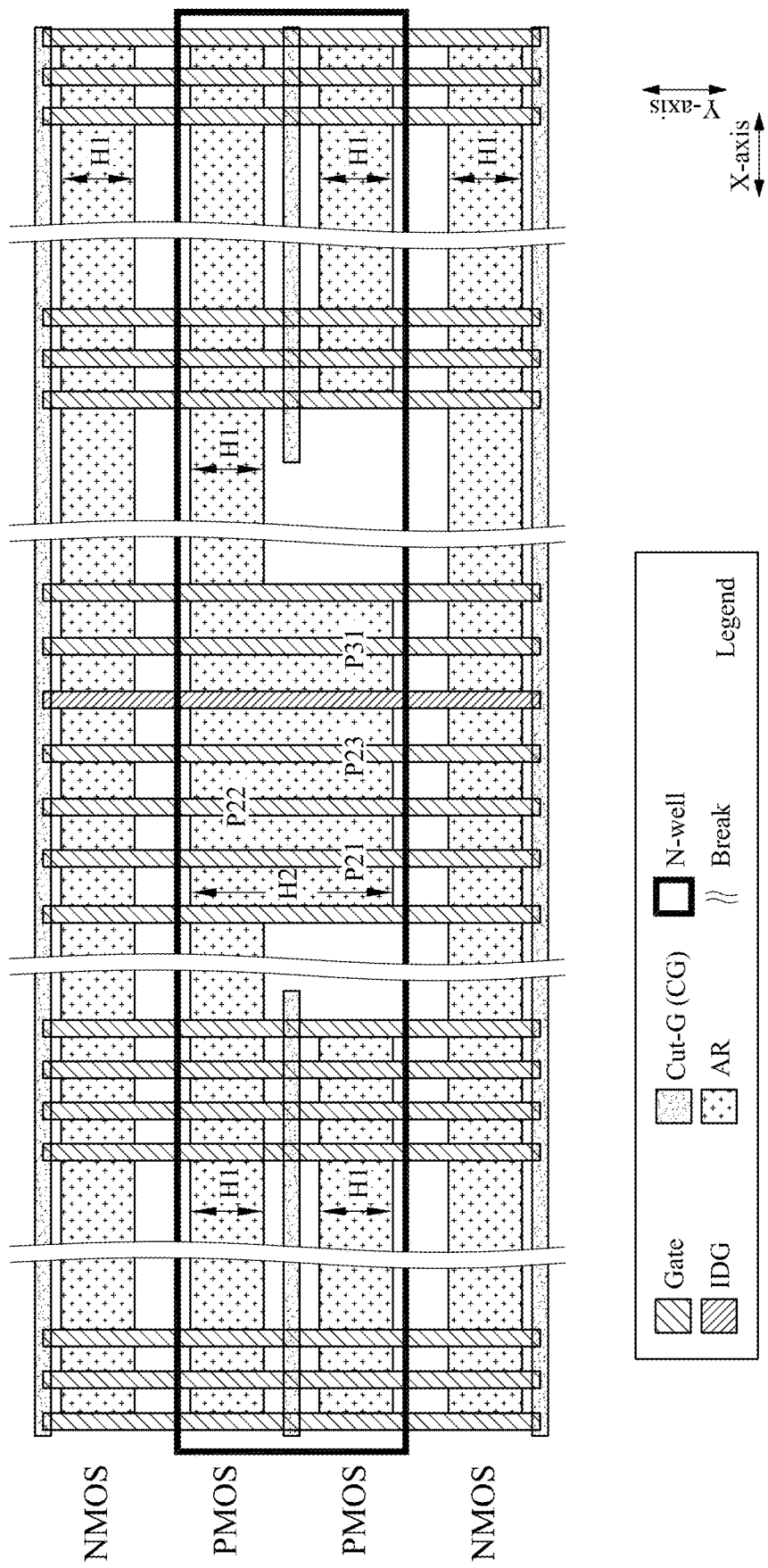
Figure 5T:
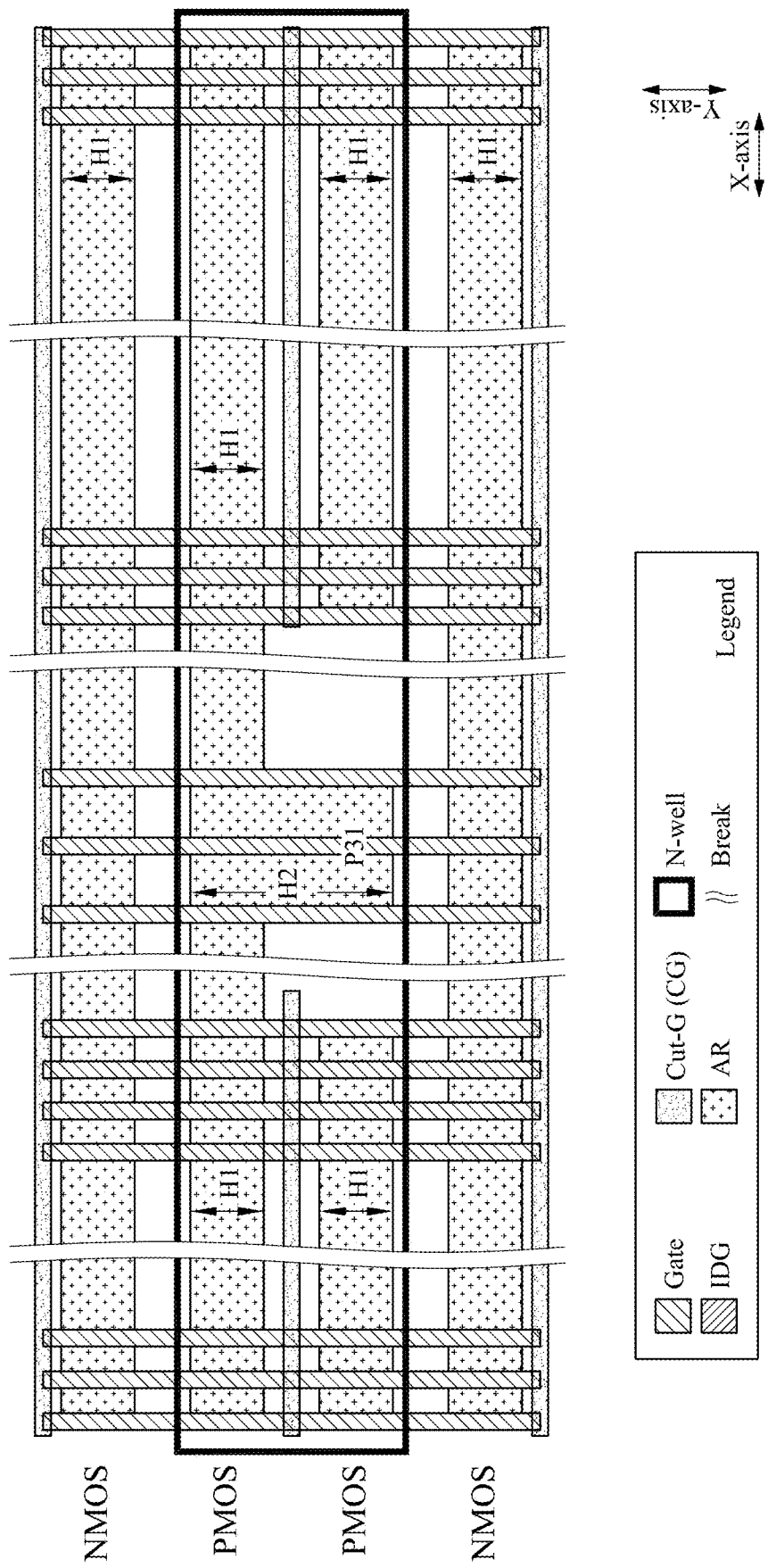
Figure 5U:
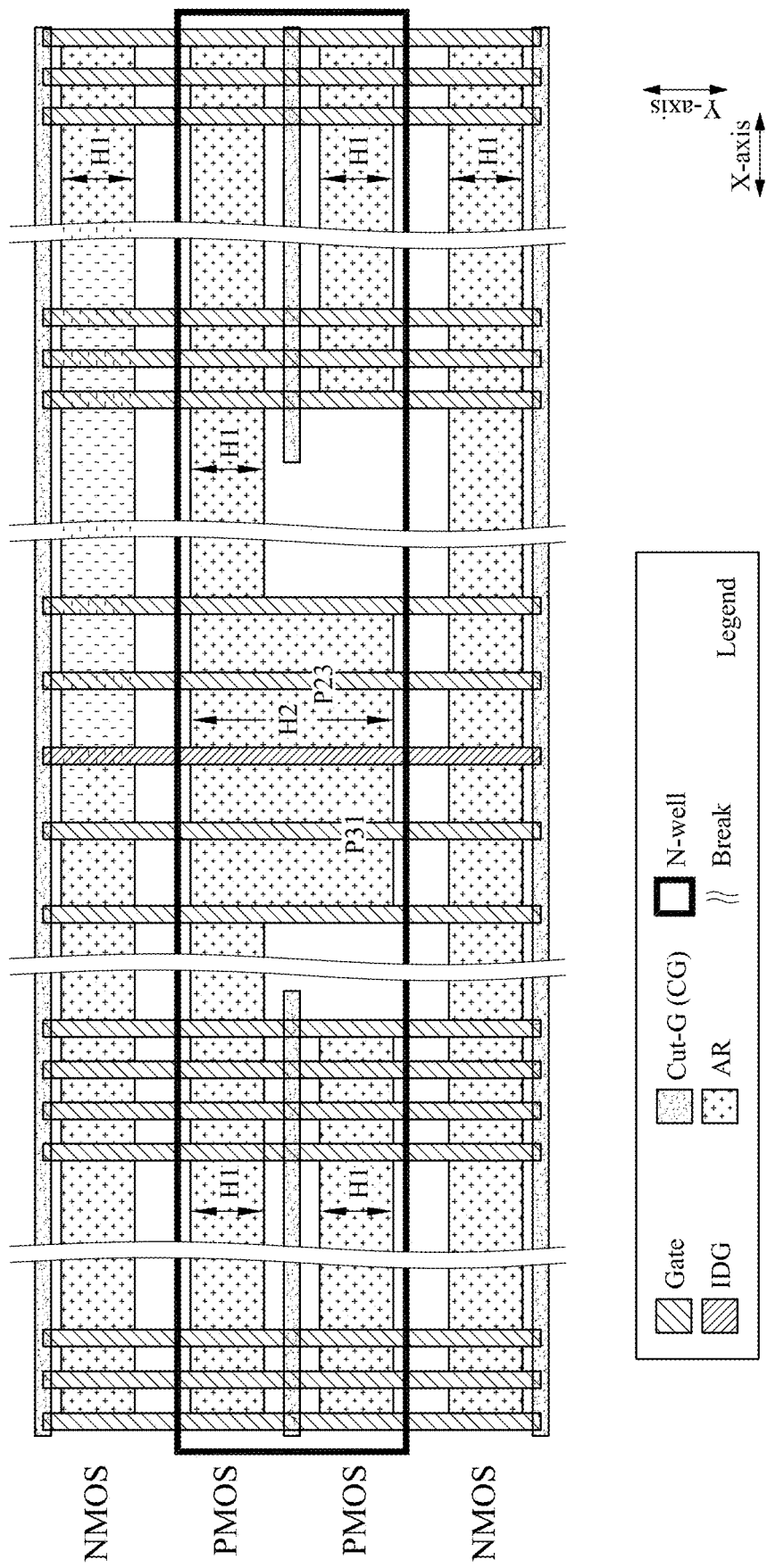
Figure 5V:
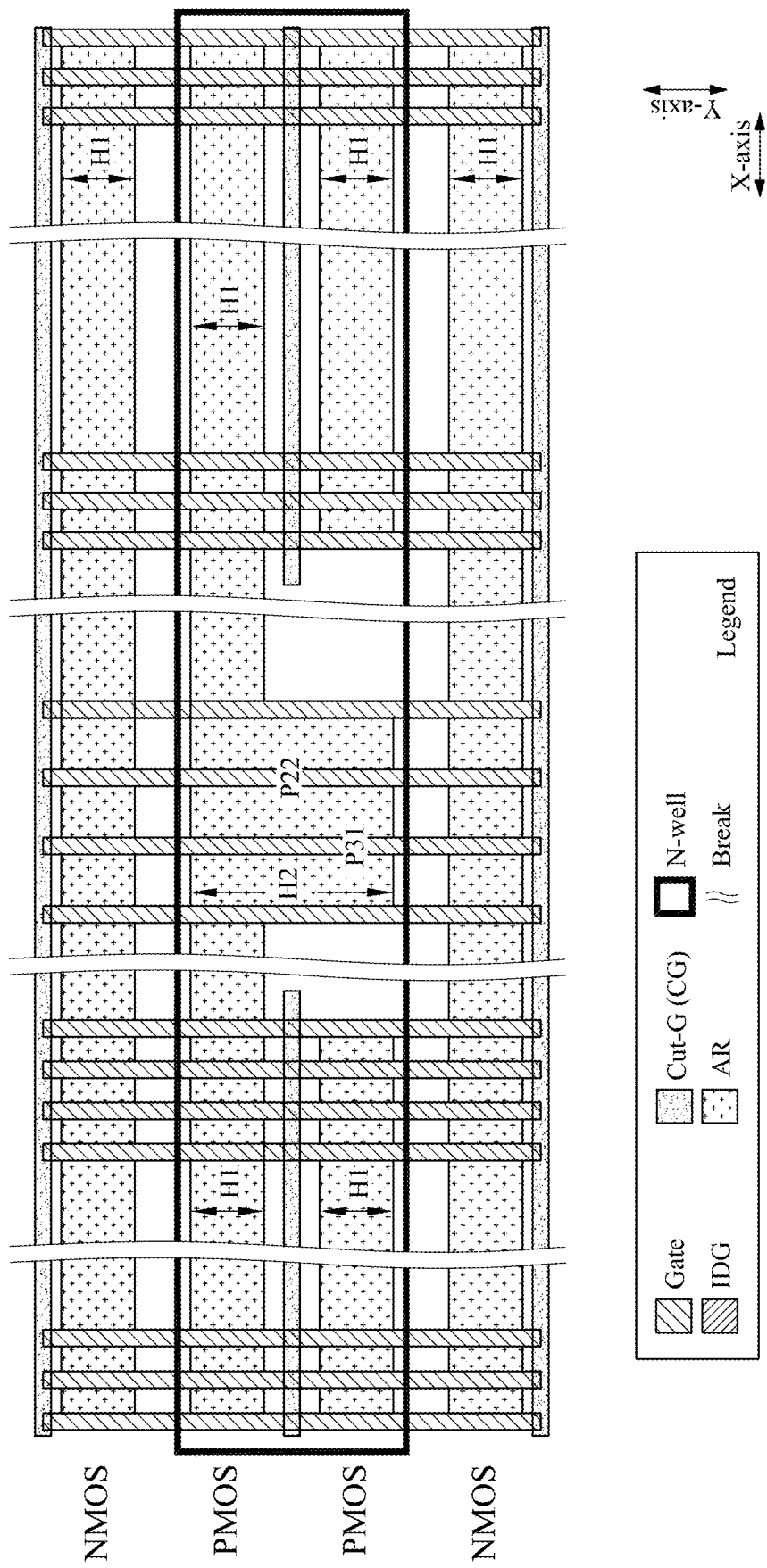
Figure 5W:
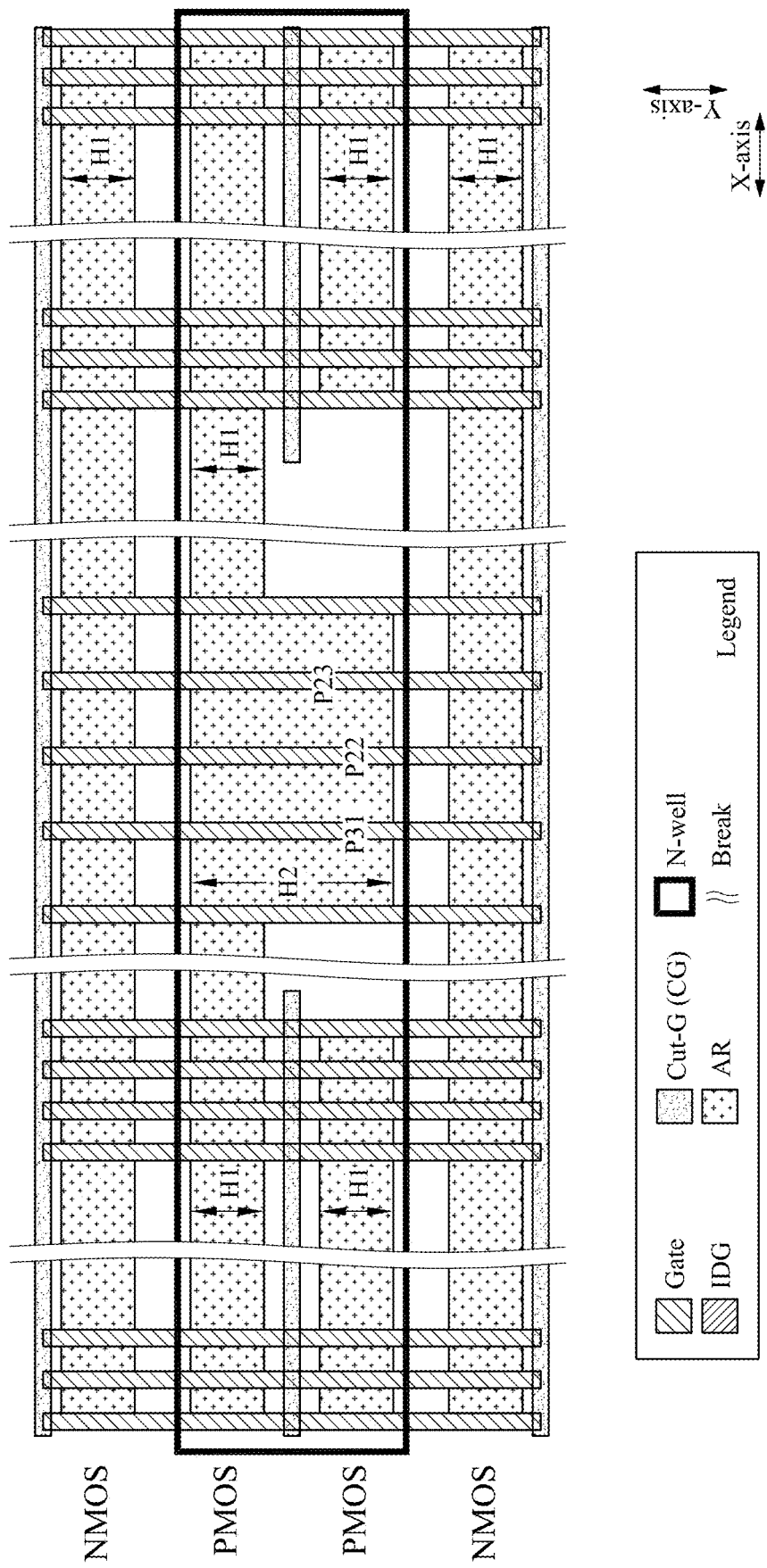

FIGS. 5D-5W are layout diagrams corresponding to the rows of the table of FIG. 5C, in accordance with some embodiments.

Regarding permutations, relative to the left-to-right arrangement of transistors N31, N22, N23 and N21 of FIGS. 5A-5B in stem 222 of T-shaped AR 206 of FIG. 2 conferred by the correspondence of the same to transistors T1, T2, T3 and T4 and IDG 210 of FIG. 2 in a rising-edge-triggered configuration of each of SDFQ 530A and SDFQ 530B, various permutations to the arrangement of transistors N31, N22, N23 and N21 in stem 222 are shown in table 560 of FIG. 5C, in accordance with some embodiments. Relative to the left-to-right arrangement of transistors P31, P23, P22 and P21 of FIGS. 5A-5B in stem 222 of T-shaped AR 206 of FIG. 2 conferred by the correspondence of the same to transistors T1, T2, T3 and T4 and IDG 210 of FIG. 2 in a falling-edge-triggered configuration of each of SDFQ 530A and SDFQ 530B, various permutations to the arrangement of transistors P31, P23, P22 and P21 in stem 222 are shown in table 560 of FIG. 5C, in accordance with some embodiments.

Regarding combinations and sub-combinations, relative to the combination of transistors N31, N22, N23 and N21 of FIGS. 5A-5B in stem 222 of T-shaped AR 206 of FIG. 2 conferred by the correspondence of the same to transistors T1, T2, T3 and T4 and IDG 210 of FIG. 2 in a rising-edge-triggered configuration of each of SDFQ 530A and SDFQ 530B, various sub-combinations of the combination transistors N31, N22, N23 and N21 in stem 222 are shown in table 560 of FIG. 5C, in accordance with some embodiments. Relative to the combination of transistors P31, P23, P22 and P21 of FIGS. 5A-5B in stem 222 of T-shaped AR 206 of FIG. 2 conferred by the correspondence of the same to transistors T1, T2, T3 and T4 and IDG 210 of FIG. 2 in a falling-edge-triggered configuration of each of SDFQ 530A and SDFQ 530B, various sub-combinations of the combination transistors P31, P23, P22 and P21 in stem 222 are shown in table 560 of FIG. 5C, in accordance with some embodiments.

In FIG. 5C, the cells of row R1 generally describe what is indicated by corresponding columns C1-C8. Rows R2-R11 show corresponding permutations and a combination or sub-combinations of transistors N31, N22, N23 and N21 in a context in which the permutations and a combination or sub-combinations are located in stem 222 of FIG. 2. Rows R12-R21 show corresponding permutations and a combination or sub-combinations of transistors P31, P23, P22 and P21 in a context in which the permutations and a combination or sub-combinations are located in stem 222 of FIG. 2.

Regarding the columns of FIG. 5C, column C1 shows the edge-triggered arrangement of the SDFQ described by the corresponding row. To indicate that the SDFQ described by the corresponding row is triggered on the rising edge, i.e., is rising-edge triggered, column C1 uses the word "rising." To indicate that the SDFQ described by the corresponding row is triggered on the falling edge, i.e., is falling-edge triggered, column C1 uses the word "falling."

In FIG. 5C, column C2 shows whether the SDFQ described by the corresponding row has a transmission-gate-based design or a stack-gate-based design. It is to be recalled that SDFQ 530A of FIG. 5A is a transmission-gate-based design such that internal buffer 541A includes transmission (Trx) gate 540. Accordingly, column C2 indicates a transmission-gate-based design by the text string "Trx Gate." Accordingly, column C2 indicates a stack-gate-based design by the text string "Stk Gate." It is to be recalled that SDFQ 530B of FIG. 5B is a stack-gate-based design such that internal buffer 541B includes sleepy inverter (Inv) 548(3), where a sleepy inverter is an example of stack-gate-based circuit.

Column C3 shows the left-to-right sequence of transistors and IDG formed in stem 222 of FIG. 2 for the SDFQ described by the corresponding row. Accordingly, column C3 shows the permutations of the transistors located in stem 222 of FIG. 2.

In FIG. 5C, columns C4-C8 shows a combination or sub-combinations of transistors and IDG formed in stem 222 of FIG. 2 for the SDFQ described by the corresponding row albeit without also showing the corresponding permutation. Column C4 shows whether the SDFQ of the corresponding row has a transistor corresponding to transistor T1, i.e., shows whether the SDFQ of the corresponding row has transistor N31 or P31. Column C5 shows whether the SDFQ of the corresponding row has a transistor corresponding to transistor T2, i.e., shows whether the SDFQ of the corresponding row has transistor N22 or P23. Column C6 shows whether the SDFQ of the corresponding row has a transistor corresponding to transistor T3, i.e., shows whether the SDFQ of the corresponding row has transistor N23 or P22. Column C7 shows whether the SDFQ of the corresponding row has a transistor corresponding to transistor T4, i.e., shows whether the SDFQ of the corresponding row has transistor N21 or P21. Column C8 shows whether the SDFQ of the corresponding row has an IDG. For example, regarding rows R6 and R7, columns C4-C8 show the same combination, namely N31, N22, N23, N21 and IDG, but rows R6 and R7 show different permutations, as discussed below.

The SDFQs corresponding to rows R2-R21 will be discussed in more detail according to the following order: R6; R16; R2-R5, R7-R15; and R17-R21.

Regarding row R6 of FIG. 5C, relative to the left-to-right arrangement of transistors T1-T4 and IDG 210 in FIG. 2, namely T1:T3:T2:IDG:T4, the SDFQ of row R6 represents the arrangement of transistors N31, N22, N23 and N21 of FIGS. 5A-5B, plus an IDG, in stem 222 of T-shaped AR 206 of FIG. 2, namely N31:N23:N22:IDG:N21, that is conferred by the correspondence of transistors N31, N22, N23 and N21 to transistors T1, T2, T3 and T4 of FIG. 2. Row R6 represents a rising-edge-triggered configuration of a transfer-gate-based SDFQ corresponding to SDFQ 530A of FIG. 5A. Row R6 corresponds to FIG. 5H.

Regarding row R16 of FIG. 5C, relative to the left-to-right arrangement of transistors T1-T4 and IDG 210 in FIG. 2, namely T1:T3:T2:IDG:T4, the SDFQ of row R16 represents the arrangement of transistors P31, P22, P23 and P21 of FIGS. 5A-5B, plus an IDG, in stem 222 of T-shaped AR 206 of FIG. 2, namely P31:P22:P23:IDG:P21, conferred by the correspondence of transistors P31, P22, P23 and P21 to transistors T1, T2, T3 and T4 of FIG. 2. Row R16 represents a falling-edge-triggered configuration of a transfer-gate-based SDFQ corresponding to SDFQ 530A of FIG. 5A. Row R16 corresponds to FIG. 5R.

Row R2 of FIG. 5C corresponds to a rising-edge-triggered, transfer-gate-based SDFQ that has transistors N31 and N21 in stem 222 of T-shaped AR 206 of FIG. 2 but lacks an IDG in stem 222. The SDFQ of row R2 includes transistors N22 and N23 albeit they are formed correspondingly in ARs 204(1), 204(2), 205(1) or 205(2). The left-to-right sequence of the transistors in stem 222 of the SDFQ of row R2 is N:21:N31. The SDFQ of row R2 corresponds to SDFQ 530A of FIG. 5A. Row R2 also corresponds to FIG. 5D.

Row R3 of FIG. 5C corresponds to a rising-edge-triggered, transfer-gate-based SDFQ that has transistors N31, N22 and N21 and an IDG in stem 222 of T-shaped AR 206 of FIG. 2. The SDFQ of row R3 includes transistor N23 albeit it is formed in one of ARs 204(1), 204(2), 205(1) or 205(2). The left-to-right sequence of the transistors in stem 222 of the SDFQ of row R3 is N31:N21:IDG:N22. The SDFQ of row R3 corresponds to SDFQ 530A of FIG. 5A. Row R3 also corresponds to FIG. 5E.

Row R4 of FIG. 5C corresponds to a rising-edge-triggered, transfer-gate-based SDFQ that has transistors N31, N23 and N21 and an IDG in stem 222 of T-shaped AR 206 of FIG. 2. The SDFQ of row R4 includes transistor N22 albeit it is formed in one of ARs 204(1), 204(2), 205(1) or 205(2). The left-to-right sequence of the transistors in stem 222 of the SDFQ of row R4 is N31:N23:IDG:N21. The SDFQ of row R4 corresponds to SDFQ 530A of FIG. 5A. Row R4 also corresponds to FIG. 5F.

Row R5 of FIG. 5C corresponds to a rising-edge-triggered, transfer-gate-based SDFQ that has transistors N31, N23 and N21 and an IDG in stem 222 of T-shaped AR 206 of FIG. 2. The SDFQ of row R5 includes transistor N22 albeit it is formed in one of ARs 204(1), 204(2), 205(1) or 205(2). The left-to-right sequence of the transistors in stem 222 of the SDFQ of row R5 is N31:N21:IDG:N23. The SDFQ of row R5 corresponds to SDFQ 530A of FIG. 5A. Row R5 also corresponds to FIG. 5G.

The SDFQ of row R5 is a permutation with respect to the SDFQ of row R4. The locations of transistors N21 and N23 in row R5 are reversed with respect to row R4. In particular, the left-to-right location-sequence of transistors N21 and N23 in row R4 is N23↔N21. In contrast, the left-to-right location-sequence of transistors N21 and N23 in row R5 is N21↔N23.

Row R6 of FIG. 5C is discussed above.

Row R7 of FIG. 5C corresponds to a rising-edge-triggered, transfer-gate-based SDFQ that has transistors N31, N22, N23 and N21 and an IDG in stem 222 of T-shaped AR 206 of FIG. 2. The left-to-right sequence of the transistors in stem 222 of the SDFQ of row R7 is N21:N23:N22:IDG:N31. The SDFQ of row R7 corresponds to SDFQ 530A of FIG. 5A. Row R7 also corresponds to FIG. 5I.

The SDFQ of row R7 is a permutation with respect to the SDFQ of row R6. The locations of transistors N21 and N31 in row R7 are reversed with respect to row R6. In particular, the left-to-right location-sequence of transistors N21 and N31 in row R6 is N31↔N21. In contrast, the left-to-right location-sequence of transistors N21 and N31 in row R7 is N21↔N31.

Row R8 of FIG. 5C corresponds to a rising-edge-triggered, stack-gate-based SDFQ that has transistor N31 in stem 222 of T-shaped AR 206 of FIG. 2 but lacks an IDG in stem 222. The SDFQ of row R8 includes transistors N22, N23 and N21 albeit they are formed correspondingly in ARs 204(1), 204(2), 205(1) or 205(2). The left-to-right sequence of the transistors in stem 222 of the SDFQ of row R8 is N31. The SDFQ of row R8 corresponds to SDFQ 530B of FIG. 5B. Row R8 also corresponds to FIG. 5J.

Row R9 of FIG. 5C corresponds to a rising-edge-triggered, stack-gate-based SDFQ that has transistors N31 and N22 and an IDG in stem 222 of T-shaped AR 206 of FIG. 2. The SDFQ of row R9 includes transistors N21 and N23 albeit they are formed correspondingly in ARs 204(1), 204(2), 205(1) or 205(2). The left-to-right sequence of the transistors in stem 222 of the SDFQ of row R9 is N31:IDG:N22. The SDFQ of row R9 corresponds to SDFQ 530B of FIG. 5B. Row R9 also corresponds to FIG. 5K.

Row R10 of FIG. 5C corresponds to a rising-edge-triggered, stack-gate-based SDFQ that has transistors N31 and N23 in stem 222 of T-shaped AR 206 of FIG. 2 but lacks an IDG in stem 222. The SDFQ of row R10 includes transistors N22 and N21 albeit they are formed correspondingly in one of ARs 204(1), 204(2), 205(1) or 205(2). The left-to-right sequence of the transistors in stem 222 of the SDFQ of row R10 is N31:N23. The SDFQ of row R10 corresponds to SDFQ 530B of FIG. 5B. Row R10 also corresponds to FIG. 5L.

Row R11 of FIG. 5C corresponds to a rising-edge-triggered, stack-gate-based SDFQ that has transistors N31, N22 and N23 in stem 222 of T-shaped AR 206 of FIG. 2 but lacks an IDG in stem 222. The SDFQ of row R11 includes transistor N21 albeit it is formed in one of ARs 204(1), 204(2), 205(1) or 205(2). The left-to-right sequence of the transistors in stem 222 of the SDFQ of row R11 is N31:N23:N22. The SDFQ of row R11 corresponds to SDFQ 530B of FIG. 5B. Row R11 also corresponds to FIG. 5M.

Row R12 of FIG. 5C corresponds to a falling-edge-triggered, transfer-gate-based SDFQ that has transistors P31 and P21 in stem 222 of T-shaped AR 206 of FIG. 2 but lacks an IDG in stem 222. The SDFQ of row R12 includes transistors P23 and P22 albeit they are formed correspondingly in ARs 204(1), 204(2), 205(1) or 205(2). The left-to-right sequence of the transistors in stem 222 of the SDFQ of row R12 is P21:P31. The SDFQ of row R12 corresponds to SDFQ 530A of FIG. 5A. Row R12 also corresponds to FIG. 5N.

Row R13 of FIG. 5C corresponds to a falling-edge-triggered, transfer-gate-based SDFQ that has transistors P31, P23 and P21 and an IDG in stem 222 of T-shaped AR 206 of FIG. 2. The SDFQ of row R13 includes transistor P22 albeit it is formed in one of ARs 204(1), 204(2), 205(1) or 205(2). The left-to-right sequence of the transistors in stem 222 of the SDFQ of row R13 is P31:P21:IDG:P23. The SDFQ of row R13 corresponds to SDFQ 530A of FIG. 5A. Row R13 also corresponds to FIG. 5O.

Row R14 of FIG. 5C corresponds to a falling-edge-triggered, transfer-gate-based SDFQ that has transistors P31, P22 and P21 and an IDG in stem 222 of T-shaped AR 206 of FIG. 2. The SDFQ of row R14 includes transistor P23 albeit it is formed in one of ARs 204(1), 204(2), 205(1) or 205(2). The left-to-right sequence of the transistors in stem 222 of the SDFQ of row R14 is P31:P22:IDG:P21. The SDFQ of row R14 corresponds to SDFQ 530A of FIG. 5A. Row R14 also corresponds to FIG. 5P.

Row R15 of FIG. 5C corresponds to a falling-edge-triggered, transfer-gate-based SDFQ that has transistors P31, P22 and P21 and an IDG in stem 222 of T-shaped AR 206 of FIG. 2. The SDFQ of row R15 includes transistor P23 albeit it is formed in one of ARs 204(1), 204(2), 205(1) or 205(2). The left-to-right sequence of the transistors in stem 222 of the SDFQ of row R15 is P31:P21:IDG:P22. The SDFQ of row R15 corresponds to SDFQ 530A of FIG. 5A. Row R15 also corresponds to FIG. 5Q.

The SDFQ of row R15 is a permutation with respect to the SDFQ of row R14. The locations of transistors P21 and P22 in row R15 are reversed with respect to row R14. In particular, the left-to-right location-sequence of transistors P21 and P22 in row R14 is P22 ↔P21. In contrast, the left-to-right location-sequence of transistors P21 and P22 in row R15 is P21 ↔P22.

Row R16 of FIG. 5C is discussed above.

Row R17 of FIG. 5C corresponds to a falling-edge-triggered, transfer-gate-based SDFQ that has transistors P31, P23, P22 and P21 and an IDG in stem 222 of T-shaped AR 206 of FIG. 2. The left-to-right sequence of the transistors in stem 222 of the SDFQ of row R17 is P21:P22:P23:IDG:P31. The SDFQ of row R17 corresponds to SDFQ 530A of FIG. 5A. Row R17 also corresponds to FIG. 5S.

The SDFQ of row R17 is a permutation with respect to the SDFQ of row R16. The locations of transistors P21 and P31 in row R17 are reversed with respect to row R16. In particular, the left-to-right location-sequence of transistors P21 and P31 in row R16 is P31 ↔P21. In contrast, the left-to-right location-sequence of transistors P21 and P31 in row R17 is P21 ↔P31.

Row R18 of FIG. 5C corresponds to a falling-edge-triggered, stack-gate-based SDFQ that has transistor P31 in stem 222 of T-shaped AR 206 of FIG. 2 but lacks an IDG in stem 222. The SDFQ of row R18 includes transistors P23, P22 and P21 albeit they are formed correspondingly in ARs 204(1), 204(2), 205(1) or 205(2). The left-to-right sequence of the transistors in stem 222 of the SDFQ of row R18 is P31. The SDFQ of row R18 corresponds to SDFQ 530B of FIG. 5B. Row R18 also corresponds to FIG. 5T.

Row R19 of FIG. 5C corresponds to a falling-edge-triggered, stack-gate-based SDFQ that has transistors P31 and P23 and an IDG in stem 222 of T-shaped AR 206 of FIG. 2. The SDFQ of row R19 includes transistors P21 and P22 albeit they are formed correspondingly in ARs 204(1), 204(2), 205(1) or 205(2). The left-to-right sequence of the transistors in stem 222 of the SDFQ of row R19 is P31: IDG:P23. The SDFQ of row R19 corresponds to SDFQ 530B of FIG. 5B. Row R19 also corresponds to FIG. 5U.

Row R20 of FIG. 5C corresponds to a falling-edge-triggered, stack-gate-based SDFQ that has transistors P31 and P22 in stem 222 of T-shaped AR 206 of FIG. 2 but lacks an IDG in stem 222. The SDFQ of row R20 includes transistors P23 and P21 albeit they are formed correspondingly in one of ARs 204(1), 204(2), 205(1) or 205(2). The left-to-right sequence of the transistors in stem 222 of the SDFQ of row R20 is P31:P22. The SDFQ of row R20 corresponds to SDFQ 530B of FIG. 5B. Row R20 also corresponds to FIG. 5V.

Row R21 of FIG. 5C corresponds to a falling-edge-triggered, stack-gate-based SDFQ that has transistors P31, P23 and P22 in stem 222 of T-shaped AR 206 of FIG. 2 but lacks an IDG in stem 222. The SDFQ of row R21 includes transistor P21 albeit it is formed in one of ARs 204(1), 204(2), 205(1) or 205(2). The left-to-right sequence of the transistors in stem 222 of the SDFQ of row R21 is P31: P22:P23. The SDFQ of row R21 corresponds to SDFQ 530B of FIG. 5B. Row R21 also corresponds to FIG. 5W.

Figure 6A:
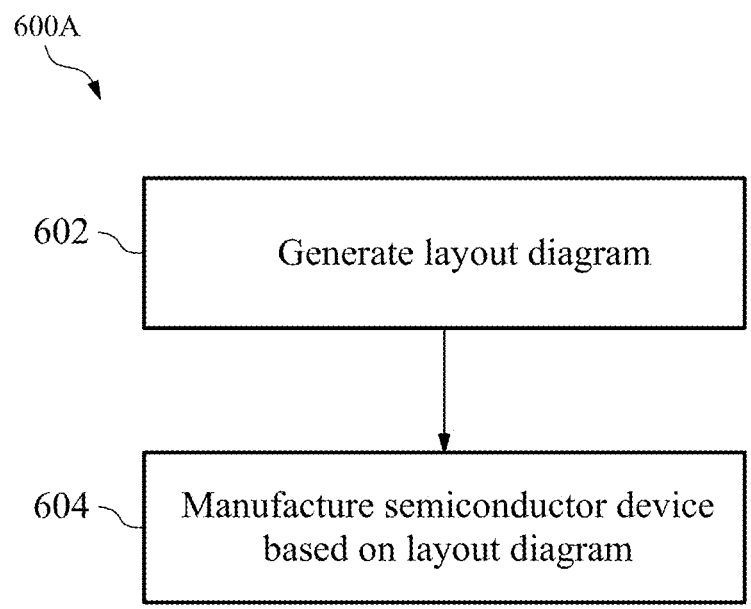

FIG. 6A is a flow diagram 600A of a method of manufacturing a semiconductor device, in accordance with some embodiments.

The method of flowchart 600A is implementable, for example, using EDA system 700 (FIG. 7, discussed below) and an IC manufacturing system 800 (FIG. 8, discussed below), in accordance with some embodiments. Examples of a semiconductor device which can be manufactured according to the method of flowchart 600A include the semiconductor devices of FIGS. 1, 3A-3B and 4A-4B, semiconductor devices based on the layout diagram of FIG. 2, semiconductor devices including SDFQ 530A of FIG. 5A, SDFQ 530B, the SDFQs of FIG. 5C, or the like.

In FIG. 6A, the method of flowchart 600A includes blocks 602-604. At block 602, a layout diagram is generated which, among other things, includes one or more of layout diagrams disclosed herein, or the like. Block 602 is implementable, for example, using EDA system 700 (FIG. 7, discussed below), in accordance with some embodiments. From block 602, flow proceeds to block 604.

At block 604, based on the layout diagram, at least one of (A) one or more photolithographic exposures are made or (b) one or more semiconductor masks are fabricated or (C) one or more components in a layer of a semiconductor device are fabricated. See discussion below of IC manufacturing system 800 in FIG. 8 below.

Figure 6B:
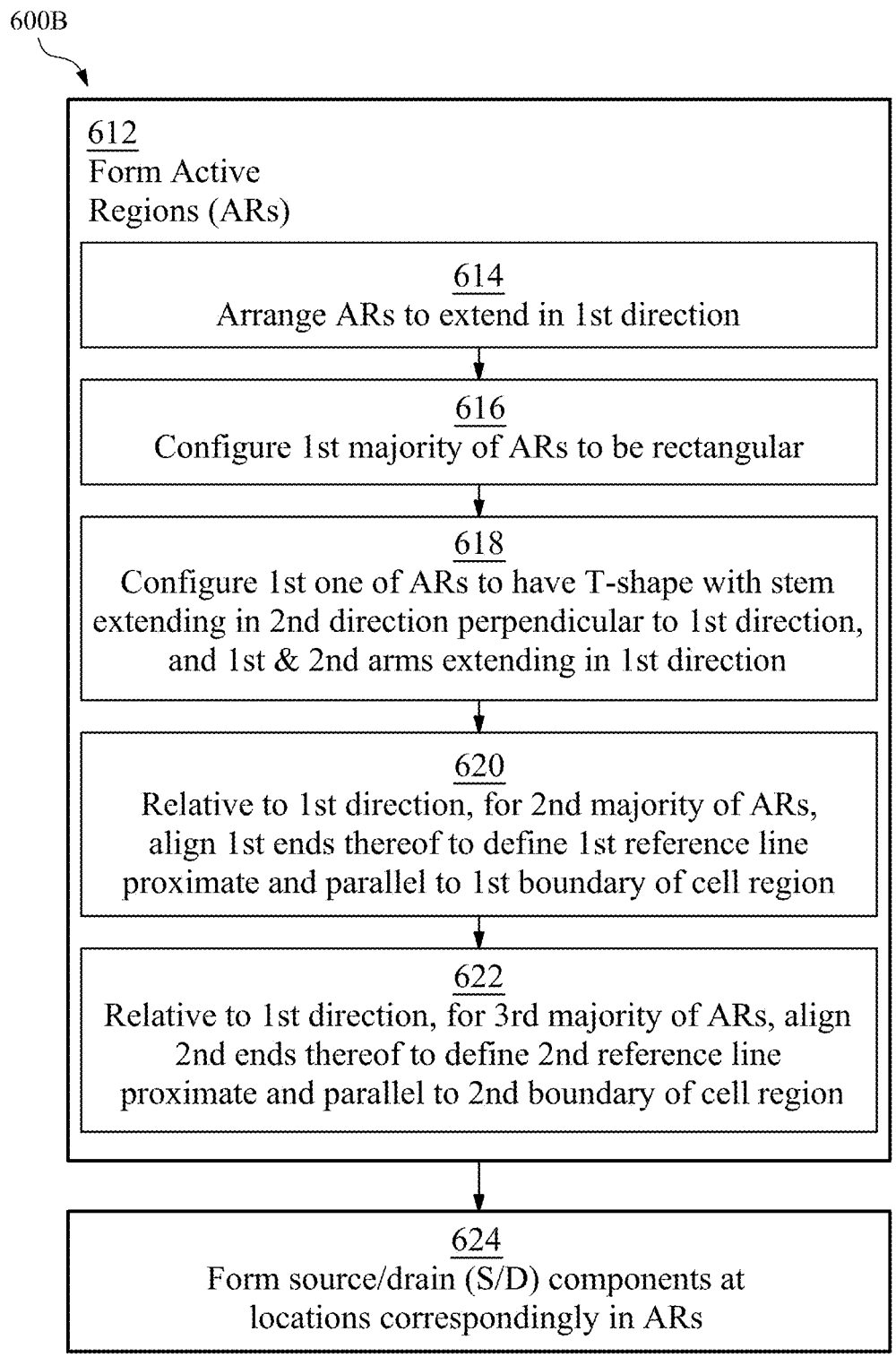

FIG. 6B is a method 600B of forming a semiconductor device, in accordance with some embodiments.

Method 600B includes blocks 612-624. At block 612, active regions representing a cell region are formed. Examples of active regions (ARs) representing a cell region include ARs 204(1), 204(2), 205(1), 205(2) and 206 in FIG. 2, or the like. Block 612 includes blocks 614-622. Within block 612, flow proceeds to block 614.

At block 614, the ARs are arranged to extend in a first direction. An example of the first direction is the X-axis in FIG. 2. From block 614, flow proceeds to block 616.

At block 616, a first majority of the ARs are configured to be rectangular. An example of the first majority of ARs is in FIG. 2 wherein ARs 204(1), 204(2), 205(1) and 205(2) are (A) rectangular and (B) represent a majority of the ARs in FIG. 2, or the like. From block 616, flow proceeds to block 618.

At block 618, a first one of the ARs is configured to have a T-shape with a stem and first and second arms, the stem of first AR extending in a second direction perpendicular to the first direction, and the first and second arms of the first AR extending in the first direction from a same end of the stem. An example of the second direction is the Y-axis in FIG. 2. An example of a T-shaped AR is T-shaped AR 206 in FIG. 2, or the like. From block 618, flow proceeds to block 620.

At block 620, relative to the first direction, for a second majority of the ARs, first ends thereof are aligned to define a first reference line proximate and parallel to a first boundary of the cell region. An example of the second majority of ARs is in FIG. 2, wherein ARs 204(1), 204(2), 205(1) and 205(2) and left arm 224(L) of AR 206 (A) have aligned first ends which define a first reference line 216(1) that is proximate and parallel to a left boundary of cell 202 and (B) represent a majority of the ARs in FIG. 2, or the like. From block 620, flow proceeds to block 622.

At block 622, relative to the first direction, for a third majority of the active regions, aligning second ends thereof to define a second reference line proximate and parallel to a second boundary of the cell region. An example of the third majority of ARs in in FIG. 2 wherein ARs 204(1), 204(2), 205(1) and 205(2) and right arm 224(R) of AR 206 (A) have aligned second ends which define a second reference 216(2) line that is proximate and parallel to a right boundary of cell 202 and (B) represent a majority of the ARs in FIG. 2, or the like. From block 622, flow exits block 612 and proceeds to block 624.

At block 624, source/drain (S/D) components are formed at locations correspondingly in the ARs. Examples of such S/D component include a portion of ARs 204(1), 204(2), 205(1), 205(2) or 206 that is between corresponding instances of gate 209 a portion of ARs 204(1), 204(2), 205(1), 205(2) or a portion of 206 that is adjacent to a corresponding instance of gate 209 and which has been doped with an appropriate conductivity-type dopant, or the like.

Regarding FIG. 6B, in some embodiments, block 612 further includes, arranging, relative to the second direction, at least two amongst the first majority of the active regions to overlap the stem of the first active region. An example of ARs in the first majority which overlap as such are ARs 205(1) and 205(2), which overlap stem 222 of T-shaped AR 206 relative to the Y-axis.

Regarding FIG. 6B, in some embodiments, method 600B further includes, relative to the S/D components correspondingly in the active regions representing components of corresponding transistors, forming remaining components of the transistors, each of the transistors including a channel region in the active region correspondingly between pair of corresponding ones of the S/D components. For more details, see the discussion of block 668 of FIG. 6D.

Figure 6C:
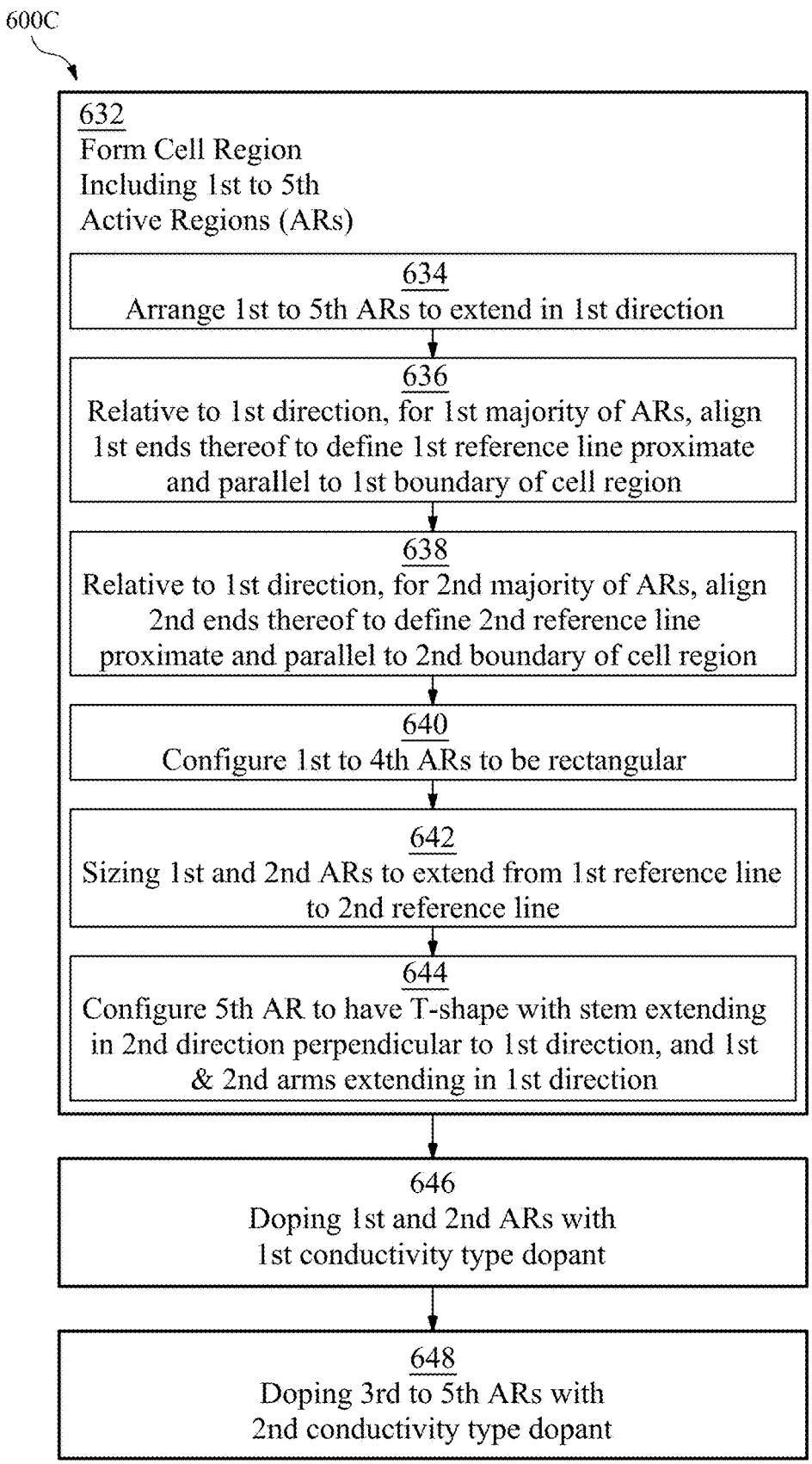

FIG. 6C is a method 600C of forming a semiconductor device, in accordance with some embodiments.

Method 600C includes blocks 632-648. At block 632, a first cell region is formed including first to fifth ARs. Examples of the first to fifth ARs include corresponding ARs 204(1), 204(2), 205(1), 205(2) and 206 of FIG. 2, or the like. Block 632 includes blocks 634-644. Within block 632, flow proceeds to block 634.

At block 634, the first to fifth ARs are arranged to extend in a first direction and be spaced apart relative to a second direction perpendicular to the first direction. Examples of the first and second directions correspondingly are the X-axis and the Y-axis in FIG. 2, or the like. From block 634, flow proceeds to block 636.

At block 636, relative to the first direction, for a first majority of the ARs, first ends thereof are aligned to define a first reference line which is proximate and parallel to a first boundary of the cell region. An example of the first majority of ARs is in FIG. 2, wherein ARs 204(1), 204(2), 205(1) and 205(2) and left arm 224(L) of AR 206 (A) have aligned first ends which define a first reference line 216(1) that is proximate and parallel to a left boundary of cell 202 and (B) represent a majority of the ARs in FIG. 2, or the like. From block 636, flow proceeds to block 638.

At block 638, relative to the first direction, for a second majority of the ARs, second ends thereof are aligned to define a second reference line which is proximate and parallel to a second boundary of the cell region. An example of the second majority of ARs in in FIG. 2 wherein ARs 204(1), 204(2), 205(1) and 205(2) and right arm 224(R) of AR 206 (A) have aligned second ends which define a second reference 216(2) line that is proximate and parallel to a right boundary of cell 202 and (B) represent a majority of the ARs in FIG. 2, or the like. From block 638, flow proceeds to block 640.

At block 640, the first to fourth ARs are configured to be rectangular. Examples of the first to fourth ARs are rectangular ARs 204(1), 204(2), 205(1) and 205(2), or the like. From block 638, flow proceeds to block 642.

At block 642, the first and second ARs are sized to extend from the first reference line to the second reference line. Examples of the first and second ARs are ARs 204(1) and 204(2). From block 642, flow proceeds to block 644.

At block 644, the fifth AR is configured to have a T-shape including a stem and first and second (124R) arms, the stem extending the second direction, the first arm extending in the first direction from a first end of the stem to the first reference line, and the second arm extending in the first direction from the first end of the stem to the second reference line. An example of the fifth AR is T-shaped AR 206 of FIG. 2, which includes stem 222, left arm 224L and right arm 224R. From block 644, flow exits block 632 and proceeds to block 646.

At block 646, the first and second ARs are doped with a first conductivity type dopant. Examples of doping the first and second ARs include doping ARs 204(1) and 204(2) with a P-type dopant when the same are formed in corresponding N-wells 212(1) and 212(2), doping ARs 204(1) and 204(2) with an N-type dopant, or the like. From block 646, flow proceeds to block 648.

At block 648, the third to fifth ARs are doped with a second conductivity type dopant. Corresponding to the examples given for block 646, examples of doping the third to fifth ARs include doping ARs 205(1), 205(2) and 206 with an N-type dopant, doping ARs 205(1), 205(2) and 206 with a P-type dopant when the same are formed in N-well 214, or the like.

Regarding FIG. 6C, in some embodiments, relative to the first direction, block 632 further includes arranging the fourth and fifth ARs to be separated from each other by the stem of the third AR. In some embodiments, relative to the second direction, block 632 further includes arranging the fourth and fifth ARs to be aligned with each other. In some embodiments, the cell region is rectangular and, relative to the second direction and relative to a center of the cell region, block 632 further includes: arranging a distal edge of the first AR to be proximate and parallel to a second boundary of the cell region; and arranging a distal edge of the second AR to proximate and parallel to a second boundary of the cell region.

Regarding FIG. 6C, in some embodiments, the first majority includes the first, second and fourth ARs; and the second majority includes the first, second and fifth ARs. In such embodiments, the first majority further includes the third AR; and the second majority further includes the third AR.

FIG. 6D is a method 600D of forming a semiconductor device, in accordance with some embodiments.

Method 600D includes blocks 662-668. At block 662, a cell region is formed which includes ARs. Examples of ARs (ARs) representing a cell region include ARs 204(1), 204(2), 205(1), 205(2) and 206 in FIG. 2, or the like. Block 662 includes blocks 664-668. Within block 662, flow proceeds to block 664.

At block 664, a first one of the ARs (first AR) is arranged to have a T-shape including a stem and first and second arms, the stem extending in a first direction, the first and second arms extending from a same end of the stem and away from each other relative to a second direction perpendicular to the first direction. Examples of the first and second directions correspondingly are the Y-axis and the X-axis in FIG. 2, or the like. An example of the first AR is T-shaped AR 206 of FIG. 2, which includes stem 222 that extends in the direction of the Y-axis, and left arm 224L and right arm 224R which extend in the direction of the X-axis. From block 664, flow proceeds to block 666.

At block 666, source/drain (S/D) components are formed at locations correspondingly in the ARs. Examples of such an S/D component include a portion of ARs 204(1), 204(2), 205(1), 205(2) or 206 that is between corresponding instances of gate 209 a portion of ARs 204(1), 204(2), 205(1), 205(2) or a portion of 206 that is adjacent to a corresponding instance of gate 209 and which has been doped with an appropriate conductivity-type dopant, or the like. From block 666, flow proceeds to block 668.

At block 668, remaining components of transistors corresponding to the S/D components in the corresponding ARs are formed resulting in the transistors of the cell region defining a scan insertion D flip flop (SDFQ). Such a SDFQ includes: a clock buffer configured to receive an original clock signal and generate first and second delayed clock signals; a scan buffer configured to receive an original scan enable (SE) signal and generate a delayed SE signal; a multiplexer serially configured to receive a data signal, a scan insertion (SI) signal, the first and second delayed clock signals, the original SE signal and the delayed SE signal and generate a first intermediary signal; and a D flip-flop (FF) to receive the first intermediary signal and generate an output signal of the SDFQ. Examples of the SDFQ include SDFQ 530A of FIG. 5A, 530B of FIG. 5B, or the like. An example of the clock buffer is clock buffer 546 of FIGS. 5A-5B, or the like. An example of scan buffer is scan buffer 544 of FIGS. 5A-5B, or the like. An example the multiplexer is multiplexer 532 of FIGS. 5A-5B, or the like. Examples of the D flip-flop include D flip-flop 534A of FIG. 5A, D flip-flop 534B of FIG. 5B, or the like.

Regarding FIG. 6D, in some embodiments, remaining components of the transistors are formed in layers which include: a transistor layer (not shown); a first layer of metallization (M_1st layer) (not shown) over the transistor layer; a first layer of interconnection (VIA_1st layer) (not shown) over the M_1st layer; a second layer of metallization (M_2nd layer) (not shown) over the VIA_1st layer; or the like. In addition to ARs 204(1), 204(2), 205(1), 205(2) or 206, gates 209 and (optionally IDGs 210), the transistor layer includes: MD structures (not shown) correspondingly on S/D components of corresponding ARs 204(1), 204(2), 205(1), 205(2) or 206; VGD structures (not shown) on corresponding MD structures. The M_1st layer includes M_1st conductors/segments (not shown) on corresponding VGD structure. The VIA 1st layer includes VIA_1st structures (not shown) on corresponding M_1st segments. The M_2nd layer includes M_2nd conductors/segments (not shown) on corresponding VIA_1st structures.

Regarding FIG. 6D, in some embodiments, the forming remaining components of the transistors includes configuring the transistors of the cell region to function as an active circuit. In such embodiments, block 614 results in the channel region of each of the transistors correspondingly in the first majority of the active regions having a first channel-size. In such embodiments, block 618 has results including: the channel region of each of the transistors correspondingly in the first and second arms having the first channel-size; the channel region of each of the transistors correspondingly in the stem having a second channel-size, the second channel-size being greater than the first channel-size. In such embodiments that also use fin-FET architecture: relative to a first given portion of an AR in FIG. 2 having height H1, the first channel-size is at least in part proportional to the number of fins intersected by a corresponding one of gates 209; and, relative to a second given portion of an AR in FIG. 2 having height H2, i.e., stem 222 of T-shaped AR 206, the second channel-size is at least in part proportional to the number of fins intersected by a corresponding one of gates 209. In such embodiments that also use fin-FET architecture: block 614 results in each of the transistors correspondingly in the first majority of the active regions having a first number of fins; and block 618 has results including each of the transistors correspondingly in the first and second arms having the first number of fins, and each of the transistors correspondingly in the stem having a second number of fins, the second number of fins being greater than the first number of fins; and wherein a total number of the transistors is represented by a sum of a first sub-total of transistors having the first number of fins and a second sub-total of transistors having the second number of fins, and the first sub-total is larger than the second sub-total.

Regarding FIG. 6D, in some embodiments, a first one of the transistors is defined in part by corresponding transistor-components in the first AR; and the first transistor is included in the clock buffer or the D FF. In some embodiments, a second one of the transistors is defined in part by corresponding transistor-components in the first AR; and the first transistor is included in the clock buffer and the second transistor is included in the D FF. In some embodiments, a third one of the transistors is defined in part by corresponding transistor-components in the first AR; and the third transistor is included in the D FF. In some embodiments, a fourth one of the transistors is defined in part by corresponding transistor-components in the first AR; and the fourth transistor is included in the D FF.

Regarding FIG. 6D, in some embodiments, a first one of the transistors is defined in part by corresponding transistor-components in the first AR; and the first transistor is included in the clock buffer. In some embodiments, the D FF includes a primary latch and a secondary latch; the primary latch includes a sleepy inverter and a non-sleepy inverter; and a second one of the transistors is defined in part by corresponding transistor-components in the first AR; and the second transistor is included in the sleepy inverter or the non-sleepy inverter. In some embodiments, a third one of the transistors is defined in part by corresponding transistor-components in the first AR; the second transistor is included in the sleepy inverter; and the third transistor is included in the non-sleepy inverter. In some embodiments, a third one of the transistors is defined in part by corresponding transistor-components in the first AR; and the second and third transistors are included in the non-sleepy inverter.

Regarding FIG. 6D, in some embodiments, a second one of the transistors is defined in part by corresponding transistor-components in the first AR; and relative to the first direction (X-axis), the first and second transistors are separated by an isolation dummy gate (IDG).

Figure 6E:
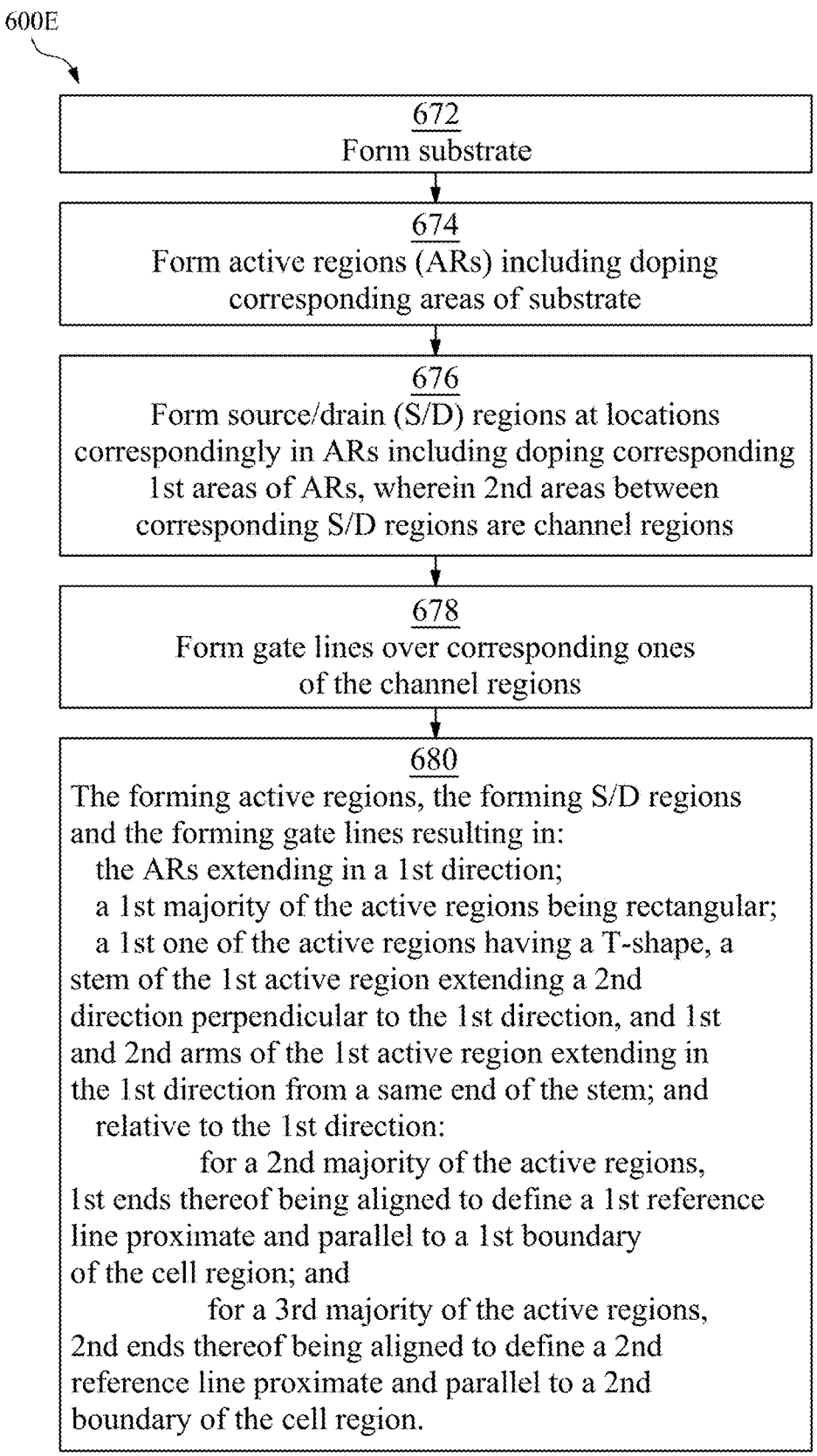

FIG. 6E is a method 600E of forming a semiconductor device, in accordance with some embodiments.

Method 600E includes blocks 672-680. At block 672, a substrate is formed. An example of the substrate is substrate 302, or the like. From block 672, flow proceeds to block 674.

At block 674, active regions (ARs) are formed in substrate including doping corresponding areas of the substrate. Example of the active regions including ARs 304(1)-(2), 322, 404(1)-(2), 422, or the like. From block 674, flow proceeds to block 676.

At block 676, source/drain (S/D) regions are formed in the ARs including doping corresponding first areas of the active regions, where second areas of the ARs which are between corresponding S/D regions are channel regions. Examples of channel regions include areas of corresponding ARs which are between gate lines as in FIGS. 2 and 5D-5W, or the like. From block 676, flow proceeds to block 678.

At block 678, gate lines are formed over corresponding ones of the channel regions. Examples of the gate lines include gate lines 209, 319(1)-319(3), 419(1)-419(3), the gate lines in FIGS. 5D-5W, or the like. From block 678, flow proceeds to block 680.

At block 680, the forming active regions of block 674, the forming S/D regions of block 676 and the forming gate lines of block 678 result, among other things, in the following: the active regions extending in a first direction, e.g., ARs 204(1)-204(2), 205(1)-205(2) and 206, or the like; a first majority (e.g., ARs 204(1)-204(2), 205(1) and 205(2)), or the like) of the active regions being rectangular; a first one of the active regions having a T-shape (e.g., AR 206, one of the ARs in each of FIGS. 5D-5W, or the like), a stem (e.g., 222) of the first active region extending in a second direction perpendicular to the first direction, and first (e.g., 224L) and second (e.g., 224R) arms of the first active region extending in the first direction from a same end of the stem; relative to the first direction, for a second majority (e.g., ARs 204(1)-204(2) and 205(1)) of the active regions, first ends thereof being aligned to define a first reference line proximate and parallel to a first boundary of the cell region; and relative to the first direction, for a third majority (e.g., ARs 204(1)-204(2) and 205(2)) of the active regions, second ends thereof being aligned to define a second reference line proximate and parallel to a second boundary of the cell region.

Figure 7:
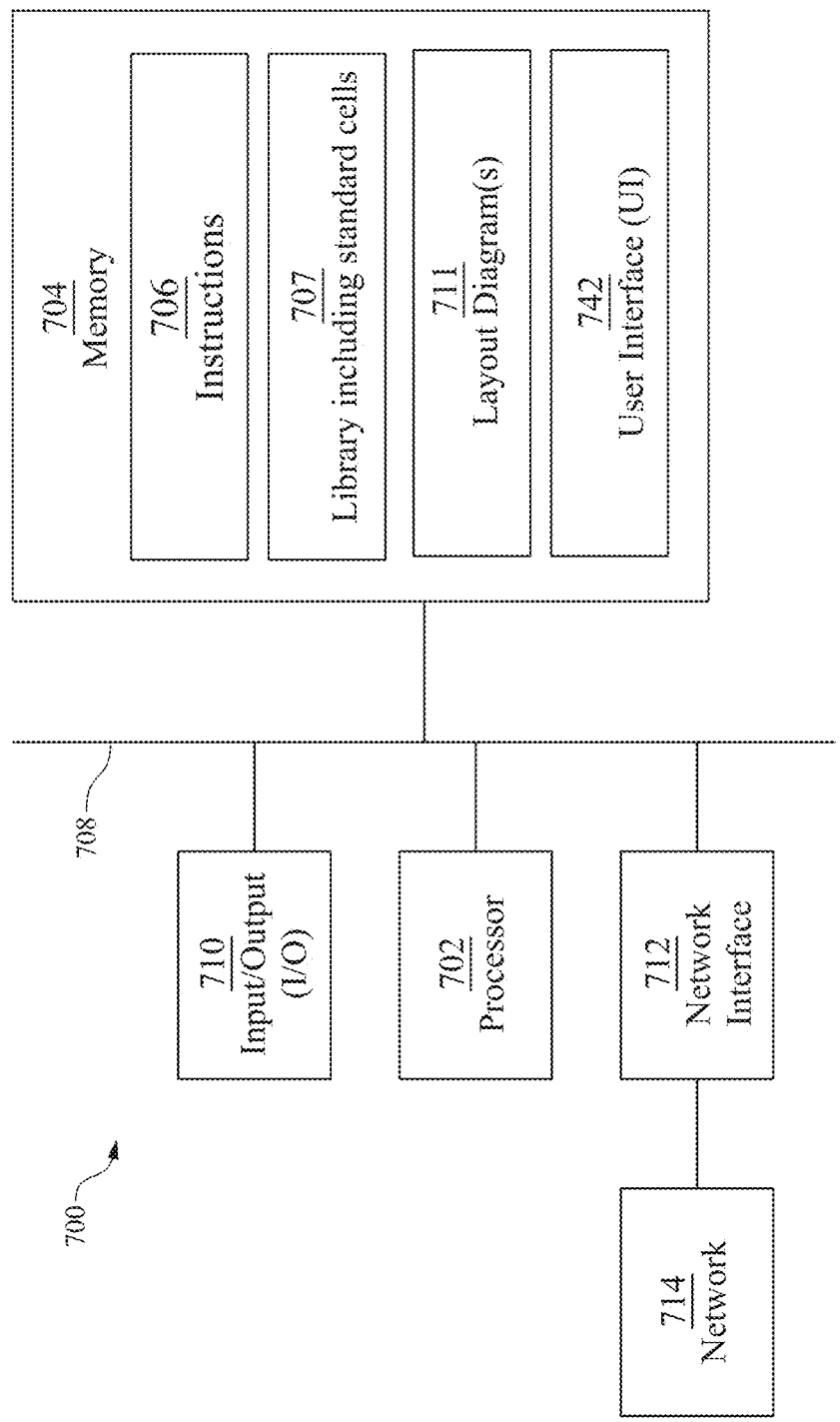
FIG. 7 is a block diagram of an electronic design automation (EDA) system, in accordance with some embodiments.

FIG. 7 is a block diagram of an electronic design automation (EDA) system 700 in accordance with some embodiments.

In some embodiments, EDA system 700 includes an APR system. The method of flowchart 600A of FIG. 6A is implemented, for example, using EDA system 700, in accordance with some embodiments.

In some embodiments, EDA system 700 is a general purpose computing device including a hardware processor 702 and a non-transitory, computer-readable storage medium 704. Storage medium 704, amongst other things, is encoded with, i.e., stores, computer program code 706, i.e., a set of executable instructions. Execution of instructions 706 by hardware processor 702 represents (at least in part) an EDA tool which implements a portion or all of, e.g., the method of FIG. 6A, or the like, in accordance with one or more embodiments (hereinafter, the noted processes and/or methods). Storage medium 704, amongst other things, stores layout diagram 711 that includes layout diagrams of FIGS. 2, 5D-5W, or the like.

Processor 702 is electrically coupled to computer-readable storage medium 704 via a bus 708. Processor 702 is further electrically coupled to an I/O interface 710 by bus 708. A network interface 712 is further electrically connected to processor 702 via bus 708. Network interface 712 is connected to a network 714, so that processor 702 and computer-readable storage medium 704 are capable of connecting to external elements via network 714. Processor 702 is configured to execute computer program code 706 encoded in computer-readable storage medium 704 in order to cause system 700 to be usable for performing a portion or all of the noted processes and/or methods. In one or more embodiments, processor 702 is a central processing unit (CPU), a multi-processor, a distributed processing system, an application specific integrated circuit (ASIC), and/or a suitable processing unit.

In one or more embodiments, computer-readable storage medium 704 is an electronic, magnetic, optical, electromagnetic, infrared, and/or a semiconductor system (or apparatus or device). For example, computer-readable storage medium 704 includes a semiconductor or solid-state memory, a magnetic tape, a removable computer diskette, a random access memory (RAM), a read-only memory (ROM), a rigid magnetic disk, and/or an optical disk. In one or more embodiments using optical disks, computer-readable storage medium 704 includes a compact disk-read only memory (CD-ROM), a compact disk-read/write (CD-R/W), and/or a digital video disc (DVD).

In one or more embodiments, storage medium 704 stores computer program code 706 configured to cause system 700 (where such execution represents (at least in part) the EDA tool) to be usable for performing a portion or all of the noted processes and/or methods. In one or more embodiments, storage medium 704 further stores information which facilitates performing a portion or all of the noted processes and/or methods. In one or more embodiments, storage medium 704 stores library 707 of standard cells including such standard cells as disclosed herein.

EDA system 700 includes I/O interface 710. I/O interface 710 is coupled to external circuitry. In one or more embodiments, I/O interface 710 includes a keyboard, keypad, mouse, trackball, trackpad, touchscreen, and/or cursor direction keys for communicating information and commands to processor 702.

EDA system 700 further includes network interface 712 coupled to processor 702. Network interface 712 allows system 700 to communicate with network 714, to which one or more other computer systems are connected. Network interface 712 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 700.

System 700 is configured to receive information through I/O interface 710. The information received through I/O interface 710 includes one or more of instructions, data, design rules, libraries of standard cells, and/or other parameters for processing by processor 702. The information is transferred to processor 702 via bus 708. EDA system 700 is configured to receive information related to a UI through I/O interface 710. The information is stored in computer-readable medium 704 as user interface (UI) 742.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by EDA system 700. In some embodiments, a layout which includes standard cells is generated using a tool such as VIRTUOSO® available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

Figure 8:
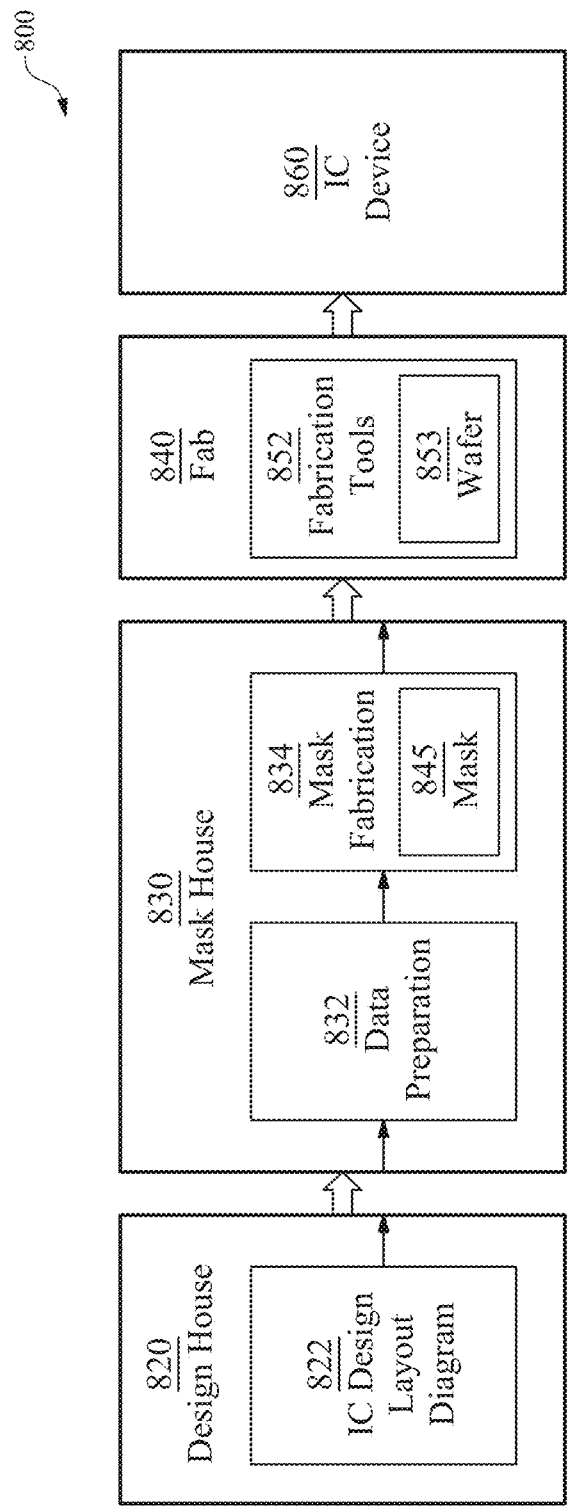
FIG. 8 is a block diagram of an integrated circuit (IC) manufacturing system, and an IC manufacturing flow associated therewith, in accordance with some embodiments.

FIG. 8 is a block diagram of an integrated circuit (IC) manufacturing system 800, and an IC manufacturing flow associated therewith, in accordance with some embodiments.

After block 604 of FIG. 6A, based on the layout, at least one of (A) one or more semiconductor masks or (B) at least one component in a layer of an inchoate semiconductor integrated circuit is fabricated using manufacturing system 800.

In FIG. 8, IC manufacturing system 800 includes entities, such as a design house 820, a mask house 830, and an IC manufacturer/fabricator ("fab") 840, that interact with one another in the design, development, and manufacturing cycles and/or services related to manufacturing an IC device 860. The entities in system 800 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and supplies services to and/or receives services from one or more of the other entities. In some embodiments, two or more of design house 820, mask house 830, and IC fab 840 is owned by a single larger company. In some embodiments, two or more of design house 820, mask house 830, and IC fab 840 coexist in a common facility and use common resources.

Design house (or design team) 820 generates an IC design layout 822. IC design layout 822 includes various geometrical patterns designed for an IC device 860. The geometrical patterns correspond to patterns of metal, oxide, or semiconductor layers that make up the various components of IC device 860 to be fabricated. The various layers combine to form various IC features. For example, a portion of IC design layout 822 includes various IC features, such as an active region, gate electrode, source and drain, metal lines or vias of an interlayer interconnection, and openings for bonding pads, to be formed in a semiconductor substrate (such as a silicon wafer) and various material layers disposed on the semiconductor substrate. Design house 820 implements a proper design procedure to form IC design layout 822. The design procedure includes one or more of logic design, physical design or place and route. IC design layout 822 is presented in one or more data files having information of the geometrical patterns. For example, IC design layout 822 is expressed in a GDSII file format or DFII file format.

Mask house 830 includes data preparation 832 and mask fabrication 834. Mask house 830 uses IC design layout 822 to manufacture one or more masks to be used for fabricating the various layers of IC device 860 according to IC design layout 822. Mask house 830 performs mask data preparation 832, where IC design layout 822 is translated into a representative data file ("RDF"). Mask data preparation 832 supplies the RDF to mask fabrication 834. Mask fabrication 834 includes a mask writer. A mask writer converts the RDF to an image on a substrate, such as a mask (reticle) or a semiconductor wafer. The design layout is manipulated by mask data preparation 832 to comply with particular characteristics of the mask writer and/or requirements of IC fab 840. In FIG. 8, mask data preparation 832, mask fabrication 834, and mask 845 are illustrated as separate elements. In some embodiments, mask data preparation 832 and mask fabrication 834 are collectively referred to as mask data preparation.

In some embodiments, mask data preparation 832 includes optical proximity correction (OPC) which uses lithography enhancement techniques to compensate for image errors, such as those that can arise from diffraction, interference, other process effects and the like. OPC adjusts IC design layout 822. In some embodiments, mask data preparation 832 includes further resolution enhancement techniques (RET), such as off-axis illumination, sub-resolution assist features, phase-shifting masks, other suitable techniques, and the like or combinations thereof. In some embodiments, inverse lithography technology (ILT) is further used, which treats OPC as an inverse imaging problem.

In some embodiments, mask data preparation 832 includes a mask rule checker (MRC) that checks the IC design layout that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout to compensate for limitations during mask fabrication 834, which may undo part of the modifications performed by OPC in order to meet mask creation rules.

In some embodiments, mask data preparation 832 includes lithography process checking (LPC) that simulates processing that will be implemented by IC fab 840 to fabricate IC device 860. LPC simulates this processing based on IC design layout 822 to fabricate a simulated manufactured device, such as IC device 860. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus ("DOF"), mask error enhancement factor ("MEEF"), other suitable factors, and the like or combinations thereof. In some embodiments, after a simulated manufactured device has been fabricated by LPC, if the simulated device is not close enough in shape to satisfy design rules, OPC and/or MRC are be repeated to further refine IC design layout 822.

The above description of mask data preparation 832 has been simplified for the purposes of clarity. In some embodiments, data preparation 832 includes additional features such as a logic operation (LOP) to modify the IC design layout according to manufacturing rules. Additionally, the processes applied to IC design layout 822 during data preparation 832 may be executed in a variety of different orders.

After mask data preparation 832 and during mask fabrication 834, a mask 845 or a group of masks are fabricated based on the modified IC design layout. In some embodiments, an electron-beam (e-beam) or a mechanism of multiple e-beams is used to form a pattern on a mask (photomask or reticle) based on the modified IC design layout. The masks are formed in various technologies. In some embodiments, the mask is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask includes a transparent substrate (e.g., fused quartz) and an opaque material (e.g., chromium) coated in the opaque regions of the mask. In another example, the mask is formed using a phase shift technology. In the phase shift mask (PSM), various features in the pattern formed on the mask are configured to have proper phase difference to enhance the resolution and imaging quality. In various examples, the phase shift mask is an attenuated PSM or alternating PSM. The mask(s) generated by mask fabrication 834 is used in a variety of processes. For example, such a mask(s) is used in an ion implantation process to form various doped regions in the semiconductor wafer, in an etching process to form various etching regions in the semiconductor wafer, and/or in other suitable processes.

IC fab 840 is an IC fabrication business that includes one or more manufacturing facilities for the fabrication of a variety of different IC products. In some embodiments, IC fab 840 is a semiconductor foundry. For example, there may be a manufacturing facility for the front end fabrication of a plurality of IC products (front-end-of-line (FEOL) fabrication), while a second manufacturing facility may supply the back end fabrication for the interconnection and packaging of the IC products (back-end-of-line (BEOL) fabrication), and a third manufacturing facility may supply other services for the foundry business.

IC fab 840 uses the mask (or masks) fabricated by mask house 830 to fabricate IC device 860 using fabrication tools 852. Thus, IC fab 840 at least indirectly uses IC design layout 822 to fabricate IC device 860. In some embodiments, a semiconductor wafer 853 is fabricated by IC fab 840 using the mask (or masks) to form IC device 860. Semiconductor wafer 853 includes a silicon substrate or other proper substrate having material layers formed thereon. Semiconductor wafer further includes one or more of various doped regions, dielectric features, multilevel interconnects, and the like (formed at subsequent manufacturing steps).

Details regarding an integrated circuit (IC) manufacturing system (e.g., system 800 of FIG. 8), and an IC manufacturing flow associated therewith are found, e.g., in U.S. Pat. No. 9,256,709, granted Feb. 9, 2016, U.S. Pre-Grant Publication No. 20150278429, published Oct. 1, 2015, U.S. Pre-Grant Publication No. 20140040838, published Feb. 6, 2014, and U.S. Pat. No. 7,260,442, granted Aug. 21, 2007, the entireties of each of which are hereby incorporated by reference.

In some embodiments, a semiconductor device includes: a cell region including active regions that extend in a first direction and have components of corresponding transistors formed therein; a first majority of the active regions being rectangular; a first one of the active regions having a T-shape including a stem that extends in a second direction perpendicular to the first direction, and, relative to the first direction, first and second arms that extend from a same end of the stem and away from each other; and, relative to the first direction, a second majority of the active regions having aligned first ends defining a first reference line proximate and parallel to a first boundary of the cell region, and a third majority of the active regions having aligned second ends defining a second reference line proximate and parallel to a second boundary of the cell region.

In some embodiments, relative to the second direction, at least two amongst the first majority of the active regions overlap the stem of the first active region. In some embodiments, the transistors of the cell region are arranged to function as an active circuit; configurations of the transistors include a first channel configuration and a second channel configuration; the first channel configuration includes a first channel-size; the second channel configuration includes a second channel-size, the second channel-size being greater than the first channel-size; a total number of the transistors is represented by a sum of a first sub-total of transistors having the first channel configuration and a second sub-total of transistors having the second channel configuration; and the first sub-total is larger than the second sub-total. In some embodiments, the transistors of the cell region are fin-type field effect transistors (fin-FETs); configurations of the transistors include a first channel configuration and a second channel configuration; the first channel configuration includes a first number of fins; and the second channel configuration includes a second number of fins, the second number of fins being greater than the first number of fins.

In some embodiments, the transistors of the cell region are arranged to function as an active circuit; the active circuit is a scan insertion D flip flop (SDFQ) that includes a multiplexer serially connected at an internal node to a D flip-flop (FF); the transistors include positive-channel metal-oxide semiconductor field-effect (PMOS) transistors and negative-channel metal-oxide semiconductor field-effect (NMOS) transistors; the SDFQ is triggered on a rising edge of a clock; the D FF includes a primary latch; and a majority of the transistors of the cell region corresponding to the primary latch are NMOS transistors having the second channel configuration. In some embodiments, the transistors of the cell region are arranged to function as an active circuit; the active circuit is a scan insertion D flip flop (SDFQ) that includes a multiplexer serially connected at an internal node to a D flip-flop (FF); the transistors include positive-channel metal-oxide semiconductor field-effect (PMOS) transistors and negative-channel metal-oxide semiconductor field-effect (NMOS) transistors; the SDFQ is triggered on a falling edge of a clock; the D FF includes a primary latch; and a majority of the transistors of the cell region corresponding to the primary latch are PMOS transistors having the second channel configuration.

In some embodiments, a semiconductor device includes: a cell region including first to fifth active regions; the first to fifth active regions extending in a first direction and being spaced apart relative to a second direction perpendicular to the first direction; relative to the first direction, a first majority of the first to fifth active regions having aligned first ends which define a first reference line that is proximate and parallel to a first boundary of the cell region, and a second majority of the first to fifth active regions having aligned second ends which define a second reference line that is proximate and parallel to a second boundary of the cell region; the first to fourth active regions being rectangular, the first and second active regions having a first conductivity type, and extending from the first reference line to the second reference line; the third to fifth active regions having a second conductivity type; and the fifth active region having a T-shape including a stem that extends in the second direction, and, relative to the first direction, first and second arms that extend from a same end of the stem and away from each other.

In some embodiments, relative to the first direction, the fourth and fifth active regions are separated from each other by the stem of the third active region. In some embodiments, relative to the second direction, the fourth and fifth active regions are aligned with each other. In some embodiments, the cell region is rectangular; relative to the second direction and relative to a center of the cell region, a distal edge of the first active region is proximate and parallel to a third boundary of the cell region, and a distal edge of the second active region is proximate and parallel to a fourth boundary of the cell region. In some embodiments, the first majority includes the first, second and fourth active regions; and the second majority includes the first, second and fifth active regions.

In some embodiments, a semiconductor device includes: a cell region including active regions extending in a first direction and having components of corresponding transistors (transistor-components) formed therein; a first one of the active regions having a T-shape, including a stem that extends in a second direction perpendicular to the first direction, and, relative to the first direction, first and second arms that extend from a same end of the stem and away from each other; and transistors in the cell region defined in part by the corresponding transistor-components of the active regions including the first active region, the transistors of the cell region representing a scan insertion D flip flop (SDFQ) including a clock buffer configured to receive an original clock signal and generate first and second delayed clock signals, a scan buffer configured to receive an original scan enable (SE) signal and generate a delayed SE signal, a multiplexer serially configured to receive a data signal, a scan insertion (SI) signal, the first and second delayed clock signals, the original SE signal and the delayed SE signal and generate a first intermediary signal, and a D flip-flop (FF) to receive the first intermediary signal and generate an output signal of the SDFQ.

In some embodiments, a first one of the transistors is defined in part by corresponding transistor-components in the first active region; and the first transistor is included in the clock buffer or the D FF. In some embodiments, a second one of the transistors is defined in part by corresponding transistor-components in the first active region; and the first transistor is included in the clock buffer and the second transistor is included in the D FF. In some embodiments, a third one of the transistors is defined in part by corresponding transistor-components in the first active region; and the third transistor is included in the D FF.

In some embodiments, a first one of the transistors is defined in part by corresponding transistor-components in the first active region; and the first transistor is included in the clock buffer. In some embodiments, the D FF includes a primary latch and a secondary latch; the primary latch includes a sleepy inverter and a non-sleepy inverter; and a second one of the transistors is defined in part by corresponding transistor-components in the first active region; and the second transistor is included in the sleepy inverter or the non-sleepy inverter. In some embodiments, a third one of the transistors is defined in part by corresponding transistor-components in the first active region; the second transistor is included in the sleepy inverter; and the third transistor is included in the non-sleepy inverter. In some embodiments, a third one of the transistors is defined in part by corresponding transistor-components in the first active region; and the second and third transistors are included in the non-sleepy inverter. In some embodiments, a second one of the transistors is defined in part by corresponding transistor-components in the first active region; and, relative to the first direction, the first and second transistors are separated by an isolation dummy gate.

In some embodiments, a method (of forming a semiconductor device) includes: forming a substrate; forming active regions in the substrate including doping corresponding areas of the substrate; forming source/drain (S/D) regions in the active regions including doping corresponding first areas of the active regions, the S/D regions representing first transistor-components, wherein second areas of the active regions which are between corresponding S/D regions are channel regions representing second transistor-components; forming gate lines over corresponding ones of the channel regions, the gate lines representing fourth transistor-components; the forming active regions, the forming S/D regions and the forming gate lines resulting in: the active regions extending in a first direction; a first majority of the active regions being rectangular; a first one of the active regions having a T-shape, a stem of the first active region extending in a second direction perpendicular to the first direction, and first and second arms of the first active region extending in the first direction from a same end of the stem; and relative to the first direction: for a second majority of the active regions, first ends thereof being aligned to define a first reference line proximate and parallel to a first boundary of the cell region; and for a third majority of the active regions, second ends thereof being aligned to define a second reference line proximate and parallel to a second boundary of the cell region.

In some embodiments, relative to the second direction, the forming active regions, the forming S/D regions and the forming gate lines further results in: at least two amongst the first majority of the active regions overlapping the stem of the first active region. In some embodiments, the forming active regions, the forming S/D regions and the forming gate lines further results in: the channel regions correspondingly in the first majority of the active regions having a first channel-size; a first one of the active regions having a T-shape in which: the channel regions correspondingly in the first and second arms having the first channel-size; and the channel regions correspondingly in the stem having a second channel-size, the second channel-size being greater than the first channel-size; a total number of transistors being represented by a sum of a first sub-total of transistors having the first channel-size and a second sub-total of transistors having the second channel-size; and the first sub-total being larger than the second sub-total.

In some embodiments, the forming active regions, the forming S/D regions and the forming gate lines further results in: fins in the active regions which extend in the first direction such that transistors based thereon are fin-type field effect transistors (fin-FETs); the transistors defining an active circuit; the transistors correspondingly in the first majority of the active regions having a first number of fins; a first one of the active regions having a T-shape in which: each of the transistors correspondingly in the first and second arms has the first number of fins; and each of the transistors correspondingly in the stem has a second number of fins, the second number of fins being greater than the first number of fins; a total number of the transistors being represented by a sum of a first sub-total of transistors having the first number of fins and a second sub-total of transistors having the second number of fins; and the first sub-total being larger than the second sub-total.

In some embodiments, the forming active regions, the forming S/D regions and the forming gate lines further results in: a cell region including the active regions, the active regions extending in a first direction; a first one of the active regions having a T-shape, including: a stem that extends in a second direction perpendicular to the first direction; and relative to the first direction, first and second arms that extend from a same end of the stem and away from each other; and transistors in the cell region being defined in part by corresponding ones of the first, second, third and fourth transistor-components of the active regions including the first active region, the transistors of the cell region representing a scan insertion D flip flop (SDFQ) including: a clock buffer configured to receive an original clock signal and generate first and second delayed clock signals; a scan buffer configured to receive an original scan enable (SE) signal and generate a delayed SE signal; a multiplexer serially configured to receive a data signal, a scan insertion (SI) signal, the first and second delayed clock signals, the original SE signal and the delayed SE signal and generate a first intermediary signal; and a D flip-flop (FF) to receive the first intermediary signal and generate an output signal of the SDFQ.

In some embodiments, the forming active regions, the forming S/D regions and the forming gate lines further results in: a first one of the transistors being defined in part by corresponding transistor-components in the first active region; and the first transistor being included in the clock buffer or the D FF. In some embodiments, the forming active regions, the forming S/D regions and the forming gate lines further results in: a second one of the transistors being defined in part by corresponding transistor-components in the first active region; and the first transistor being included in the clock buffer and the second transistor is included in the D FF. In some embodiments, the forming active regions, the forming S/D regions and the forming gate lines further results in: a third one of the transistors being defined in part by corresponding transistor-components in the first active region; and the third transistor being included in the D FF.

It will be readily seen by one of ordinary skill in the art that one or more of the disclosed embodiments fulfill one or more of the advantages set forth above. After reading the foregoing specification, one of ordinary skill will be able to affect various changes, substitutions of equivalents and various other embodiments as broadly disclosed herein. It is therefore intended that the protection granted hereon be limited only by the definition contained in the appended claims and equivalents thereof.

What is claimed is:

1. A semiconductor device comprising:
a cell region including active regions that extend in a first direction and have components of corresponding transistors formed therein;
for a first quantity of corresponding ones of the active regions which defines a first set and represents a majority of a total quantity of the active regions, each active region in the first set being rectangular;
a first one of the active regions having a T-shape including:
    a stem that extends in a second direction perpendicular to the first direction; and
    relative to the first direction, first and second arms that extend from a same end of the stem and away from each other; and
relative to the first direction:
    for a second quantity of corresponding ones of the active regions which defines a second set and represents a majority of the total quantity, each active region in the second set having aligned first ends defining a first reference line proximate and parallel to a first boundary of the cell region; and
    for a third quantity of corresponding ones of the active regions which defines a third set and represents a majority of the total quantity, each active region in the third set having aligned second ends defining a second reference line proximate and parallel to a second boundary of the cell region; and
relative to the second direction, at least two active regions amongst the first set overlapping the stem of the first active region.

2. The semiconductor device of claim 1, wherein:
the transistors of the cell region are arranged to function as an active circuit;
configurations of the transistors include a first channel configuration and a second channel configuration;
the first channel configuration includes a first channel-size;
the second channel configuration includes a second channel-size, the second channel-size being greater than the first channel-size;
a total number of the transistors is represented by a sum of a first sub-total of transistors having the first channel configuration and a second sub-total of transistors having the second channel configuration; and
the first sub-total is larger than the second sub-total.

3. The semiconductor device of claim 1, wherein:
the transistors of the cell region are fin-type field effect transistors (fin-FETs);
configurations of the transistors include a first channel configuration and a second channel configuration;
the first channel configuration includes a first number of fins; and
the second channel configuration includes a second number of fins, the second number of fins being greater than the first number of fins.

4. The semiconductor device of claim 3, wherein:
the transistors of the cell region are arranged to function as an active circuit;
the active circuit is a scan insertion D flip flop (SDFQ) that includes a multiplexer serially connected at an internal node to a D flip-flop (FF);
the transistors include positive-channel metal-oxide semiconductor field-effect (PMOS) transistors and negative-channel metal-oxide semiconductor field-effect (NMOS) transistors;
the SDFQ is triggered on a rising edge of a clock;
the D FF includes a primary latch; and
for a fourth quantity of corresponding ones of the transistors which defines a fourth set and represents a majority of a total quantity of the transistors, each of the transistors of the fourth set which correspond to the primary latch are NMOS transistors having the second channel configuration.

5. The semiconductor device of claim 3, wherein:
the transistors of the cell region are arranged to function as an active circuit;
the active circuit is a scan insertion D flip flop (SDFQ) that includes a multiplexer serially connected at an internal node to a D flip-flop (FF);
the transistors include positive-channel metal-oxide semiconductor field-effect (PMOS) transistors and negative-channel metal-oxide semiconductor field-effect (NMOS) transistors;
the SDFQ is triggered on a falling edge of a clock;
the D FF includes a primary latch; and
for a fourth quantity of corresponding ones of the transistors which defines a fourth set and represents a majority of a total quantity of the transistors, each of the transistors of the fourth set which correspond to the primary latch are PMOS transistors having the second channel configuration.

6. The semiconductor device of claim 1, wherein:
regarding the at least two active regions amongst the first set which overlap the stem of the first active region relative to the second direction (at least two nested active regions),
    first and second ones of the at least two nested active regions are on opposite sides of the stem of the first active region relative to the first direction.

7. A semiconductor device comprising:
a cell region including first to fifth active regions;
the first to fifth active regions extending in a first direction and being spaced apart relative to a second direction perpendicular to the first direction;
relative to the first direction:
    a first majority amongst ones of the first to fifth active regions having aligned first ends which define a first reference line that is proximate and parallel to a first boundary of the cell region (first majority of ARs); and
    a second majority amongst ones of the first to fifth active regions having aligned second ends which define a second reference line that is proximate and parallel to a second boundary of the cell region (second majority of ARs);
the first to fourth active regions being rectangular,
the first and second active regions having a first conductivity type, and extending from the first reference line to the second reference line;
the third to fifth active regions having a second conductivity type; and
the fifth active region having a T-shape including:
    a stem that extends in the second direction; and
    relative to the first direction, first and second arms that extend from a same end of the stem and away from each other.

8. The semiconductor device of claim 7, wherein:
relative to the first direction, the fourth and fifth active regions are separated from each other by the stem of the third active region.

9. The semiconductor device of claim 8, wherein:
relative to the second direction, the fourth and fifth active regions are aligned with each other.

10. The semiconductor device of claim 7, wherein:
the cell region is rectangular; and
relative to the second direction and relative to a center of the cell region:
 a distal edge of the first active region is proximate and parallel to a third boundary of the cell region; and
 a distal edge of the second active region is proximate and parallel to a fourth boundary of the cell region.

11. The semiconductor device of claim 7, wherein:
the first majority of ARs includes the first, second and fourth active regions; and
the second majority of ARs includes the first, second and fifth active regions.

12. The semiconductor device of claim 11, wherein:
the first majority of ARs further includes the third active region; and
the second majority of ARs further includes the third active region.

13. A semiconductor device comprising:
a cell region including active regions extending in a first direction and having components of corresponding transistors (transistor-components) formed therein;
 a first one of the active regions having a T-shape, including:
  a stem that extends in a second direction perpendicular to the first direction; and
  relative to the first direction, first and second arms that extend from a same end of the stem and away from each other; and
transistors in the cell region defined in part by the corresponding transistor-components of the active regions including the first active region, the transistors of the cell region representing a scan insertion D flip flop (SDFQ) including:
 a clock buffer configured to receive an original clock signal and generate first and second delayed clock signals;
 a scan buffer configured to receive an original scan enable (SE) signal and generate a delayed SE signal;
 a multiplexer serially configured to receive a data signal, a scan insertion (SI) signal, the first and second delayed clock signals, the original SE signal and the delayed SE signal and generate a first intermediary signal; and
 a D flip-flop (FF) to receive the first intermediary and generate an output signal of the SDFQ.

14. The semiconductor device of claim 13, wherein:
a first one of the transistors is defined in part by corresponding transistor-components in the first active region; and
the first transistor is included in the clock buffer or the D FF.

15. The semiconductor device of claim 14, wherein:
a second one of the transistors is defined in part by corresponding transistor-components in the first active region; and
the first transistor is included in the clock buffer and the second transistor is included in the D FF.

16. The semiconductor device of claim 15, wherein:
a third one of the transistors is defined in part by corresponding transistor-components in the first active region; and
the third transistor is included in the D FF.

17. The semiconductor device of claim 13, wherein:
a first one of the transistors is defined in part by corresponding transistor-components in the first active region; and
the first transistor is included in the clock buffer.

18. The semiconductor device of claim 17, wherein:
the D FF includes a primary latch and a secondary latch;
the primary latch includes a sleepy inverter and a non-sleepy inverter;
a second one of the transistors is defined in part by corresponding transistor-components in the first active region; and
the second transistor is included in the sleepy inverter or the non-sleepy inverter.

19. The semiconductor device of claim 18, wherein:
a third one of the transistors is defined in part by corresponding transistor-components in the first active region;
the second transistor is included in the sleepy inverter; and
the third transistor is included in the non-sleepy inverter.

20. The semiconductor device of claim 18, wherein:
a third one of the transistors is defined in part by corresponding transistor-components in the first active region; and
the second and third transistors are included in the non-sleepy inverter.

* * * * *